(12) United States Patent
Tsukamoto et al.

(10) Patent No.: US 8,951,869 B2
(45) Date of Patent: Feb. 10, 2015

(54) METHOD OF MANUFACTURING A SEMICONDUCTOR DEVICE

(71) Applicant: Renesas Electronics Corporation, Kawasaki-shi, Kanagawa (JP)

(72) Inventors: Keisuke Tsukamoto, Kanagawa (JP); Tatsuyoshi Mihara, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 14/139,991

(22) Filed: Dec. 24, 2013

(65) Prior Publication Data

US 2014/0227843 A1 Aug. 14, 2014

(30) Foreign Application Priority Data

Feb. 12, 2013 (JP) .................. 2013-025007

(51) Int. Cl.
- *H01L 21/8234* (2006.01)
- *H01L 21/8239* (2006.01)
- *H01L 21/28* (2006.01)
- *H01L 21/285* (2006.01)
- *H01L 27/115* (2006.01)

(Continued)

(52) U.S. Cl.
CPC .... *H01L 21/28282* (2013.01); *H01L 21/28518* (2013.01); *H01L 27/11563* (2013.01); *H01L 29/42324* (2013.01); *H01L 29/66825* (2013.01); *H01L 29/7881* (2013.01); *H01L 27/11573* (2013.01); *H01L 21/28202* (2013.01); *H01L 29/513* (2013.01); *H01L 29/517* (2013.01); *H01L 29/665* (2013.01); *H01L 29/66545* (2013.01); *H01L 29/6659* (2013.01); *Y10S 438/926* (2013.01)

USPC .......................................... 438/275; 438/926

(58) Field of Classification Search
CPC ................... H01L 27/11563; H01L 21/28282; H01L 21/28518; H01L 29/66545; H01L 29/42324; H01L 29/66825; H01L 29/665
USPC .................................... 438/275, 926
See application file for complete search history.

(56) References Cited

U.S. PATENT DOCUMENTS 6,184,083 B1 * 2/2001 Tsunashima et al. .......... 438/257
7,767,522 B2 8/2010 Toba et al.

(Continued)

FOREIGN PATENT DOCUMENTS

| JP | 2007-281092 A | 10/2007 |
| JP | 2008-211016 A | 9/2008 |

*Primary Examiner* — Mary Wilczewski
(74) *Attorney, Agent, or Firm* — Miles & Stockbridge P.C.

(57) ABSTRACT

A control gate electrode and a memory gate electrode of a memory cell of a non-volatile memory are formed in a memory cell region of a semiconductor substrate, and a dummy gate electrode is formed in a peripheral circuit region. Then, $n^+$-type semiconductor regions for a source or a drain of the memory cell are formed in the memory cell region and $n^+$-type semiconductor regions for a source or a drain of MISFET are formed in the peripheral circuit region. Then, a metal silicide layer is formed over the $n^+$-type semiconductor regions but the metal silicide layer is not formed over the control gate electrode, the memory gate electrode, and the gate electrode. Subsequently, the gate electrode is removed and replaced with the gate electrode for MISFET. Then, after removing the gate electrode and replacing it with a gate electrode for MISFET, a metal silicide layer is formed over the memory gate electrode and the control gate electrode.

17 Claims, 28 Drawing Sheets

(51) Int. Cl.
*H01L 29/423* (2006.01)
*H01L 29/66* (2006.01)
*H01L 29/788* (2006.01)
*H01L 29/51* (2006.01)

(56) References Cited

U.S. PATENT DOCUMENTS

| | | | |
|---|---|---|---|
| 8,021,942 B2 * | 9/2011 | Wei et al. | 438/216 |
| 8,278,900 B2 * | 10/2012 | Strijker et al. | 323/284 |
| 8,294,216 B2 * | 10/2012 | Chuang et al. | 257/368 |
| 8,330,227 B2 * | 12/2012 | Hung et al. | 257/369 |
| 8,546,436 B2 * | 10/2013 | Treiber et al. | 514/383 |
| 8,772,146 B2 * | 7/2014 | Kim et al. | 438/586 |
| 2008/0036008 A1 * | 2/2008 | Hirase et al. | 257/369 |
| 2009/0057769 A1 * | 3/2009 | Wei et al. | 257/369 |
| 2010/0038692 A1 * | 2/2010 | Chuang et al. | 257/298 |
| 2011/0193173 A1 * | 8/2011 | Nii et al. | 257/368 |
| 2013/0034946 A1 * | 2/2013 | Chuang et al. | 438/382 |
| 2013/0249010 A1 * | 9/2013 | Ng et al. | 257/369 |
| 2014/0065809 A1 * | 3/2014 | Kim et al. | 438/586 |
| 2014/0213030 A1 * | 7/2014 | Tsukuda et al. | 438/287 |
| 2014/0225198 A1 * | 8/2014 | Suk et al. | 257/369 |
| 2014/0227839 A1 * | 8/2014 | Shinohara | 438/261 |
| 2014/0227843 A1 * | 8/2014 | Tsukamoto et al. | 438/275 |
| 2014/0227868 A1 * | 8/2014 | Kim et al. | 438/586 |
| 2014/0239377 A1 * | 8/2014 | Nishida et al. | 257/324 |
| 2014/0242767 A1 * | 8/2014 | Nishikizawa et al. | 438/275 |

* cited by examiner

FIG. 45

| | OPERATION METHOD WRITE/ERASE | WRITE OPERATION VOLTAGE (V) Vmg/Vs/Vcg/Vd/Vb | ERASE OPERATION VOLTAGE (V) Vmg/Vs/Vcg/Vd/Vb | READ OPERATION VOLTAGE (V) Vmg/Vs/Vcg/Vd/Vb |
|---|---|---|---|---|
| A | SSI(WRITE)/BTBT(ERASE) | 10/5/1/0.5/0 | −6/6/0/open/0 | 0/0/1.5/1.5/0 |
| B | SSI(WRITE)/FN(ERASE) | 10/5/1/0.5/0 | 12/0/0/0/0 | 0/0/1.5/1.5/0 |
| C | FN(WRITE)/BTBT(ERASE) | −12/0/0/0/0 | −6/6/0/open/0 | 0/0/1.5/1.5/0 |
| D | FN(WRITE)/FN(ERASE) | −12/0/0/0/0 | 12/0/0/0/0 | 0/0/1.5/1.5/0 |

METHOD OF MANUFACTURING A SEMICONDUCTOR DEVICE

CROSS-REFERENCE TO RELATED APPLICATIONS

The disclosure of Japanese Patent Application No. 2013-025007 filed on Feb. 12, 2013 including the specification, drawings, and abstract is incorporated herein by reference in its entirety.

BACKGROUND

The present invention relates to a method of manufacturing a semiconductor device, which can be used suitably to a method of manufacturing a semiconductor device having a non-volatile memory.

As electrically programmable and erasable non-volatile semiconductor memory devices, EEPROM (Electrically Erasable and Programmable Read Only Memory) have been employed generally. Such memory devices typically represented by flash memories and used generally at present have a conductive floating gate electrode surrounded by an oxide film or a charge trapping insulation film below a gate electrode of MISFET, use the state of charges accumulated in the floating gate or the charge trapping insulation film as memory information and read out the same as a threshold value of the transistor. This charge trapping insulation film is an insulation film capable of accumulating charges therein and includes, for example, a silicon nitride film. By injection/release of charges into/from the charge region, the threshold value of the MISFET is shifted to operate the same as a memory device. The flash memory includes a split gate cell using a MONOS (Metal-Oxide-Nitride-Oxide-Semiconductor) film. Such a memory uses a silicon nitride film as a charge accumulation region and has various advantages, for example, that it is excellent in the reliability of data holding compared with a conductive floating gate film due to discrete charge accumulation. In addition, owing to excellent reliability of data holding, the thickness of oxide films over and below the silicon nitride film can be reduced, making it possible to decrease the voltage for write and erase operations.

Japanese Patent Laid-Open Nos. 2007-281092 and 2008-211016 disclose a technique relating to semiconductor devices having a non-volatile memory.

SUMMARY

Also in the semiconductor device having the non-volatile memory, it is desired to improve the performance of the semiconductor device as much as possible. Alternatively, it is to improve the reliability of the semiconductor device, or improve both of them.

Other objects and novel features of the present invention will become apparent from the description in the present specification and the accompanying drawings.

In one aspect of the present invention, there is provided a method of manufacturing a semiconductor device having a memory cell of a non-volatile memory formed in a first region of a semiconductor substrate, and a MISFET formed in a second region of the semiconductor substrate. At first, a first gate electrode and a second gate electrode for the memory cell adjacent to each other are formed over the semiconductor substrate in the first region, and a dummy gate electrode for the MISFET is formed over the semiconductor substrate in the second region. A first gate insulation film is interposed between the first gate electrode and the semiconductor substrate, and a second gate insulation film having a charge accumulation portion in the inside is interposed between the second gate electrode and the semiconductor substrate. Then, a first semiconductor region for a source or a drain of the memory cell is formed over the semiconductor substrate in the first region, and a second semiconductor region for a source or a drain of the MISFET is formed over the semiconductor substrate in the second region. Then, a metal silicide layer is formed over the first semiconductor region and over the second semiconductor region, in which the first metal silicide layer is not formed over the first gate electrode, the second gate electrode, and the dummy gate electrode. Then, after removing the dummy gate electrode and replacing it with the gate electrode for the MISFET, a second metal silicide layer is formed over the first gate electrode and the second gate electrode.

According to the embodiment, the performance of the semiconductor device can be improved, or reliability of the semiconductor device can be improved, or both of the improvements can be attained.

BRIEF DESCRIPTION OF THE DRAWINGS

FIG. 45 is a table showing one example of conditions for application of voltages to respective portions of a selection memory cell for "write", "erase" and "read";

DETAILED DESCRIPTION

Figure 1:
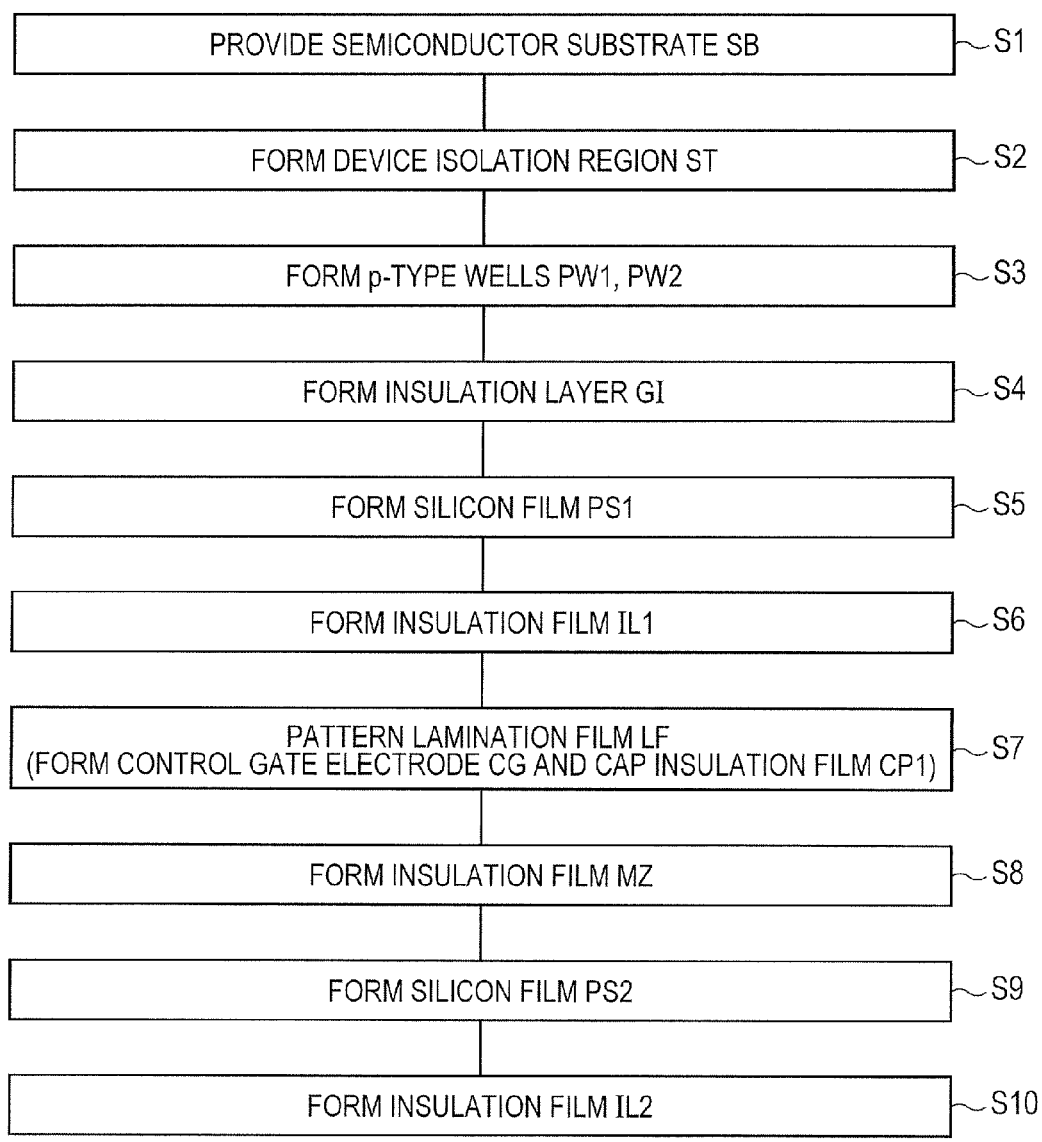
FIG. 1 is a process flow chart illustrating a portion of a manufacturing step of a semiconductor device as a preferred embodiment.

In the description of the following embodiment, the embodiment may be described in a plurality of divided sections or embodiments for the sake of convenience, if required. However, unless otherwise specified, they are not independent of each other, but are in a relation such that one is a modification example, or details, complementary explanation, or the like of a part or the whole of the other. Further, in the following embodiments, when a reference is made to the number of element or the like (including number, numerical value, quantity, range, and the like), the number of elements is not limited to the specified number, but may be greater than or less than the specified number, unless otherwise specified, and except the case where the number is apparently limited to the specified number in principle, etc. Further in the following embodiments, it is needless to say that the constitutional elements (including element steps and the like) are not always essential, unless otherwise specified, and except the case where they are apparently considered essential in principle, etc. Similarly, in the following embodiments, when a reference is made to the shapes, positional relationships, or the like of the constitutional elements, or the like, it is understood that they include ones substantially analogous or similar to the shapes, or the like, unless otherwise specified, unless otherwise considered apparently in principle, or the like. This also applies to the foregoing numerical values and ranges.

Embodiments of the present invention will be described below in details by reference to the accompanying drawings. Incidentally, throughout drawings for describing the embodiments, the members having the same function are given the same reference signs, and a repeated description therefor is omitted. Further, in the following embodiments, a description for the same or similar parts will not be repeated in principle unless it is particularly required.

Further, in the drawings to be used for embodiments, hatching may sometimes be omitted for easy understanding of the drawings even in a cross-sectional view. On the other hand, hatching may be sometimes added even in a plan view for easy understanding of the drawings.

(Preferred Embodiment)
—Semiconductor Device Manufacturing Step—

A semiconductor device of this embodiment and the following embodiment is a semiconductor device having a non-volatile memory (non-volatile memory device, flash memory, non-volatile semiconductor memory device). This embodiment and the following embodiment are described with reference to a memory cell based on a n-channel type MISFET (Metal Insulator Semiconductor Field Effect Transistor). Further, the polarity in this embodiment and the following embodiment (polarity of application voltage upon write, erase, read and polarity of carriers) is for explanation of the operation in a case of the memory cell based on a n-channel type MISFET and, when it is based on a p-channel type MISFET, identical operation can be obtained in principle by reversing all of polarities such as the application potential, conduction type of carriers, etc.

A method of manufacturing the semiconductor device of this embodiment is to be described with reference to the drawings.

FIG. 1 to FIG. 4 are process flow charts showing a portion of steps of manufacturing a semiconductor device according to this embodiment. FIG. 5 to FIG. 42 are main fragmentary cross sectional views of the semiconductor device during the manufacturing step according to this embodiment. In the cross sectional views of FIG. 5 to FIG. 42, main fragmentary cross sectional views of a memory cell region 1A and a peripheral circuit region 1B are illustrated in which formation of a memory cell of a non-volatile memory is shown in a memory cell region 1A and formation of MISFET is shown in a peripheral circuit region 1B, respectively.

The memory cell region 1A is a region where a memory cell of a non-volatile memory is to be formed in a semiconductor substrate SB and the peripheral circuit region 1B is a region where a peripheral circuit is to be formed in the semiconductor substrate SB. The memory cell region 1A and the peripheral circuit region 1B are present in one identical semiconductor substrate SB. While it is not always necessary that the memory cell 1A and the peripheral circuit region 1B are adjacent to each other, the peripheral circuit region 1B is illustrated in adjacent to the memory cell region 1A in the cross sectional views of FIG. 5 to FIG. 42 for easy understanding.

The peripheral circuit is a circuit other than the non-volatile memory which includes, for example, a processor such as CPU, a control circuit, a sense amplifier, a column decoder, a row decoder, and an input/output circuit. MISFET formed in the peripheral circuit region 1B is MISFET for the peripheral circuit.

In this embodiment, while description is to be made to a case of forming n-channel type MISFET (control transistor and memory transistor) in the memory cell region 1A, p-channel type MISFET (control transistor and memory transistor) can also be formed in the memory cell region 1A by reversing the conduction type. In the same manner, in this embodiment, while description is to be made to a case of forming n-channel type MISFET in the peripheral circuit region, p-channel type MISFET can also be formed in the peripheral circuit region 1B, or CMISFET (Complementary MISFET), etc. can also be foamed in the peripheral circuit region by reversing the conduction type.

Figure 5:
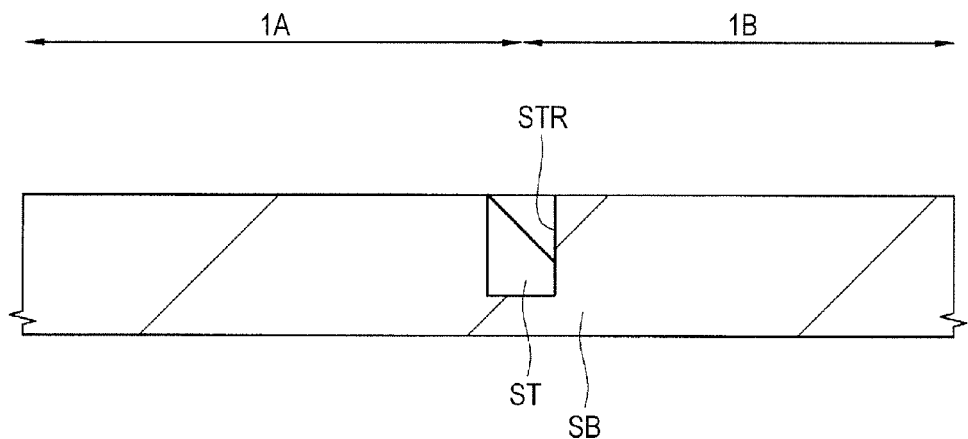
FIG. 5 is a main fragmentary cross sectional view of a semiconductor device according to the embodiment of the present invention during the manufacturing step thereof.

At first, as illustrated in FIG. 5, a semiconductor substrate (semiconductor wafer) SB comprising, for example, p-type single crystal silicon having a specific resistivity, for example, of about 1 to 10 Ωcm is provided (prepared) (step S1 in FIG. 1). Then, a device isolation region (inter-device isolation insulating region) ST for defining an active region is formed in the main surface of the semiconductor substrate SB (step S2 in FIG. 1).

The device isolation region ST comprises an insulator such as silicon oxide and can be formed, for example, by a STI (Shallow Trench Isolation) method or a LOCOS (Local Oxidization of Silicon) method. For example, after forming a trench STR for device isolation in the main surface of the semiconductor substrate SB, an insulation film comprising, for example, silicon oxide is filled in the trench STR for device isolation thereby forming the device isolation region ST. More specifically, after forming the trench STR for device isolation in the main surface of the semiconductor substrate SB, an insulation film (for example, silicon oxide film) for forming the device isolation region is formed so as to fill the trench STR for device isolation. Then, by removing the insulation film (insulation film for forming a device isolation region) at the outside of the trench STR for device isolation, the device isolation region ST comprising the insulation film filled in the trench STR for device isolation can be formed.

Figure 6:
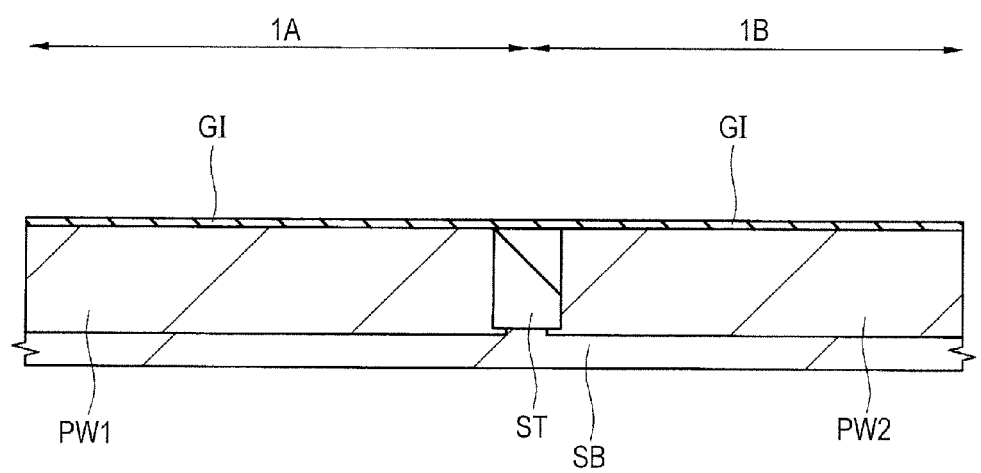
FIG. 6 is a main fragmentary cross sectional view of the semiconductor device during the manufacturing step thereof succeeding to that of FIG. 5.

Then, as illustrated in FIG. 6, a p-type well PW1 is formed in the memory cell region 1A and a p-type well PW2 is formed in the peripheral circuit region 1B (step S3 in FIG. 1). The p-type wells PW1 and PW2 can be formed, for example, by ion implantation of a p-type impurity, for example, boron (B) into the semiconductor substrate SB. The p-type wells PW1 and PW2 are formed for a predetermined depth from the main surface of the semiconductor substrate SB. Since the p-type well PW1 and the p-type well PW2 have an identical conduction type, they may be formed by an identical ion implantation step, or by different ion implantation steps.

Then, for controlling a threshold voltage of a control transistor formed subsequently in the memory cell region 1A, channel dope ions are implanted into the surface portion (surface layer portion) of the p-type well PW1 in the memory cell region 1A. Further, for controlling the threshold voltage of the n-channel type MISFET to be formed subsequently in the peripheral circuit region 1B, channel dope ions are implanted to the surface portion (surface layer portion) of the p-type well PW2 in the peripheral circuit region 1B.

Then, after cleaning the surface of the semiconductor substrate SB (p-type wells PW1, PW2) by cleaning with a diluted hydrofluoric acid, etc. an insulation film GI for a gate insulation film is formed over the main surface of the semiconductor substrate (surface of the p-type wells PW1, PW2) (step S4 in FIG. 1).

The insulation film GI can be formed, for example, of a thin silicon oxide film or silicon oxynitride film. When the insulation film GI is a silicon oxide film, the insulation film GI can be formed, for example, by a thermal oxidation method. Further, when the insulation film GI comprises a silicon oxynitride film, it can be formed by a method of forming a silicon oxide film by a high temperature short time oxidation method or a thermal oxidation method using, for example, $N_2O$, $O_2$, and $H_2$, and then applying a nitriding treatment in plasmas (plasma nitridation). The thickness of the insulation film GI to be formed can be, for example, about 2 to 3 nm. When the insulation film GI is formed by the thermal oxidation method, the insulation film GI is not formed over the device isolation region ST.

In other configuration, the insulation film GI in the peripheral circuit region 1B can also be formed by a step different from that for the insulation film GI in the memory cell region 1A.

Figure 7:
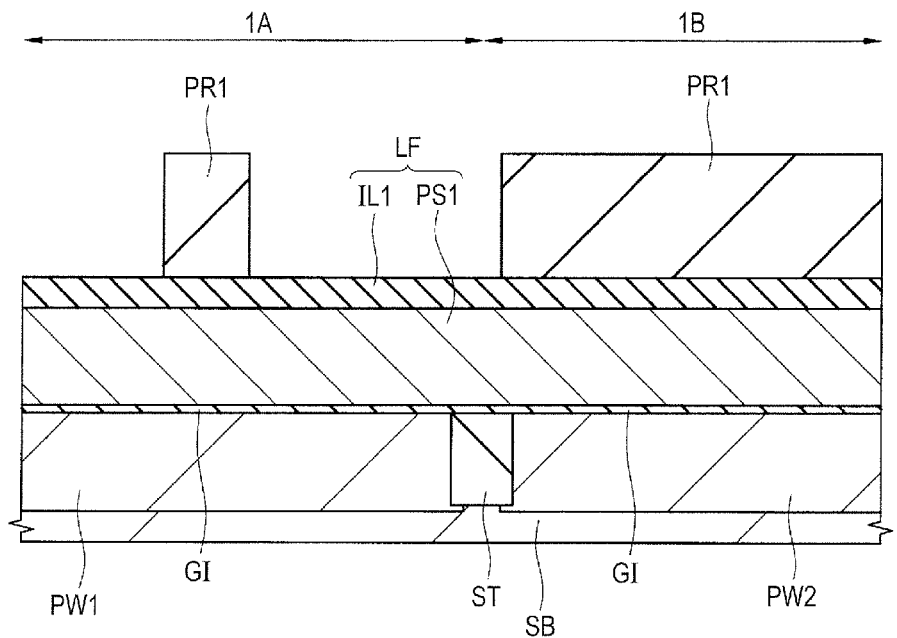
FIG. 7 is a main fragmentary cross sectional view of the semiconductor device during the manufacturing step thereof succeeding to that of FIG. 6.

Then, as illustrated in FIG. 7, a silicon film PS1 is formed (deposited) as a conductive film for forming a control gate electrode CG over the main surface of the semiconductor substrate SB (entire main surface), that is, over the insulation film GI of the memory cell region 1A and the peripheral circuit region 1B (step S5 in FIG. 1).

The silicon film PS1 is a conductive film for the gate electrode of a control transistor, that is, a conductive film for forming the control gate electrode CG to be described later. Further, the silicon film PS1 also serves as a conductive film for forming a gate electrode DG to be described later. That is, the control gate electrode CG to be described later and the gate electrode DG to be described later are formed by the silicon film PS1.

The silicon film PS1 comprises a polycrystal silicon film (polysilicon film) and can be formed by using, for example, a CVD (Chemical Vapor Deposition) method. The deposition thickness of the silicon film PS1 can be, for example, of about 50 to 100 nm. The film can also be formed by forming a silicon film PS1 as an amorphous silicon film and then converting the amorphous silicon film into a polycrystal silicon film by a subsequent heat treatment.

Further, the silicon film PS1 can be formed as a semiconductor film of low resistance by introducing impurities during film formation or ion implantation of impurities after the film formation (doped polysilicon film). The silicon film in the memory cell region 1A is a n-type silicon film preferably introduced with a n-type impurity such as phosphorus (P) or arsenic (As).

Then, an insulation film IL1 is formed (deposited) over the main surface (entire main surface) of the semiconductor substrate SB, that is, over the silicon film PS1 (step S6 in FIG. 1).

The insulation film IL1 is an insulation film for forming cap insulation films CP1 and CP2 to be described later. The insulation film IL1 comprises, for example, a silicon nitride film and can be formed by using, for example, a CVD method. The deposition thickness of the insulation film IL1 can be, for example, about 20 to 50 nm. By performing steps S5 and S6, a lamination film LF comprising the silicon film PS1 and the insulation film IL1 over the silicon film PS1 is formed. The lamination film LF comprises the silicon film PS1 and the insulation film IL1 over the silicon film PS1.

Then, the lamination film LF, that is, the insulation film IL1 and the silicon film PS1 are patterned by photolithography and an etching technique to form a lamination pattern (lamination structure) LM1 of a control gate electrode CG and a cap insulation film CP1 over the control gate electrode CG in the memory cell region 1A (step S7 in FIG. 1).

Figure 8:
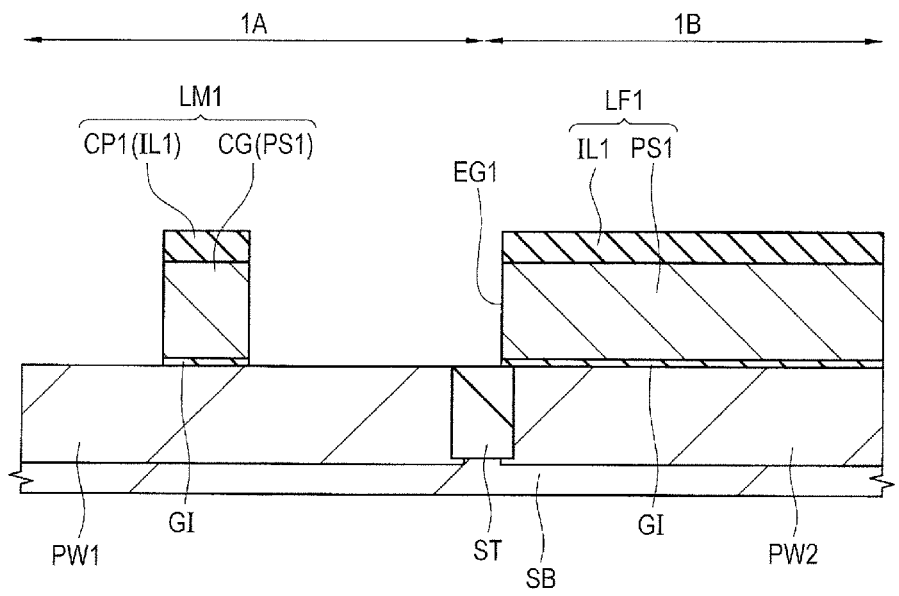
FIG. 8 is a main fragmentary cross sectional view of the semiconductor device during the manufacturing step thereof succeeding to that of FIG. 7.
Figure 9:
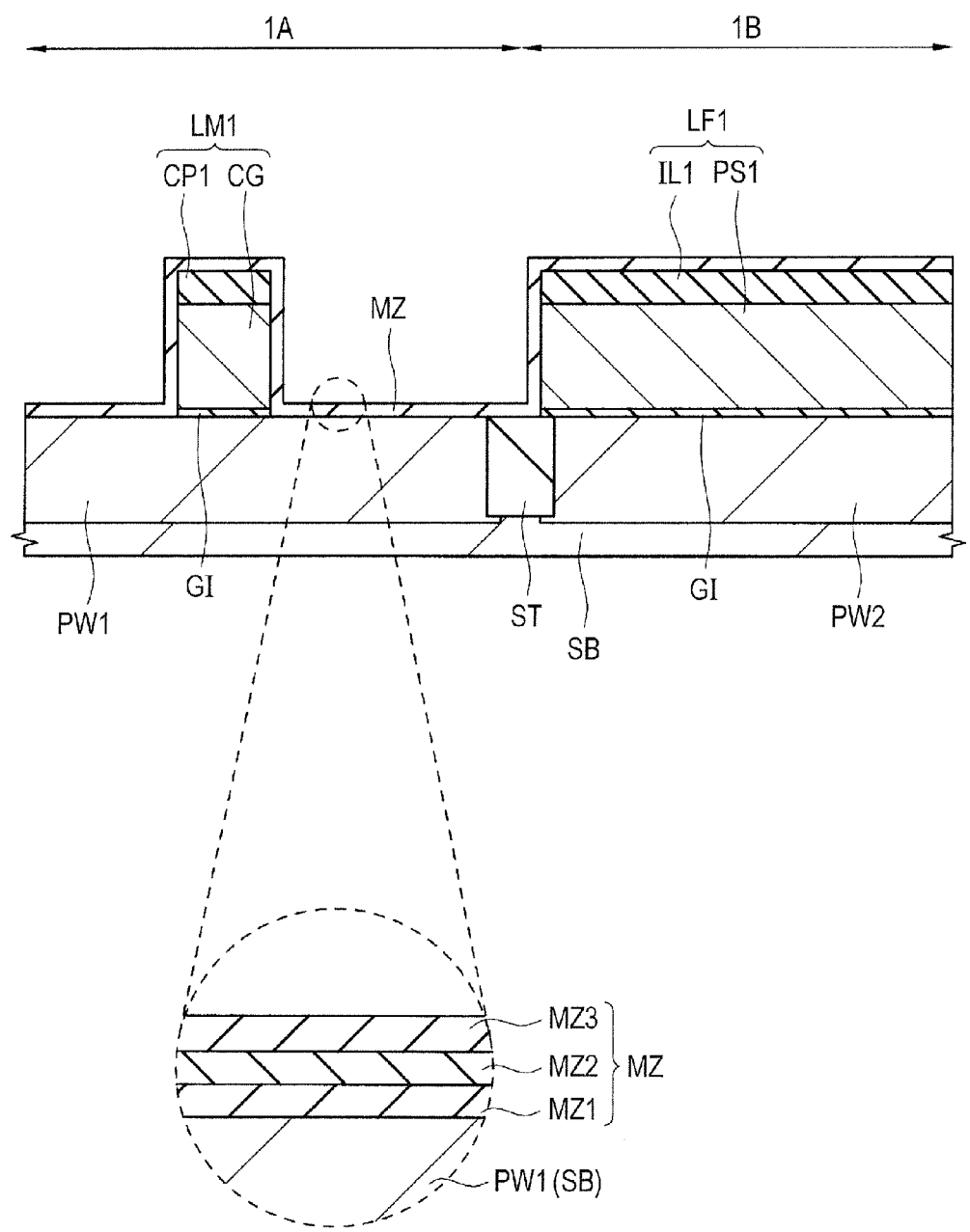
FIG. 9 is a main fragmentary cross sectional view of the semiconductor device during the manufacturing step thereof succeeding to that of FIG. 8.

The step S7 can be performed as described below. At first, a photoresist pattern PR1 is formed as a resist pattern by using photolithography over the insulation film IL1 as illustrated in FIG. 7. The photoresist pattern PR1 is formed in a region to form the control gate electrode CG in the memory cell region 1A and in the entire peripheral circuit region 1B. Then, the lamination film LF of the silicon film PS1 and the insulation film IL1 in the memory cell region 1A is patterned by etching (preferably by dry etching) using the photoresist pattern PR1 as an etching mask and then the photoresist pattern PR1 is removed. Thus, a lamination pattern LM1 comprising the control gate CG comprising the patterned silicon film PS1 and the cap insulation film CP1 comprising the patterned insulation film IL1 is formed as illustrated in FIG. 8.

As another configuration, a lamination pattern LM1 can also be formed as described below. At first, after forming a photoresist pattern PR1 over the insulation film IL1, the insulation film IL1 is patterned by etching (preferably dry etching) using the photoresist pattern PR1 as an etching mask, thereby forming a cap insulation film CP1 comprising the patterned insulation film IL1 in the memory cell region 1A. Then, after removing the photoresist pattern PR1, the silicon film PS1 is patterned by etching (preferably by dry etching) by using the insulation film IL1 including the cap insulation film CP1 as an etching mask (hard mask). Thus, a lamination pattern LM1 comprising the control gate electrode CG comprising patterned silicon film PS1 and the cap insulation film CP1 comprising the patterned insulation film IL1 is formed.

The lamination pattern LM1 comprises the control gate electrode CG and the cap insulation film CP1 over the control gate electrode CG and is formed by way of the insulation film GI over the semiconductor substrate SB in the memory cell region 1A (p-type well PW1). The control gate electrode CG and the cap insulation film CP1 have a substantially identical planar shape in a plan view and overlap each other in a plan view.

Further, in the memory cell region 1A, the photoresist pattern PR1 is formed selectively in a region to form the control gate electrode CG. Therefore, when the step S7 is performed, the silicon film PS1 and the insulation film IL1 other than the portion to form the lamination pattern LM1 are removed in the memory cell region 1A. On the other hand, the photoresist pattern PR1 is formed for the entire peripheral circuit region 1B in the peripheral circuit region 1B. Therefore, even when the step S7 is performed, the lamination film comprising the silicon film PS1 and the insulation film IL1 over the silicon film PS1 is not removed and, accordingly, remains as it is without patterning. The lamination film LF remaining in the peripheral circuit region 1B carries the reference sign LF1 and is referred to as the lamination film LF1.

The side surface (end) EG1 of the lamination film LF1 is preferably situated over the device isolation region ST. Then, the active region of the peripheral circuit region 1B (the active region defined by the device isolation region ST) is covered with the lamination film LF1. Thus, the substrate region of the semiconductor substrate SB in the peripheral circuit region 1B (Si substrate region) can be prevented from undergoing unnecessary etching.

In the memory cell region 1A, the control gate electrode CG comprising the patterned silicon film PS1 is formed, and the control gate electrode CG is a gate electrode of the control transistor. The insulation film GI remaining below the control gate electrode CG forms the gate insulation film of the control transistor. Accordingly, in the memory cell region 1A, the control gate electrode CG comprising the silicon film PS1 is formed over the semiconductor substrate SB (p-type well PW1) by way of the insulation film GI as a gate insulation film.

In the memory cell region 1A, the insulation film GI other than the portion covered by the lamination pattern LM1, that is, the insulation film GI other than the portion as the gate insulation film can be removed by dry etching performed by the patterning step at the step S7, or by wet etching applied after the dry etching.

As described above, the lamination pattern LM1 having the control gate electrode CG and the cap insulation film CP1 over the control gate electrode CG is formed by way of the insulation film GI as the gate insulation film over the semiconductor substrate SB by the steps S4, S5, S6, and S7.

Then, for controlling a threshold voltage of a memory transistor formed subsequently in the memory cell region 1A, channel dope ions are optionally implanted into the surface portion (surface layer portion) of the p-type well PW1 in the memory cell region 1A).

Then, after applying a cleaning treatment to the main surface of the semiconductor substrate SB by a washing treatment, an insulation film MZ for a gate insulation film of the memory transistor is formed over the entire main surface of the semiconductor substrate SB, that is, over the main surface (surface) of the semiconductor substrate SB and over the surface of the lamination pattern LM1 (upper surface and the side surface) (step S8 in FIG. 1).

In the peripheral circuit region 1B, since the lamination film LF1 remains, the insulation film MZ can be formed also over the surface of the lamination film LF1 (upper surface and side surface). Accordingly, at the step S8, the insulation film MZ is formed over the semiconductor substrate SB so as to cover the lamination pattern LM1 in the memory cell region 1A and the lamination film LF1 in the peripheral circuit region 1B.

The insulation film MZ is an insulation film for a gate insulation film of the memory transistor and this is an insulation film having a charge accumulation portion in the inside. The insulation film MZ comprises a lamination film of a silicon oxide film (oxide film) MZ1, a silicon nitride film (nitride film) MZ2 formed on the silicon oxide film MZ1, and a silicon oxide film (oxide film) MZ3 formed on the silicon nitride film MZ2. The lamination film of the silicon oxide film MZ1, the silicon nitride film MZ2, and the silicon oxide film MZ3 can be regarded also as an ONO (oxide-nitride-oxide) film.

For easy understanding of the drawings, the insulation film MZ comprising the silicon oxide film MZ1, the silicon nitride film MZ2, and the silicon oxide film MZ3 is illustrated merely as insulation film MZ. Actually, the insulation film MZ comprises the silicon oxide film MZ1, the silicon nitride film MZ2, and the silicon oxide film MZ3 as shown in an enlarged view for the region surrounded by a dotted circle in FIG. 9.

The silicon oxide films MZ1 and MZ3 of the insulation film MZ can be formed, for example, by an oxidation treatment (thermal oxidation treatment), a CVD method, or a combination thereof. For the oxidation treatment in this step, ISSG (In Situ Steam Generation) oxidation can also be used. The silicon nitride film MZ2 of the insulation film MZ can be formed, for example, by a CVD method.

Further, in this embodiment, the silicon nitride film MZ2 is formed as an insulation film having a trapping level (charge accumulation layer). While the silicon nitride film is suitable in view of reliability or the like, this is not restricted to the silicon nitride film but a high dielectric film having a dielectric constant higher than that of the silicon nitride film such as an aluminum oxide (alumina) film, a hafnium oxide film, or a tantalum oxide film can also be used as a charge accumulation layer or a charge accumulation portion. Further, the charge accumulation layer or the charge accumulation portion can also be formed by silicon nano-dots.

For forming the insulation film MZ, for example, after forming the silicon oxide film MZ1 by a thermal oxidation method (preferably ISSG oxidation), the silicon nitride film MZ2 is deposited on the silicon oxide film MZ1 by a CVD method and, further, the silicon oxide film MZ3 is formed on the silicon nitride film MZ2 by a CVD method, a thermal oxidation method, or both of the methods. Thus, the insulation film MZ comprising the lamination film of the silicon oxide film MZ1, the silicon nitride film MZ2, and the silicon oxide film MZ3 can be formed.

The thickness of the silicon oxide film MZ1 can be, for example, about 2 to 10 nm, the thickness of the silicon nitride film MZ2 can be, for example, about 5 to 15 nm, and the thickness of the silicon oxide film MZ3 can be, for example, about 2 to 10 nm. The last oxide film, that is, the silicon oxide film MZ3 at the uppermost layer of the insulation film MZ can be formed as a high voltage resistant film, for example, by oxidizing the upper layer portion of the nitride film (silicon nitride film MZ2 as an intermediate layer of the insulation film MZ).

The insulation film MZ functions as a gate insulation film of a memory gate electrode MG to be formed subsequently and has a charge holding (charge accumulation) function. Accordingly, the insulation film MZ has a lamination structure comprising at least three layers so that the insulation film can function as a gate insulation film having a charge holding function of the memory transistor, in which the potential barrier height of the inner layer (silicon nitride film MZ2) that functions as the charge accumulation portion is lower than the potential barrier height of the outer layer (silicon oxide films MZ1, MZ3) that function as charge blocking layers. This can be attained by forming the insulation film MZ as a lamination film having the silicon oxide film MZ1, the silicon nitride film MZ2 on the silicon oxide film MZ1, and the silicon oxide film MZ3 on the silicon nitride film MZ2 as in this embodiment.

Figure 10:
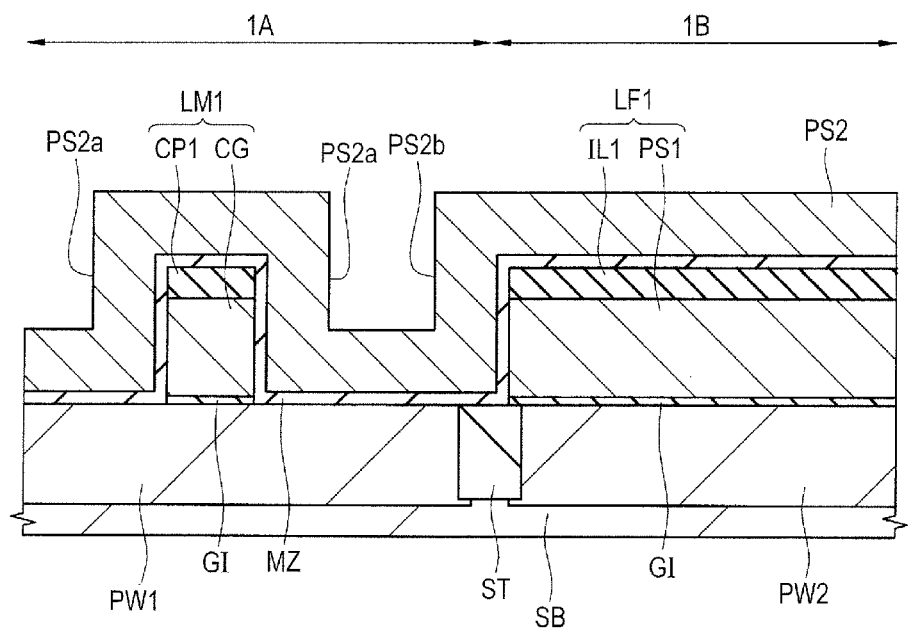
FIG. 10 is a main fragmentary cross sectional view of the semiconductor device during the manufacturing step thereof succeeding to that of FIG. 9.

Then, as illustrated in FIG. 10, a silicon film PS2 is formed (deposited) as a conductive film for forming a memory gate electrode MG over the main surface (entire main surface) of the semiconductor substrate SB, that is, over the insulation film MZ so as to cover the lamination pattern LM1 in the memory cell region 1A and cover the lamination film LF1 in the peripheral circuit region 1B (step S9 in FIG. 1).

The silicon film PS2 is a conductive film for the gate electrode of the memory transistor, that is, a conductive film for forming the memory gate electrode MG to be described later. The silicon film PS2 comprises a polycrystal silicon film and can be formed by using a CVD method or the like. The deposition thickness of the silicon film PS2 can be, for example, about 30 to 150 nm. Alternatively, in the silicon film PS2 is formed as an amorphous silicon film in the film formation, and then the amorphous silicon film can be converted into a polycrystal silicon film by a subsequent heat treatment.

Further, the silicon film PS2 is formed as a semiconductor film of low resistance by introducing impurities during film formation or ion implantation of impurities after film formation (doped polysilicon film). The silicon film PS2 is a n-type silicon film preferably introduced with n-impurity such as phosphorus (P) or arsenic (As). When the n-type impurities are introduced during formation of the silicon film PS2, a silicon film PS2 introduced with the n-type impurity can be formed by incorporating a doping gas (gas for addition of n-type impurity) to a gas for forming the silicon film PS2. While the n-type impurities are preferably introduced into the silicon film PS2 in the memory cell region 1A, the n-type impurities may or may not be introduced into the silicon film PS2 in the peripheral circuit region 1B, since the film is removed subsequently.

Figure 11:
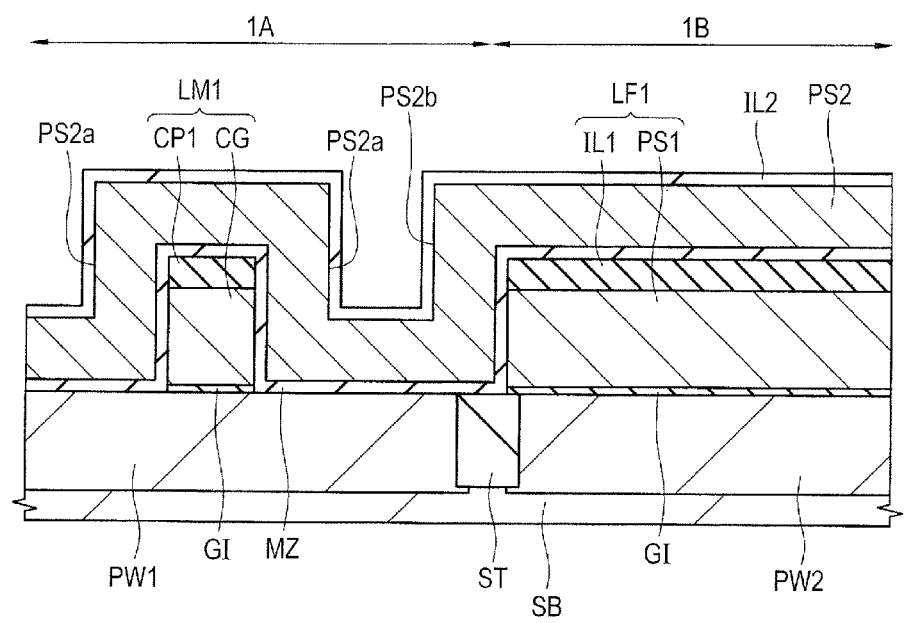
FIG. 11 is a main fragmentary cross sectional view of the semiconductor device during the manufacturing step thereof succeeding to that of FIG. 10.

Then, as illustrated in FIG. 11, an insulation film IL2 is formed over the main surface (entire main surface) of the semiconductor substrate SB, that is, over the silicon film PS2 (step S10 in FIG. 1). The insulation film IL2 comprises, for example, a silicon oxide film and can be formed by using a CVD method or the like. The deposition thickness of the insulation film IL2 can be, for example, about 5 to 10 nm.

Figure 2:
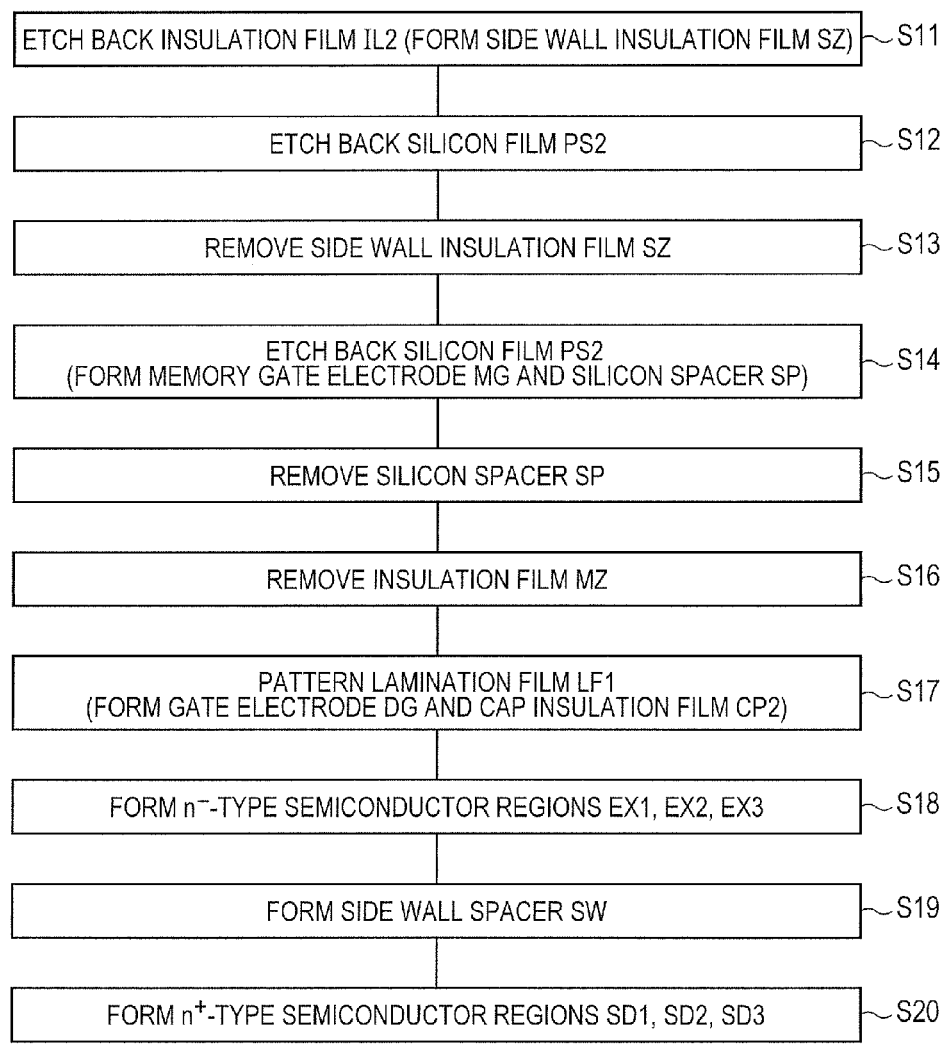
FIG. 2 is a process flow chart illustrating a portion of the manufacturing step of the semiconductor device as the preferred embodiment.

Then, the insulation film IL2 is etched back by an anisotropic etching technique (etching, dry etching, anisotropic etching) (step S11 in FIG. 2).

Figure 12:
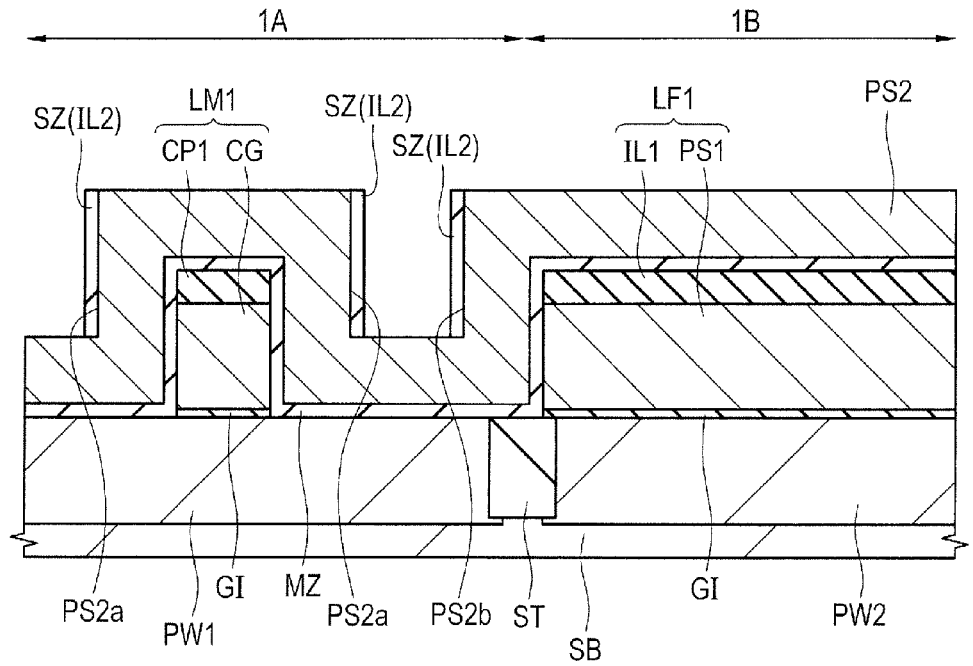
FIG. 12 is a main fragmentary cross sectional view of the semiconductor device during the manufacturing step thereof succeeding to that of FIG. 11.

In the etching back step at a step S11, the insulation film IL2 is anisotropically etched (etched back) by so much as the deposition thickness of the insulation film IL2, thereby remaining the insulation film IL2 in the form of a side wall spacer on the side surfaces (side walls PS2a, PS2b) of the silicon film PS2 while removing the insulation film IL2 in other regions. Thus, as illustrated in FIG. 12, a side wall insulation film SZ is formed by the insulation film IL2 remaining in the form of the side wall spacer on the side surfaces PS2a and PS2b of the silicon film PS2.

The silicon film PS2 is formed conformal to the lamination pattern LM1 so as to cover the lamination pattern LM1. Accordingly, the silicon film PS2 has a side surface (side wall) PS2a corresponding to the side wall (side surface) of the lamination pattern LM1. The side surface PS2a of the silicon film PS2 is aside surface (side wall) corresponding to the side wall (side surface) of the lamination pattern LM1. That is, the silicon film PS2 covers the lamination pattern LM1 by way of the insulation film MZ, a convex portion comprising the lamination pattern LM1 and the insulation film MZ and the silicon film PS2 for a portion covering the lamination pattern LM1 is formed and the side surface (side wall) of the protrusion corresponds to the side surface (side wall) PS2a of the silicon film PS2.

Further, since the silicon film PS2 is formed so as to cover the lamination film LF1, it is formed conformal to the lamination film LF1. Therefore, the silicon film PS2 also has aside surface (side wall) PS2b corresponding to the side surface of the lamination film LF1. The side surface PS2b of the silicon film PS2 is a side surface corresponding to the side surface of the lamination film LF1.

That is, at the step S9, a protrusion reflecting the lamination pattern LM1 and a protrusion reflecting the lamination film LF1 are formed over the surface of the silicon film PS2 in which the side wall (side surface) of the convex portion that reflects the lamination pattern LM1 is a side surface PS2a and the side wall (side surface) of the protrusion that reflects the lamination film LF1 is a side surface PS2b.

The side wall insulation film SZ is formed selectively on the side surfaces PS2a and the PS2b of the silicon film PS2. Accordingly, the side wall insulation film SZ is formed by way of the insulation film MZ and the silicon film PS2 on the side wall (side surface) of the lamination pattern LM1, and the side wall insulation film SZ is formed by way of the insulation film MZ and the silicon film PS2 on the side surface of the lamination film LF1.

In the stage in which the etching back step is performed at the step S11, the silicon film PS2 in the region not covered by the side wall insulation film SZ is exposed. For example, the upper surface of the silicon film PS2 is revealed above the lamination pattern LM1 and above the lamination film LF1. The insulation film MZ and the silicon film PS2 are interposed between the side wall insulation film SZ and the lamination pattern LM1, and the insulation film MZ and the silicon film PS2 are interposed between the side wall insulation film SZ and the lamination film LF1.

Figure 13:
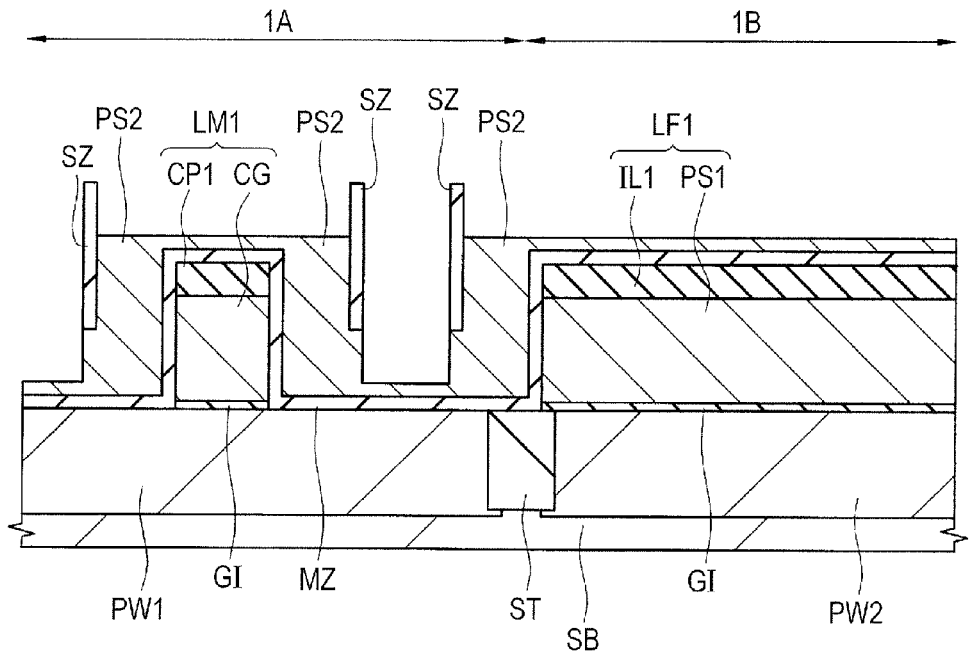
FIG. 13 is a main fragmentary cross sectional view of the semiconductor device during the manufacturing step thereof succeeding to that of FIG. 12.

Then, as illustrated in FIG. 13, the silicon film PS2 is etched back by an anisotropic etching technique (etching, dry etching, anisotropic etching) (step S12 in FIG. 2).

In the etching back step of the silicon film PS2 at the step S12, etching is performed preferably under the condition that where the side wall insulation film SZ is less etched compared with the silicon film PS2. That is, in the etching back step of the silicon film PS2 at the step S12, etching is performed preferably under the condition that the etching rate for the side wall insulation film SZ is lower than the etching rate for the silicon film PS2. Thus, the silicon film PS2 can be etched selectively in the etching back step for the silicon film PS2 at the step S12 while suppressing the side wall insulation film SZ from etching and causing the side wall insulation film SZ to function as an etching protection film.

Figure 14:
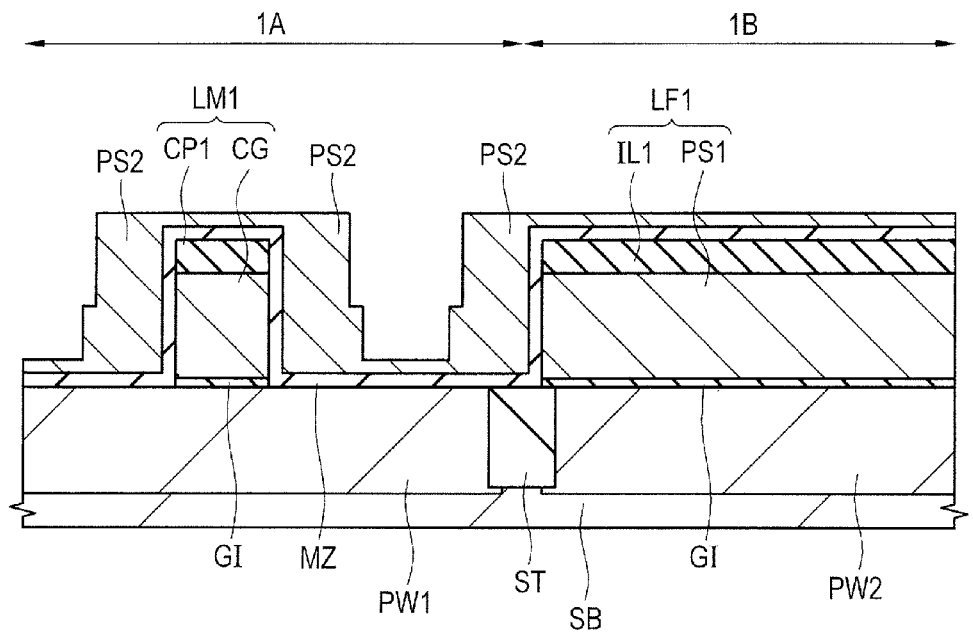
FIG. 14 is a main fragmentary cross sectional view of the semiconductor device during the manufacturing step thereof succeeding to that of FIG. 13.

Then, as illustrated in FIG. 14, the side wall insulation film SZ is removed by etching (step S13 in FIG. 2). For the etching step at the step S13, isotropic etching is used preferably and wet etching is particularly preferred.

In the etching step for the side wall insulation film SZ at the step S13, etching is performed preferably under the condition that the silicon film PS2 is less etched compared with the side wall insulation film SZ. That is, in the etching step for the side wall insulation film SZ at the step S13, etching is performed preferably under the condition that the etching rate for the silicon film PS2 is lower than the etching rate for the side wall insulation film SZ. Thus, the side wall insulation film SZ can be etched selectively while suppressing of the silicon film PS2 from etching.

Figure 15:
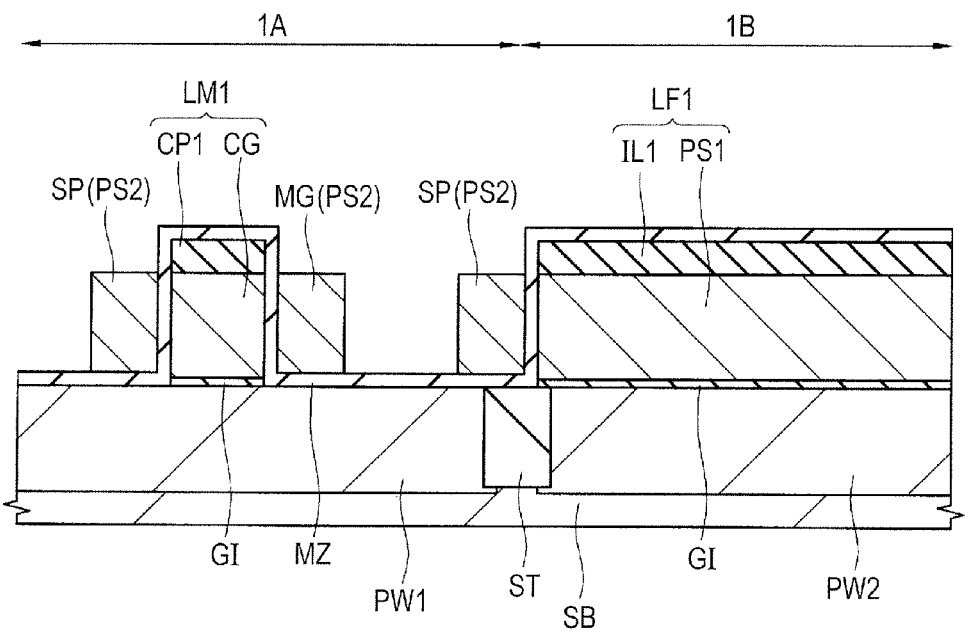
FIG. 15 is a main fragmentary cross sectional view of the semiconductor device during the manufacturing step thereof succeeding to that of FIG. 14.

Then, as illustrated in FIG. 15, the silicon film PS2 is etched back by an anisotropic etching technique (etching, dry etching, anisotropic etching) (step S14 in FIG. 2).

Then, when the silicon film PS2 is etched back by the etching back step at the step S12 and the etching back step at the step S14, the silicon film PS2 is left in the form of a side wall spacer by way of the insulation film MZ on both side walls of the lamination pattern LM1 and the silicon film PS2 in other regions is removed. Thus, as illustrated in FIG. 15, a memory gate electrode MG is formed by the silicon film PS2 left in the form of the side wall spacer by way of the insulation film MZ on one of both side walls of the lamination pattern LM1 in the memory cell region 1A, and a silicon spacer SP is formed by a silicon film PS2 remaining in the form of the side wall spacer by way of the insulation film MZ on the other side wall. The memory gate electrode MG is formed over the insulation film MZ so as to be adjacent with the lamination pattern LM1 by way of the insulation film MZ. Since the lamination pattern LM1 comprises the control gate electrode CG and the cap insulation film CPI over the control gate electrode CG, the memory gate electrode MG is formed over the insulation film MZ by way of the insulation film MZ so as to be adjacent with the control gate electrode CG.

The silicon spacer SP can be regarded also as a side wall spacer comprising an electric conductor, that is, as a conductor spacer. The memory gate electrode MG and the silicon spacer SP are formed on the side walls of the lamination pattern LM1 opposite to each other and have a substantially symmetrical structure with the lamination pattern LM1 being put therebetween. Further, the silicon spacer SP is formed by way of the insulation film MZ also on the side wall of the lamination film LF1 remaining in the peripheral circuit region 1B.

By performing the etching back step of the silicon film PS2 at steps S12 and S14, the memory gate electrode MG and the insulation film MZ in a region not covered by the silicon spacer SP are exposed. The insulation film MZ is interposed between the memory gate electrode MG and the semiconductor substrate SB (p-type well PW1) and between the memory gate electrode MG and the lamination pattern LM1. The insulation film MZ below the memory gate electrode MG 1A forms a gate insulation film of the memory transistor in the memory cell region. A memory gate length, that is, a gate length of the memory gate electrode MG can be controlled by controlling the deposition thickness of the silicon film PS2 deposited at the step S9.

The memory gate electrode MG and the silicon spacer SP are formed by etching back the silicon film PS2 at the steps S12 and S14, in which the respective heights of the memory gate electrode MG and the silicon spacer SP formed on both side walls of the lamination pattern LM1 are lowered than the height of the lamination pattern LM1. That is, the step of etching back the silicon film PS2 at the steps S12 and S14 is performed such that the height of the memory gate electrode MG and that of the silicon spacer SP are lowered than the height of the lamination pattern LM1 at the stage of completing the etching back step for the silicon film PS2 at the step S14. Since the silicon spacer SP is removed subsequently, it is important to perform the etching back step for the silicon film PS2 at the steps S12 and the S14 so that the height of the memory gate electrode MG is lower than the height of the lamination pattern LM1.

The relation that the height of the memory gate electrode MG is lower than the height of the lamination pattern LM1 means that the height at the top (uppermost part) of the memory gate electrode MG is lower than the height at the upper surface of the cap insulation film CP1 of the lamination pattern LM1. Further, the relation that the height of the silicon spacer SP is lower than the height of the lamination pattern LM1 means that the height of the top (uppermost portion) of the silicon spacer SP is lower than the height of the upper surface of the cap insulation film CP1 of the lamination pattern LM1. The height, when referred to, means a height in the direction substantially perpendicular to the main surface of the semiconductor substrate SB.

In the etching back step for the silicon film PS2 at the step S12, it is preferred that the silicon film PS2 is anisotropically etched (etched back) generally by so much as the deposition thickness of the silicon film PS2. That is, in the etching back step for the silicon film PS2 at the step S12, the silicon film PS2 is preferably etched back such that the memory gate electrode MG and the silicon spacer SP are formed at a height about identical with the height of the lamination pattern LMB1. Then, it is preferred to lower the height of the memory gate electrode MG and the silicon spacer SP by removing the side wall insulation film SZ at the step. S13 and, subsequently, further etching back the silicon film PS2 at the step S14 (that is, the memory gate electrode and the silicon spacer SP formed by the silicon film PS2).

At the stage of completing the etching back step at S14, the height of the memory gate electrode MG and that of the silicon spacer SP are lower than the height of the lamination pattern LM1. It is more preferred that the height of them is higher than the height of the control gate electrode CG. The relation that the height of the memory gate electrode MG is higher than the height of the control gate electrode CG means that the height at the top (uppermost portion) of the memory gate electrode MG is higher than the height of the upper surface of the control gate electrode CG that constitutes the laminated pattern LM1. By making the height of the memory gate electrode MG higher than the height of the control gate electrode CG, the upper portion of the memory gate electrode MG can be exposed reliably in the polishing step at a step S24 to be described later, and exposing failure of the memory gate electrode MG can be prevented effectively.

In this embodiment, after forming the side wall insulation film SZ at the steps S10 and S11, the silicon film PS2 is etched back at the step S12. Then, after removing the side wall insulation film SZ at the step S13, the silicon film PS2 is further etched back at the step S14, thereby forming the memory gate electrode MG and the silicon spacer SP.

In other configuration, the step S10 (step of forming the insulation film IL2), the step S11 (step of etching back the insulation film IL2) and the step S13 (step of removing the side wall insulation film SZ) can be saved. When the steps S10, S11, and S13 are saved, the etching back step for the silicon film PS2 at the step S12 and the etching back step for the silicon film PS2 at the step S14 can be performed as an etching back step for once. In this case, after forming the silicon film PS2 at the step S9 and then etching back the silicon film PS2 by anisotropic etching, the memory gate electrode MG and the silicon film SP are formed while leaving the silicon film PS2 in the form of an side wall spacer on both side walls of the lamination pattern LM1 by way of the insulation film MZ and removing the silicon film PS2 in other regions. In the stage of completing the etching back step of the silicon film PS2, the height of the memory gate electrode MG and that of the silicon spacer SP are made lower than the height of the lamination pattern LM1. Also in this case, the silicon spacer SP can be formed by way of the insulation film MZ also on the side walls of the lamination film LF1.

It is however more preferred to perform the etching back step for the silicon film PS2 at the step S12 in a state of forming the side wall insulation film SZ without saving the steps S10 and S11 as has been described in this embodiment. The side wall insulation film SZ can function as a protection film against etching (side etching) to the silicon film PS2. Accordingly, the side surfaces PS2$a$ and the PS2$b$ of the silicon film PS2 can be prevented form side etching by performing the etching back step for the silicon film PS2 in a state where the side surfaces PS2$a$ and the PS2$b$ of the silicon film PS2 are covered by the side wall insulation film SZ. Therefore, the cross sectional shape of the formed memory gate electrode MG and the silicon spacer SP (cross sectional shape substantially perpendicular to the extending direction of the memory gate electrode MG, that is, the shape of the cross section shown in FIG. 15) can be formed in a substantially rectangular shape. Thus, a side-wall spacer SW to be described later can be formed more properly over the memory gate electrode MG at a step S19 to be described later. Accordingly, the side wall SW formed over the memory gate electrode MG can prevent formation of a metal silicide layer SL1 to be described later over the memory gate electrode MG more properly at a step S22 to be described later.

Figure 16:
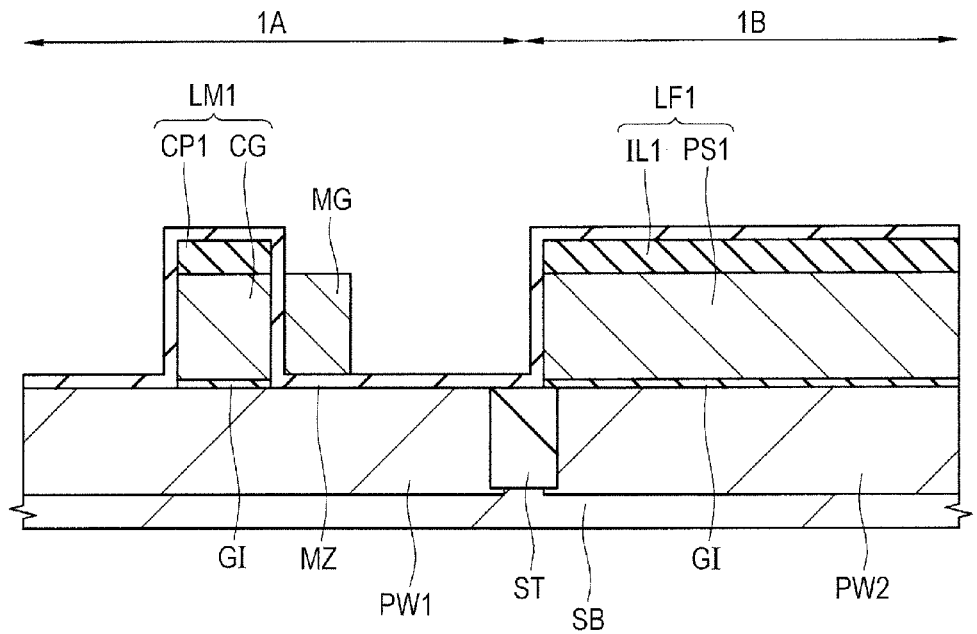
FIG. 16 is a main fragmentary cross sectional view of the semiconductor device during the manufacturing step thereof succeeding to that of FIG. 15.

Then, after forming a photoresist pattern to cover the memory gate electrode MG and expose the silicon spacer SP (not illustrated) over the semiconductor substrate SB by using photolithography, the silicon spacer SP is removed by dry etching using the photoresist pattern as an etching mask (step S15 in FIG. 2). Then, the photoresist pattern is removed. As illustrated in FIG. 16, while the silicon spacer SP is removed by the etching step at the step S15, since the memory gate electrode MG remains unetched, it has been covered by the photoresist pattern.

Figure 17:
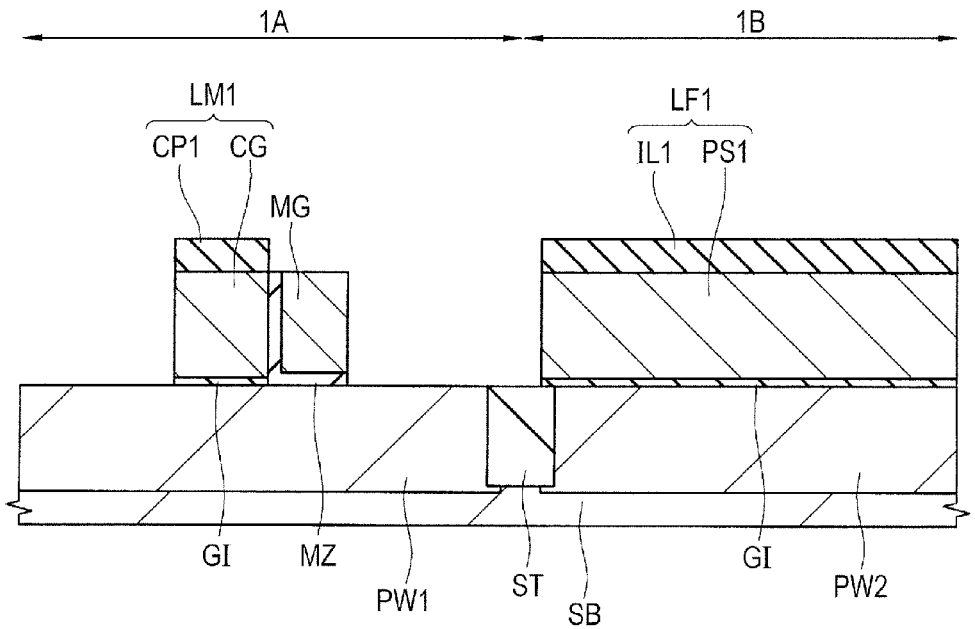
FIG. 17 is a main fragmentary cross sectional view of the semiconductor device during the manufacturing step thereof succeeding to that of FIG. 16.

Then, as illustrated in FIG. 17, a portion of the insulation film MZ that is exposed without being covered by the memory gate electrode MG is removed by etching (for example, wet etching) (step S16 in FIG. 2). In the memory cell region 1A, the insulation film MZ situated below the memory gate electrode MG and between the memory gate electrode MG and the lamination pattern LM1 is not removed but remains, whereas the insulation film MZ in other regions is removed. As can be seen from FIG. 17, the insulation film MZ extends continuously for both of the regions, that is, a region between the memory gate electrode MG and the semiconductor substrate SB (p-type well PW1) and a region between the memory gate electrode MG and the lamination pattern LM1 in the memory cell region 1A.

Then, by patterning the lamination film LF1 in the peripheral circuit region 1B by photolithography and etching, a lamination pattern (lamination structure) LM2 having a gate electrode DG and a cap insulation film CP2 over the gate electrode DG is formed in the peripheral circuit region 1B (step S17 in FIG. 2).

Figure 18:
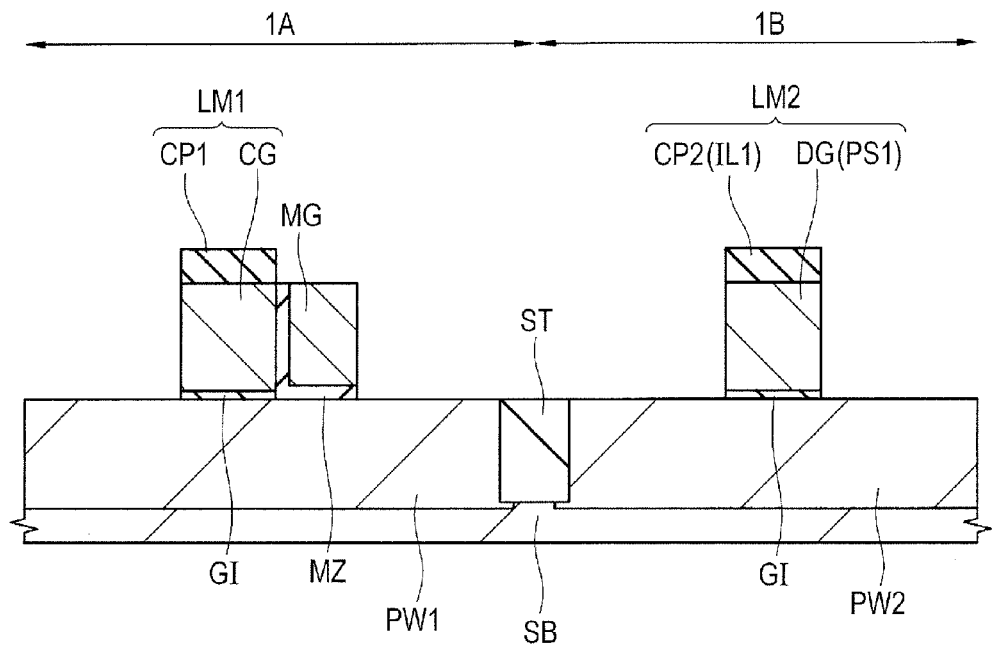
FIG. 18 is a main fragmentary cross sectional view of the semiconductor device during the manufacturing step thereof succeeding to that of FIG. 17.

The patterning step at the step S17 can be performed, for example, as described below. That is, a photoresist pattern (not illustrated) is at first formed over the main surface of the semiconductor substrate SB by using photolithography. The photoresist pattern is formed in the entire memory cell region 1A and in a region of the peripheral circuit region 1B to form a gate electrode DG. Accordingly, the memory gate electrode MG and the lamination pattern LM1 are covered by the photoresist pattern. Then, the lamination film LF1 of the silicon film PS1 and the insulation film IL1 in the peripheral circuit region 1B is patterned by etching (preferably dry etching) and then the photoresist pattern is removed. Thus, as illustrated in FIG. 18, a lamination pattern LM2 having a patterned gate electrode DG comprising the silicon film PS1 and a patterned cap insulation film CP2 comprising the patterned insulation film IL1 is formed in the peripheral circuit region 1B.

The lamination pattern LM2 comprises the gate electrode DG and the cap insulation film CP2 over the gate electrode DG, and is formed by way of the insulation film GI over the semiconductor substrate SB (p-type well PW2) in the peripheral circuit region 1B. The gate electrode DG and the cap insulation film CP2 have a substantially identical planar shape in a plan view and overlap each other in a plan view. The gate electrode DG is a dummy gate electrode (pseudo gate electrode) and is removed subsequently. Accordingly, the gate electrode DG can be referred to as a dummy gate. Further, since the gate electrode DG is removed subsequently and replaced with a gate electrode GE to be described later, it can also be regarded as a replacement gate electrode or a substitution gate electrode.

The photoresist pattern used in the patterning step at the step S17 is formed selectively in a region to form the gate electrode DG in the peripheral circuit region 1B. Therefore, when the step S17 is performed, the silicon film PS1 and the insulation film IL1 at portions other than the portion forming the lamination pattern LM2 are removed in the peripheral circuit region 1B. On the other hand, the photoresist pattern used in the patterning step at the step S17 is formed for the entire memory cell region LA in the memory cell region 1A. Accordingly, even when the patterning step performed at the step S17, the lamination pattern LM1 and the memory gate electrode MG are not removed but left as they are in the memory cell region 1A.

In the peripheral circuit region 1B, the insulation film G1 at a portion other than the portion covered by the lamination pattern LM2 can be removed by dry etching performed in the patterning step at the step S17 or by wet etching after the dry etching.

As described above, the lamination pattern LM2 having the gate electrode DG and the cap insulation film CP2 over the gate electrode DG is formed by way of the insulation film G1 over the semiconductor substrate SB (p-type well PW2) in the peripheral circuit region 1B.

As described above, a state as illustrated by FIG. 18 is obtained, in which the control gate electrode CG is formed by way of the insulation film GI over the semiconductor substrate SB and the memory gate electrode MG is formed by way of the insulation film MZ over the semiconductor substrate SB in the memory cell region 1A, and the gate electrode DG is formed by way of the insulation film GI over the semiconductor substrate SB in the peripheral circuit region 1B. The cap insulation film CP1 is formed over the control gate electrode CG and the cap insulation film CP2 is formed over the gate electrode DG.

Further, in this embodiment, the insulation film G1 interposed between the gate electrode DG and the semiconductor substrate SB (p-type well PW2) is an insulation film which is a layer identical with the insulation film GI interposed between the control gate electrode CG and the semiconductor substrate SB (p-type well PW1) (that is, insulation film formed in an identical step).

In other configuration, the insulation film GI interposed between the gate electrode DG and the semiconductor substrate SB (p-type well PW2) may be an insulation film which is different from the insulation film GI interposed between the control gate electrode CG and the semiconductor substrate SB (p-type well PW1) (that is, the insulation film formed by a different step). In this case, the insulation film GI in the memory cell region 1A and the insulation film GI in the peripheral circuit region 1B can be formed in separate steps at the step S4 before forming the silicon film PS1 at the step S5.

Figure 19:
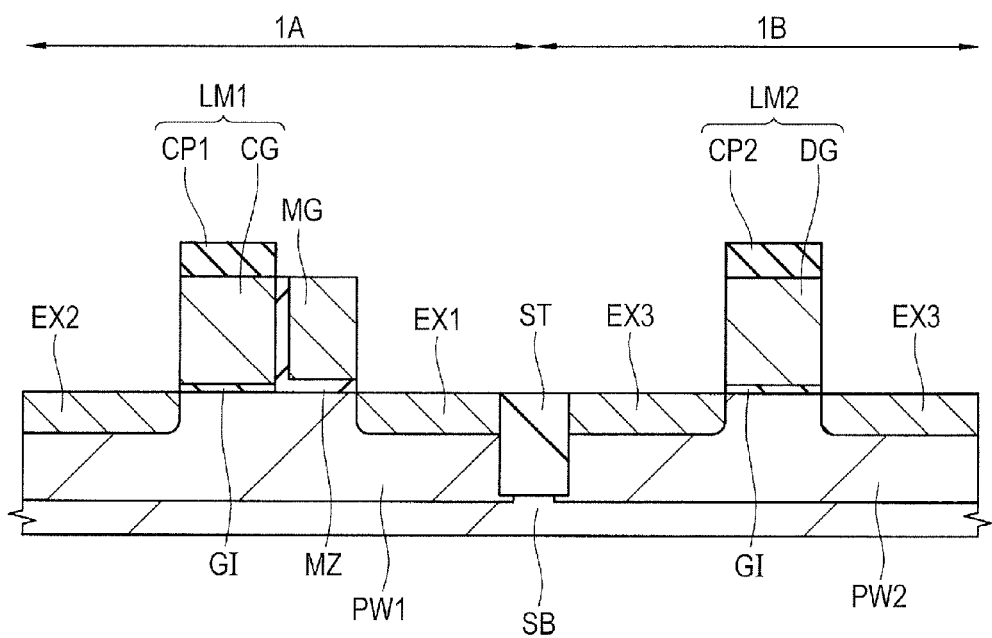
FIG. 19 is a main fragmentary cross sectional view of the semiconductor device during the manufacturing step thereof succeeding to that of FIG. 18.

Then, as illustrated in FIG. 19, n$^-$-type semiconductor regions (impurity diffusion layer) EX1, EX2 and EX3 are formed by using ion implantation, etc. (step S18 in FIG. 2).

At the step S18, the n$^-$-type semiconductor regions EX1, EX2, and EX3 can be formed by introducing n-type impurities, for example, arsenic (As) or phosphorus (P) into the semiconductor substrate SB (p-type wells PW1, PW2) by using the lamination pattern LM1, the memory electrode MG and the lamination pattern LM2 as a mask (ion implantation blocking mask). In this case, since the memory gate electrode MG functions as a mask (ion implantation blocking mask) in the memory cell region 1A, the n$^-$-type semiconductor region EX1 is formed in self-alignment with the side wall of the memory gate electrode MG (side wall opposite to the side adjacent to the control gate electrode CG by way of the insulation film MZ). Further, since the lamination pattern LM1 functions as a mask (ion implantation blocking mask) in the memory cell region LA, the n$^-$-type semiconductor region EX2 is formed in self-alignment with the side wall of the control gate electrode CG (side wall on the side opposite to the side adjacent to the memory gate electrode MG by way of the insulation film MZ). Further, since the lamination pattern LM2 functions as a mask (ion implantation blocking mask) in the peripheral circuit region 1B, the n$^-$-type semiconductor region EX3 is formed in self-alignment with both side walls of the gate electrode DG. The n$^-$-type semiconductor region EX1 and the n$^-$-type semiconductor region EX2 can function as a portion of a source-drain region (source or drain region) of the memory cell formed in the memory cell region 1A, and the n$^-$-type semiconductor region EX3 can function as a portion of the source-drain region of the MISFET (source or drain region) formed in the peripheral circuit region 1B. While the n$^-$-type semiconductor region EX1, the n$^-$-type semiconductor region EX2, and the n$^-$-type semiconductor region EX3 can be formed by an identical ion implantation step, they can be formed also by different ion implantation steps.

Alternatively, after forming the lamination pattern LM2 at step S17 and before forming n$^-$-type semiconductor regions EX1, EX2, and EX3 at the step S18, an insulation film comprising, for example, a silicon nitride film (not illustrated) may be formed over the semiconductor substrate SB so as to cover the lamination pattern LM2, the memory gate electrode MG, and the lamination pattern LW1 and then ion implantation at the step S18 can be performed. In this case, the insulation film can function as an offset spacer and can function as a mask together with the lamination pattern LM1, the memory gate electrode MG, and the lamination pattern LM2 upon ion implantation (ion implantation blocking mask).

Then, a side wall spacer comprising an insulation film (side wall, side wall insulation film) SW is formed as a side wall insulation film on the side wall of the lamination pattern LM1 and the memory gate electrode MG (side wall on the side opposite to the side adjacent to each other by way of the insulation film MZ), on the side wall of the lamination pattern LM2, and over the memory gate electrode MG (at step S19 in FIG. 2). The side wall spacer SW can be regarded as a side wall insulation film.

Figure 20:
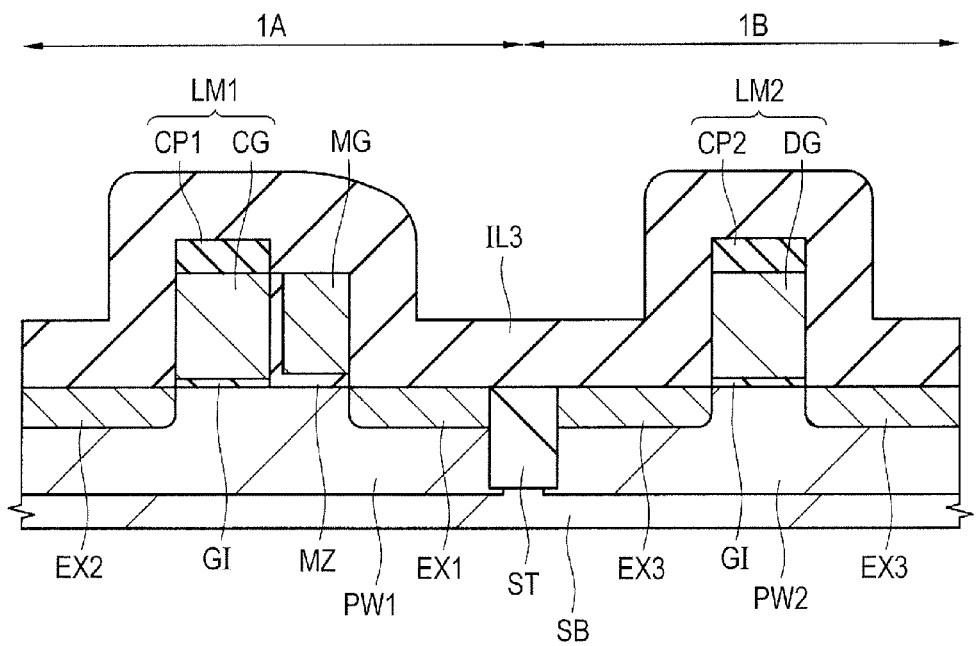
FIG. 20 is a main fragmentary cross sectional view of the semiconductor device during the manufacturing step thereof succeeding to that of FIG. 19.
Figure 21:
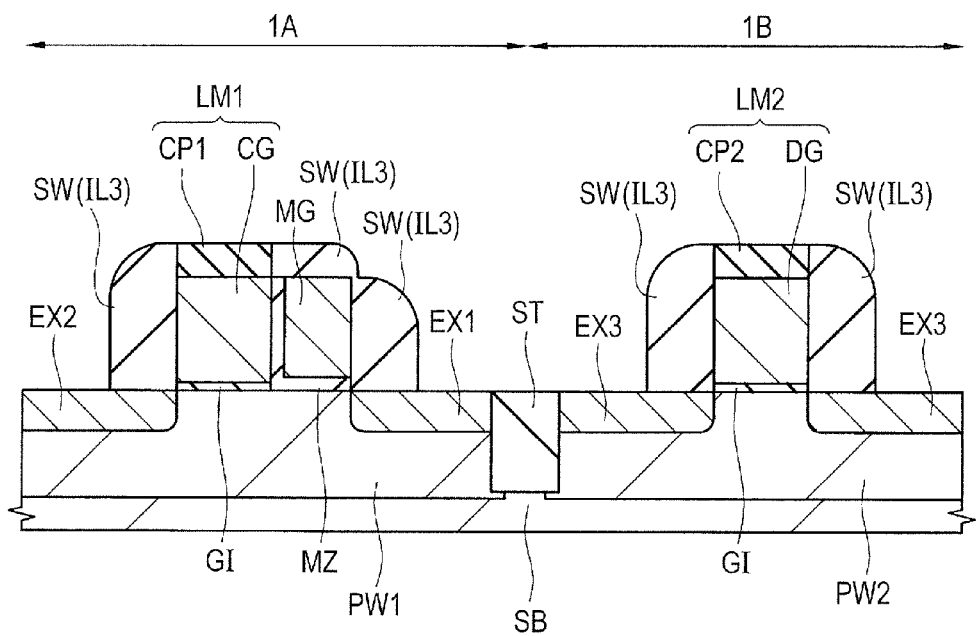
FIG. 21 is a main fragmentary cross sectional view of the semiconductor device during the manufacturing step thereof succeeding to that of FIG. 20.

The step of forming the side wall spacer SW at the step S19 can be performed, for example, as described below. At first, as illustrated in FIG. 20, an insulation film IL3 is formed (deposited) over the entire main surface of the semiconductor substrate SB. The insulation film IL3 comprises a silicon oxide film, a silicon nitride film, or a lamination film thereof and can be formed by using CVD, etc. The insulation film IL3 is formed over the semiconductor substrate SB so as to cover the memory gate electrode MG, the lamination pattern LM1, and the lamination pattern LM2. Then, as illustrated in FIG. 21, the insulation film IL3 is etched back by anisotropic etching (etching, dry etching, anisotropic etching). Thus, the insulation film IL3 is left selectively on the side wall of the lamination pattern LM1 and the memory gate electrode MG (side wall on the side opposite to the side adjacent to each other by way of the insulation film MZ), on the side wall of the lamination pattern LM2, and over the memory gate electrode MG, thereby forming the side wall spacer SW. The side wall spacer SW is formed on both side walls of the lamination pattern LM2, on the Side wall of the lamination pattern LW1 which is on the side opposite to the side adjacent to the memory gate electrode MG by way of the insulation film MZ, on the side wall of the memory gate electrode MG which is on the side wall opposite to the side adjacent to the lamination pattern LM1 by way of the insulation film MZ and over the memory gate electrode MG.

In this embodiment, the side wall spacer SW is formed not only on each of the side walls of the lamination pattern LW1, the memory gate electrode MG, and the lamination pattern LM2 but also over the upper surface of the memory gate electrode MG. The height of the memory gate electrode MG is made lower than the height of the lamination pattern LM1 in this embodiment so that the side wall spacer SW is formed also over the memory gate electrode MG.

That is, if the height of the memory gate electrode MG is equal with the height of the lamination pattern LM1 different from this embodiment, when the insulation film IL3 is etched back the insulation film IL3 is left on the side wall of the memory gate electrode MG and the side wall spacer SW is formed, but no insulation film IL3 is left over the upper surface of the gate electrode MG. Therefore, the side wall spacer SW is not formed over the memory gate electrode MG.

On the contrary, in this embodiment, since the height of the memory gate electrode MG is lower than the height of the lamination pattern LM1, a portion higher than the memory gate electrode MG is present on the side wall of the lamination pattern LM1 on the side adjacent to the memory gate electrode MG. Therefore, when the insulation film IL3 is etched back, the insulation film IL3 is left to form the side wall spacer SW adjacent to the side wall of the lamination pattern LM1 on the side adjacent to the memory gate electrode MG at a portion higher than the memory gate electrode MG and the side wall spacer SW is situated above the memory gate electrode MG. That is, the side wall spacer SW situated above the memory gate electrode MG is adjacent to the side wall of the lamination pattern LM1 situated at a position higher than the memory gate electrode MG. The side wall spacer SW situated above the memory gate electrode MG may be connected integrally with the side wall spacer SW adjacent to the side wall of the memory gate electrode MG (side wall on the side opposite to the side wall adjacent to the control gate electrode CG). When the side wall spacer SW is formed at the step S19, the upper surface and the side surface (side surface opposite to the side adjacent to the control gate electrode CG) of the memory gate electrode MG are covered by the side wall spacer SW and not exposed.

The upper surface of the control gate electrode CG is covered by the cap insulation film CP1. One of the side walls of the control gate electrode CG (side wall on the side opposite to the side wall adjacent to the memory gate electrode MG) is covered by the side wall spacer SW and the other side wall of the control gate electrode CG (side wall on the side adjacent to the memory gate electrode MG) is covered by the insulation film MZ, the memory gate electrode MG, and the side wall spacer SW over the memory gate electrode MG. Further, the upper surface of the memory gate electrode MG is covered by the side wall spacer SW. One of the side walls of the memory gate electrode MG (side wall on the side opposite to the side wall adjacent to the control gate electrode CG) is covered by the side wall spacer SW and the other side wall of the memory gate electrode MG (side wall on the side adjacent to the control gate electrode CG) is covered by the insulation film MZ and the lamination pattern LM1. Further, the upper surface of the gate electrode DG is covered by the gap insulation film CP2. Both side walls of the gate electrode DG are covered by the side wall spacer SW. Therefore, when the side wall spacer SW is formed at the step S19, the control gate electrode CG, the memory gate electrode MG, and the gate electrode DG are covered by the cap insulation films CP1 and CP2 and the side wall spacer SW and are in a not exposed state. Thus, when a metal silicide layer SL1 is formed at a step S22 to be described later, it is possible not to form the metal silicide layer SL1 to be described later over the surface of the control gate electrode CG, the memory gate electrode MG, and the gate electrode DG.

Figure 22:
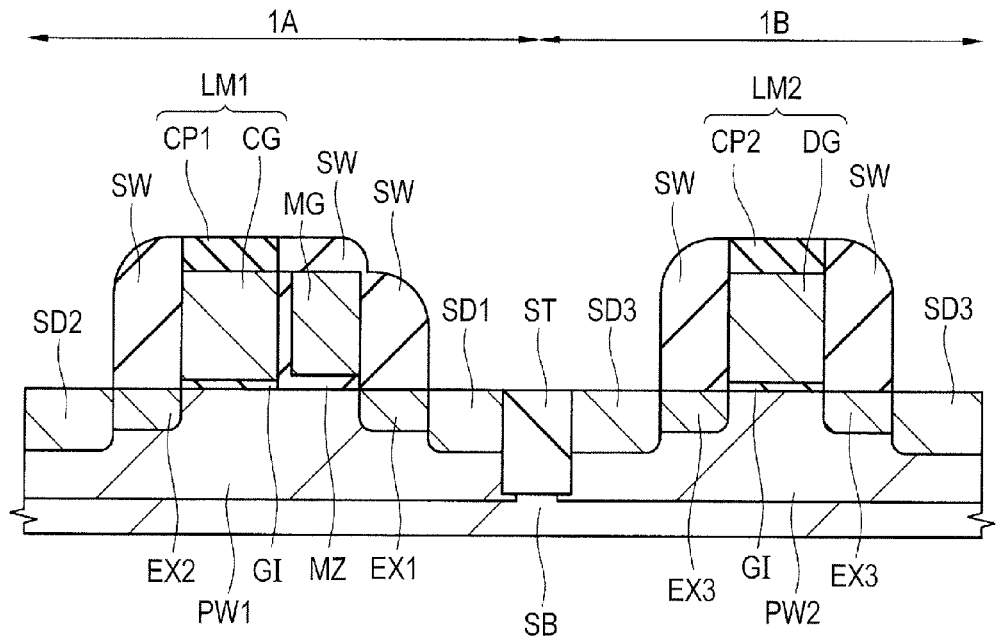
FIG. 22 is a main fragmentary cross sectional view of the semiconductor device during the manufacturing step thereof succeeding to that of FIG. 21.

Then, as illustrated in FIG. 22, $n^+$-type semiconductor regions (impurity diffusion layers) SD1, SD2, and SD3 are formed by using ion implantation, etc. (step S20 in FIG. 2).

At the step S20, the $n^+$-type semiconductor regions SD1, SD2, and SD3 can be formed by introducing n-type impurities, for example, arsenic (As) or phosphorus (P) into the semiconductor substrate SB (p-type wells PW1 and PW2) by using the lamination pattern LM1, the memory gate electrode MG, the lamination pattern LM2, and the side wall spacer SW as a mask (ion implantation blocking mask). In this case, since the memory gate electrode MG, the side wall spacer SW over the memory gate electrode MG, and the side wall spacer. SW on the side wall of the memory gate electrode MG function as a mask (ion implantation blocking mask) in the memory cell region 1A, the $n^+$-type semiconductor region SD1 is formed in self-alignment with the side wall spacer SW on the side wall of the memory gate electrode MG. Further, since the lamination pattern LM1 and the side wall spacer SW on the side wall thereof function as a mask (ion implantation blocking mask) in the memory sell region 1A, the $n^+$-type semiconductor region SD2 is formed in self-alignment with the side wall spacer SW on the side wall of the lamination pattern LM1. Further, since the lamination pattern LM2 and the side wall spacer SW on the side wall thereof function as a mask (ion implantation blocking mask) in the peripheral circuit region 1B, the $n^+$-type semiconductor region SD3 is formed in self-alignment with the side wall spacer SW on both side walls of the lamination pattern LM2. Thus, a LDD (Lightly Doped Drain) structure is formed. While the $n^+$-type semiconductor region SD1, the $n^+$-type semiconductor region SD2, and the n+-type semiconductor region SD3 can be formed by an identical ion implantation step, they can be formed also by different ion implantation steps. Alternatively, the n+-type semiconductor region SD1 and the n+-type semiconductor region SD2 may be formed by one identical ion implantation step and the n+-type semiconductor region SD3 can be formed by a different ion implantation.

As described above, a n-type semiconductor region that functions as a source region of the memory transistor is formed by the n−-type semiconductor region EX1 and the n-type semiconductor region SD1 at a higher impurity concentration, and a n+-type semiconductor region that functions as a drain region of the control transistor is formed by a n−-type semiconductor region EX2 and the n+-type semiconductor region SD2 of a higher impurity concentration. Further, a n-type semiconductor region that functions as a source-drain region of the MISFET in the peripheral circuit region 1B is formed by the n−-type semiconductor region EX3 and the n+-type semiconductor region SD3 of a higher impurity concentration. The n+-type semiconductor region SD1 has higher impurity concentration and deeper junction depth than those of the n−-type semiconductor region EX1, the n+-type semiconductor region SD2 has higher impurity concentration and deeper junction depth than those of the n−-type semiconductor region EX2, and the n+-type semiconductor region SD3 has higher impurity concentration and deeper junction depth than those of the n−-type semiconductor region EX3.

Figure 3:
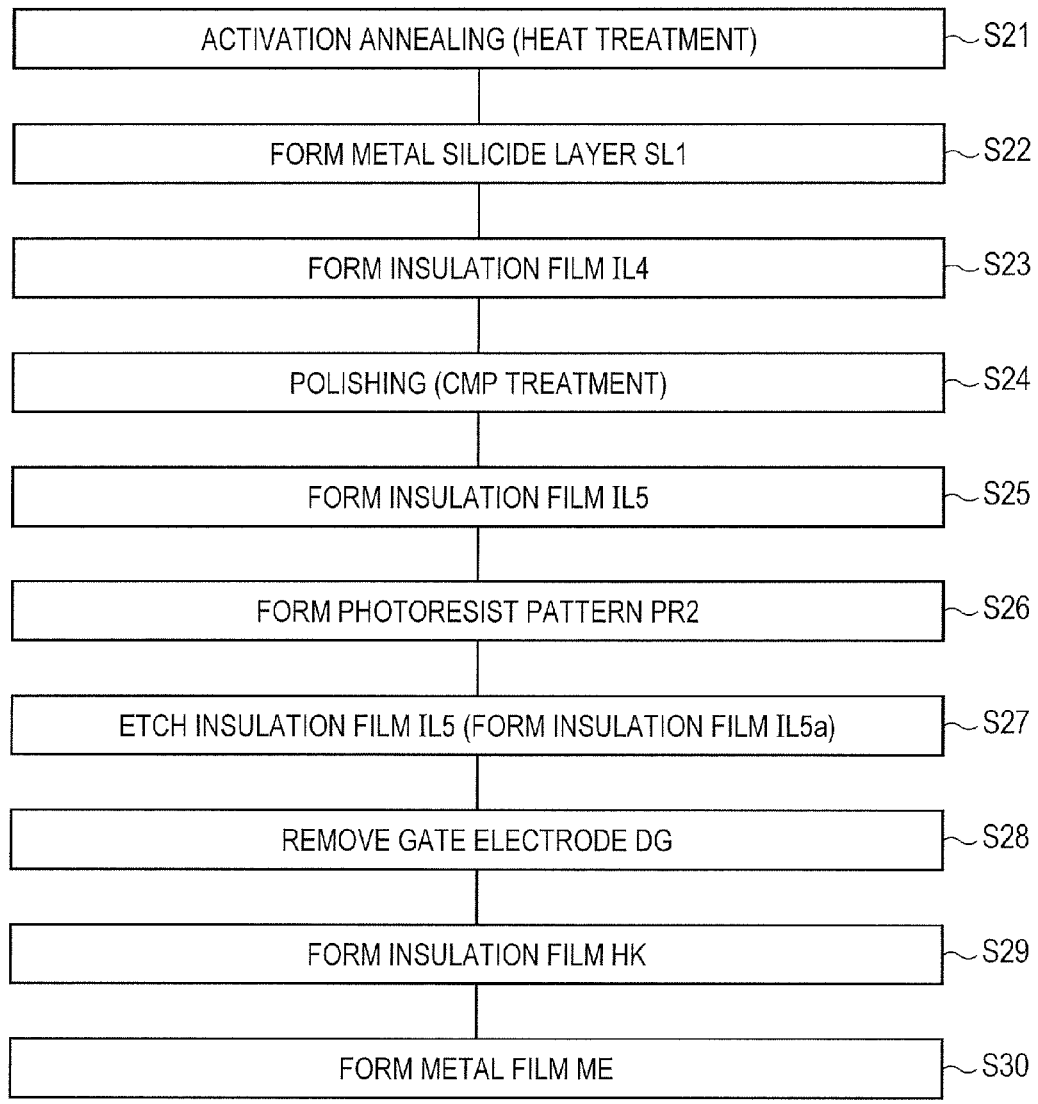
FIG. 3 is a process flow chart illustrating a portion of the manufacturing step of the semiconductor device as the preferred embodiment.

Then, activation annealing which is a heat treatment for activating the impurities introduced into the semiconductor regions for source and drain (n−-type semiconductor regions EX1, EX2, and EX3 and n+-type semiconductor region SD1, SD2, and SD2) is performed (step S21 in FIG. 3).

As described above, a memory cell of a non-volatile memory is formed in the memory cell region 1A. On the other hand, since the gate electrode DG is a dummy gate electrode, while the source-drain region has been formed for the MISFET in the peripheral circuit region 1B, a gate electrode to be used finally (gate electrode to be described later) is not yet formed.

Then, a metal silicide layer SL1 is formed (step S22 in FIG. 3). The metal silicide layer SL1 can be formed as described below.

Figure 23:
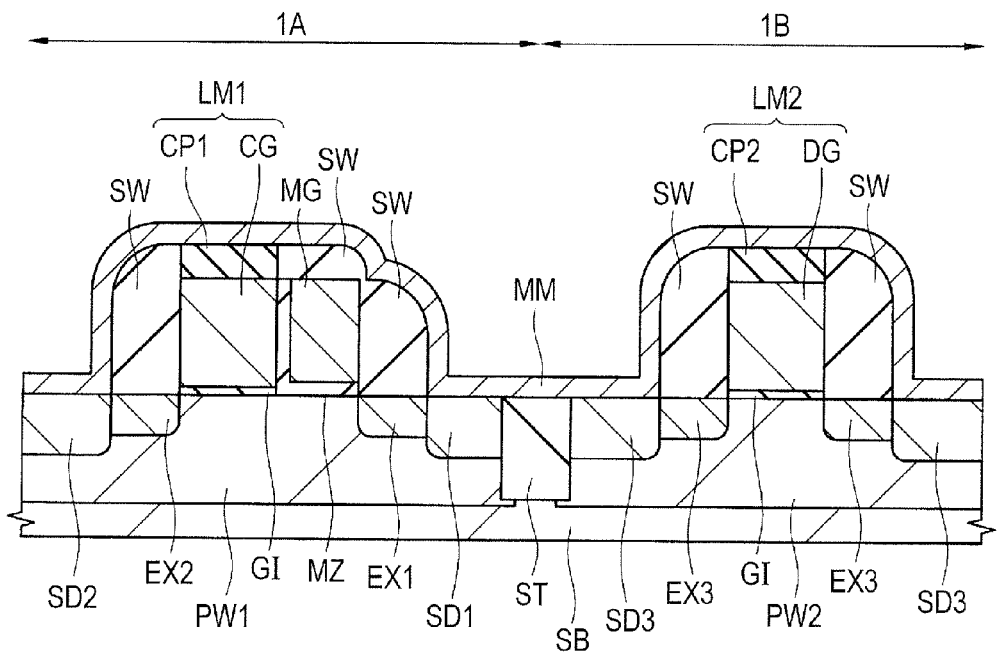
FIG. 23 is a main fragmentary cross sectional view of the semiconductor device during the manufacturing step thereof succeeding to that of FIG. 22.

At first, as illustrated in FIG. 23, a metal film MM is formed (deposited) over the entire main surface of the semiconductor substrate SB including the upper surface (surface) of the n+-type semiconductor regions SD1, SD2, and SD3 so as to cover the lamination pattern LM1, the memory gate electrode MG, the lamination pattern LM2, and the side wall spacers SW. The metal film MM may comprise an elemental metal film (pure metal film) or an alloy film and, preferably, comprise a cobalt (Co) film, a nickel (Ni) film, or a nickel-platinum alloy film, the nickel-platinum alloy film (platinum-added nickel film) being particularly preferred. The metal film MM can be formed by using sputtering, etc.

Figure 24:
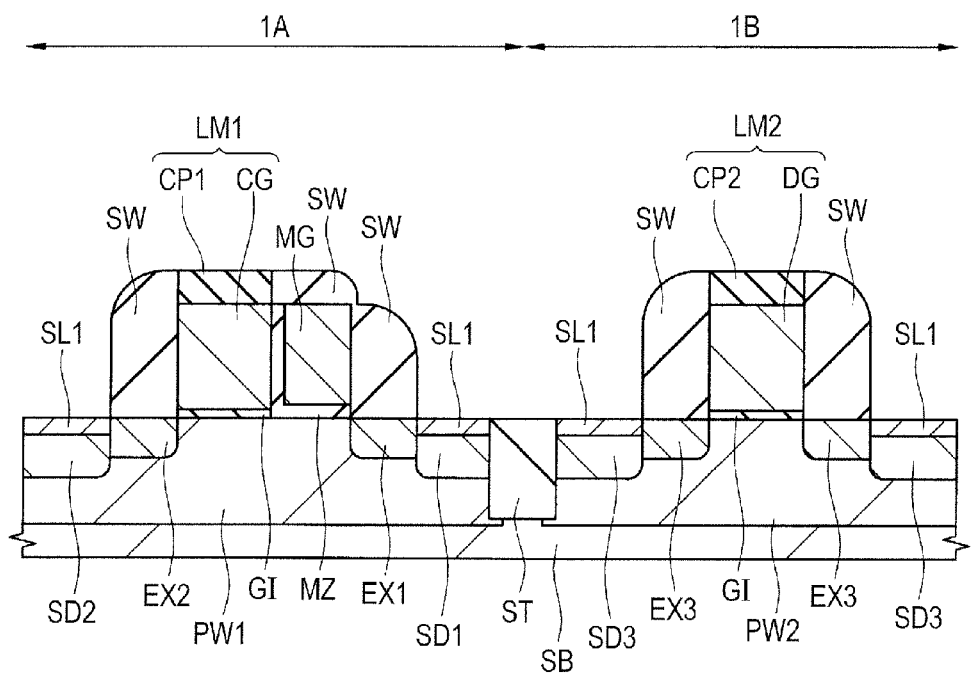
FIG. 24 is a main fragmentary cross sectional view of the semiconductor device during the manufacturing step thereof succeeding to that of FIG. 23.

Then, each of the upper layer portions (surface layer portion) of the n+-type semiconductor regions SD1, SD2, and SD3 is reacted with the metal film MM by applying a heat treatment to the semiconductor substrate SB. Thus, as illustrated in FIG. 24, a metal silicide layer SL1 is formed to each of the upper portions (upper surface, surface, upper layer portion) of the n+-type semiconductor regions SD1, SD2, and SD3. The metal silicide layer SL1 can be, for example, a cobalt silicide layer (when the metal film MM is a cobalt film), a nickel silicide layer (when the metal film MM is a nickel film), or a platinum-added silicide layer (when the metal film MM is a nickel-platinum alloy film). The platinum-added nickel silicide layer is a nickel silicide layer with addition of platinum, that is, a nickel silicide layer containing platinum and can also be referred to as a nickel-platinum silicide layer. Subsequently, unreacted metal film MM is removed by wet etching, etc. FIG. 24 illustrates a cross sectional view in this stage. After removing the unreacted metal film MM, a heat treatment may also be applied further.

As described above, by applying a so-called salicide (self-aligned silicide) process, the metal silicide layer SL1 is formed to the upper portion of the n+-type semiconductor regions SD1, SD2, and SD3 by which the resistance of the source and the drain can be lowered. By using the salicide process, the metal silicide layer SL1 can be formed in self-alignment over the n+-type semiconductor regions SD1, SD2, and SD3 respectively. Further, the metal silicide layer SL1 can be formed over each of the substantially entire upper surfaces of the n+-type semiconductor regions SD1, SD2, and SD3.

Even when the metal film MM is formed, the metal film MM is not in contact with the control gate electrode CG, the memory gate electrode MG, and the gate electrode DG and those corresponding to the metal silicide layer SL1 are not formed over the control gate electrode CG, the memory gate electrode MG, and the gate electrode DG. Accordingly, at the step S22, while the metal silicide layer SL1 is formed over the n+-type semiconductor regions SD1, SD2, and SD3, the metal silicide layer SL1 is not formed over the control gate electrode CG, the memory gate electrode MG, and the gate electrode DG.

That is, the cap insulation film CP1 has been formed over the control gate electrode CG and the cap insulation film CP1 has been interposed between the control gate CG and the metal film MM. Accordingly, even when the metal film MM is formed, the control gate electrode CG and the metal film MM are not in contact to each other. Accordingly, even when the heat treatment is applied, the control gate electrode CG does not react with the metal film MM and the metal silicide layer SL1 is not formed over the control gate electrode CG.

Further, the cap insulation film CP2 has been formed over the gate electrode DG and the cap insulation film CP2 has been interposed between the gate electrode DG and the metal film MM. Accordingly, even when the metal film MM is formed, the gate electrode DG and the metal film MM have not been in contact each other. Accordingly, even when the heat treatment is applied, the gate electrode DG does not react with the metal film MM and the metal silicide layer SL1 is not formed over the gate electrode DG.

Further, the side wall spacer SW has been formed over the memory gate electrode MG and the side wall spacer SW has been interposed between the memory gate electrode MG and the metal film MM. Accordingly, even when the metal film MM is formed, the memory gate electrode MG and the metal film MM have not been in contact each other. Accordingly, even when the heat treatment is applied, the memory gate electrode MC does not react with the metal film MM and the metal silicide layer SL1 is not formed over the memory gate electrode MG.

Figure 25:
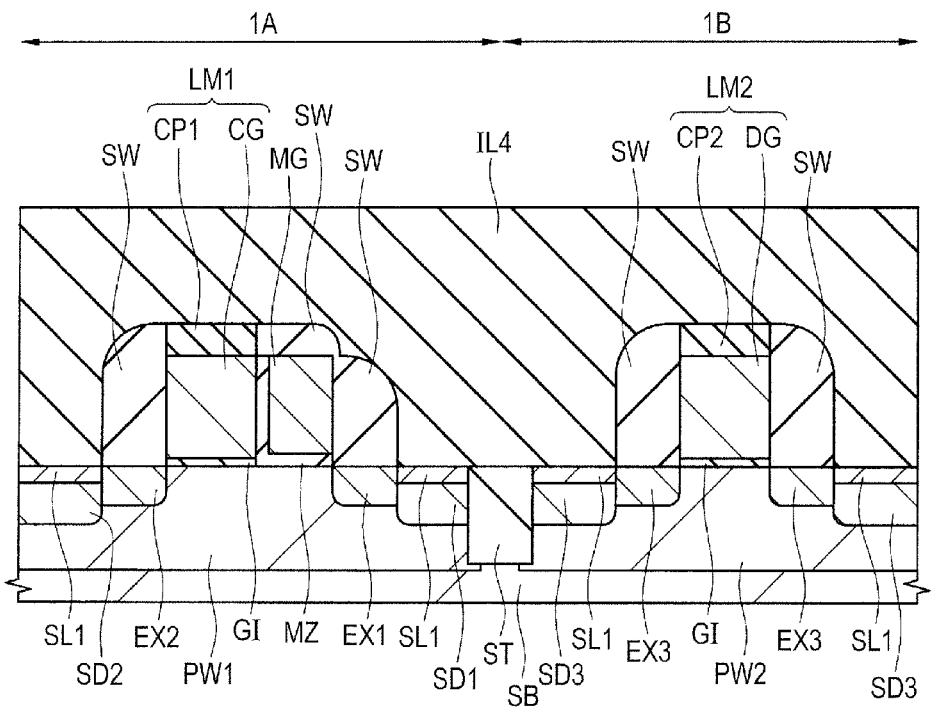
FIG. 25 is a main fragmentary cross sectional view of the semiconductor device during the manufacturing step thereof succeeding to that of FIG. 24.

Then, as illustrated in FIG. 25, an insulation film IL4 is formed (deposited) as an interlayer insulation film over the main surface of the semiconductor substrate SB so as to cover the lamination pattern LM1, the memory gate electrode MG, the lamination pattern LM2, and the side wall spacer SWs (step S23 in FIG. 3).

The insulation film IL4 comprises a mono-layer film of a silicon oxide film, a lamination film of a silicon nitride film and a silicon oxide film of a thickness larger than that of the silicon nitride film formed over the silicon nitride film, etc. and can be formed by using CVD, etc.

Figure 26:
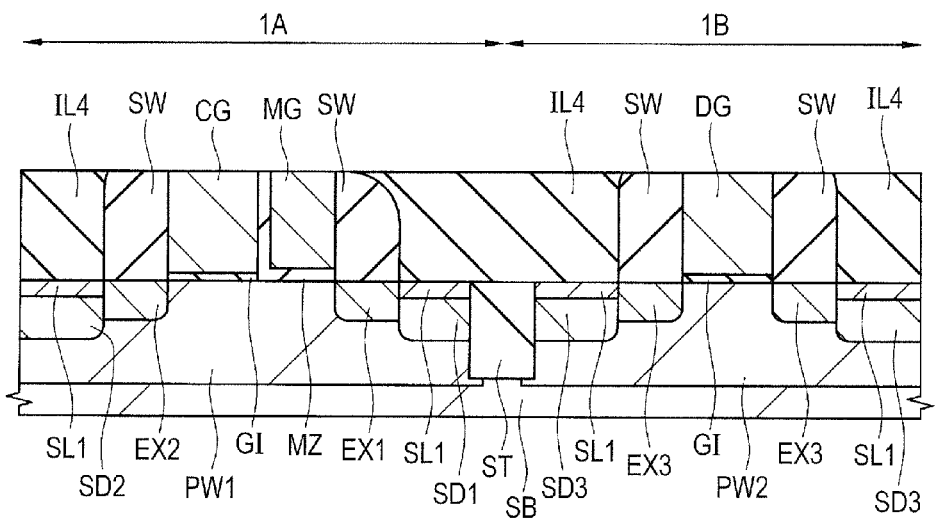
FIG. 26 is a main fragmentary cross sectional view of the semiconductor device during the manufacturing step thereof succeeding to that of FIG. 25.

Then, the upper surface of the insulation film IL4 is polished by CMP, etc. (step S24 in FIG. 3). As illustrated in FIG. 26, each of the upper surfaces of the control gate electrode CG, the memory gate electrode MG, and the gate electrode DG are exposed by the polishing step at the step S24. That is, in the polishing step at the step S24, the insulation film IL4 is polished till the upper surface of the control gate electrode CG, the memory gate electrode MG, and the gate electrode DG is exposed.

In the stage of forming the insulation film IL4 at the step S23, unevenness or step that reflects the lamination pattern LM1, the memory gate electrode MG, the lamination pattern LM2, the side wall spacers W, etc. is sometimes formed at the upper surface of the insulation film IL4. However, after the polishing step at the step S24, the upper surface of the insulation film IL4 is planarized.

Figure 27:
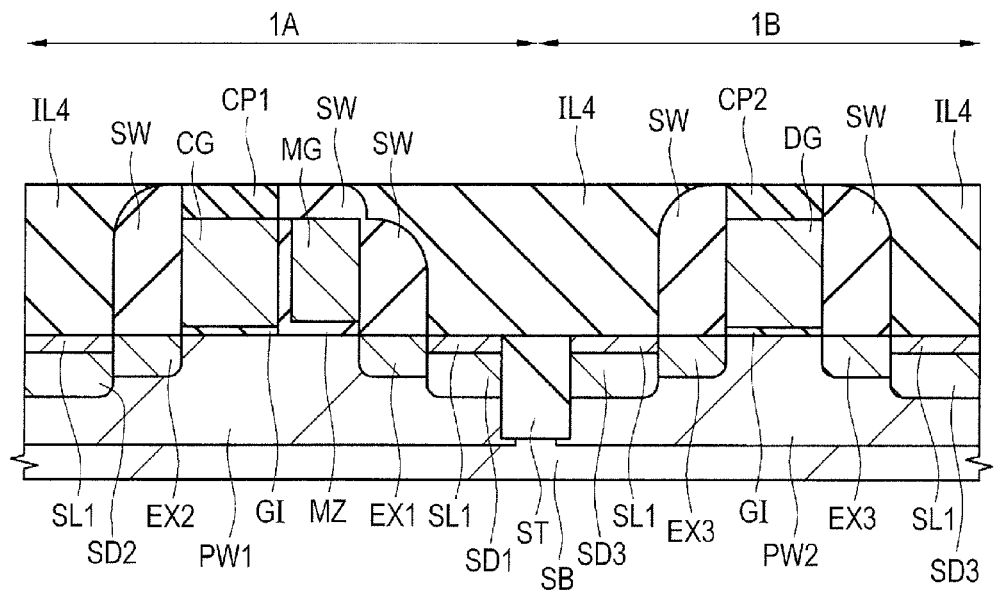
FIG. 27 is a main fragmentary cross sectional view of the semiconductor device during the manufacturing step thereof succeeding to that of FIG. 26.

After forming the insulation film IL4 at the step S23 in a state where the cap insulation film CP1 is formed over the control gate electrode CG, the side wall spacer SW is formed over the memory gate electrode MG, and the cap insulation film CP2 is formed over the gate electrode DG, the polishing step at the step S24 is performed. Accordingly, in the polishing step at the step S24, the insulation film IL4 is polished at first till the upper surface of the cap insulation films CP1 and CP2 is exposed as illustrated in FIG. 27. Then, polishing is further performed, to expose the upper surface of the control gate electrode CG, the memory gate electrode MG, and the gate electrode DG as illustrated in FIG. 26. In the polishing after exposing the upper surface of the cap insulation films CP1 and CP2 (that is, polishing from the structure of FIG. 27 to the structure of FIG. 26), not only the insulation film IL4 but also the cap insulation film CP1 over the control gate electrode CG, the cap insulation film CG2 over the gate electrode DG, and the side wall spacer SW over the memory gate electrode MG are also polished.

Accordingly, the polishing step at the step S24 can be divided into a first polishing step which is applied to the insulation film IL4 till the upper surface of the cap insulation films CP1 and CP2 is exposed and a second polishing step which is applied from the state in which the upper surface of the cap insulation films CP1 and CP2 is exposed to a state in which the upper surface of the control gate electrode CG, the memory gate electrode MG, and the gate electrode DG is exposed. In this case, the polishing conditions (for example, slurry used for polishing) can be changed between the first polishing step and the second polishing step. The first polishing step corresponds to the polishing step till the structure in FIG. 27 is obtained, and the second polishing step corresponds to the polishing step from a state in which the structure in FIG. 27 is obtained to a state in which the structure in FIG. 26 is obtained.

For example, in the first polishing step, the insulation film IL1 is polished by using polishing a condition that the polishing rate of the insulation film IL4 is higher than that of the cap insulation films CP1 and CP2 where the cap insulation films CP1 and CP2 can function as a polishing stopper. In the second polishing step, the insulation film IL4, the cap insulation films CP1 and CP2, and the side wall spacer SW are polished by using, for example, a polishing condition that the polishing rate for the cap insulation films CP1 and CP2 is higher than that of the first polishing step, by which the upper surface of the control gate electrode CG, the memory gate electrode MG, and the gate electrode DG can be exposed.

In this embodiment, the metal silicide SL1 has not been formed over the surface of the control gate electrode CG, the memory gate electrode MG, and the gate electrode DG as described above. Accordingly, while the control gate electrode CG, the memory gate electrode MG, and the gate electrode DG are exposed in the polishing step at the step S24, polishing of the metal silicide layer SL1 can be saved in this step.

Further, in other configuration, the polishing step at the step S24 can be performed by combining dry etching or wet etching with the polishing treatment such as CMP.

Figure 28:
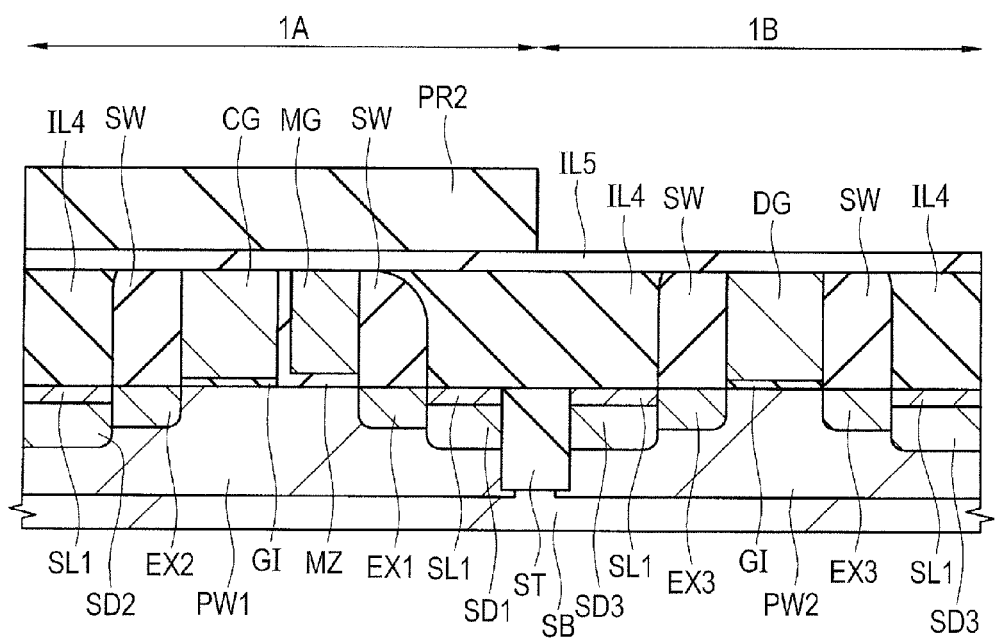
FIG. 28 is a main fragmentary cross sectional view of the semiconductor device during the manufacturing step thereof succeeding to that of FIG. 27.

Then, as illustrated in FIG. 28, an insulation film IL5 is formed over the semiconductor substrate SB (step S25 in FIG. 3).

The insulation film IL5 comprises, for example, a silicon nitride film and can be formed by using CVD, etc. Since the insulation film IL5 is formed over the entire main surface of the semiconductor substrate SB, the insulation film IL5 is formed over the insulation film IL4 so as to cover the control gate electrode CG, the memory gate electrode MG, and the gate electrode DG.

Then, a photoresist pattern PR2 is formed as a resist pattern over the semiconductor substrate SB, that is, over the insulation film IL5 by using photolithography (step S26 in FIG. 3).

The photoresist pattern PR2 is formed so as to cover the entire memory cell region 1A and expose the gate electrode DG in the peripheral circuit region 1B in a plan view.

Then, the insulation film IL5 is etched by using the photoresist pattern PR2 as an etching mask (step S27 in FIG. 3).

Figure 29:
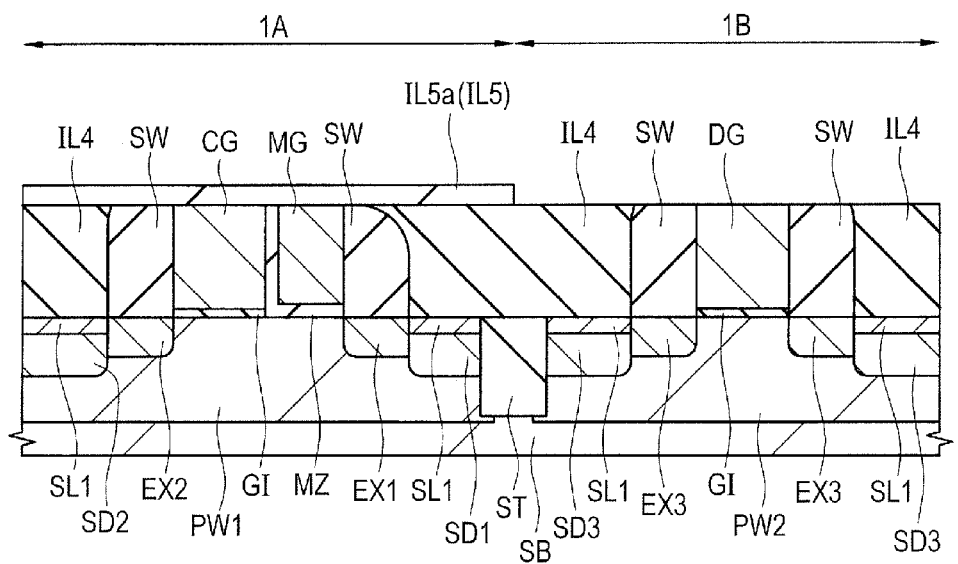
FIG. 29 is a main fragmentary cross sectional view of the semiconductor device during the manufacturing step thereof succeeding to that of FIG. 28.

By the etching step at the step S27, a portion of the insulation film IL5 not covered by the photoresist pattern PR2 is removed by etching and a portion of the insulation film IL5 covered by the photoresist pattern PR2 remains unetched. Thus, the insulation film IL5 is patterned into a pattern identical with the photoresist pattern PR2. The insulation film IL5 after etching at the step S27 carries a reference sign IL5a and is referred to as an insulation film IL5a. The insulation film IL5a has a pattern identical with the photoresist pattern PR2. That is, the insulation film IL5a has such a pattern (planar shape) as to cover the entire memory cell region 1A and expose the gate electrode DG in the peripheral circuit region 1B. After the etching step at the step S27, the photoresist pattern PR2 is removed. This state is illustrated in FIG. 29. For etching at the step S27, dry etching or wet etching can be used.

By the polishing step at the step S24, the control gate electrode CG, the memory gate electrode MG, and the gate electrode DG have been exposed. When the insulation film IL5a is formed by the steps S25, S26, and S27, the upper surface of the gate electrode DG is exposed not being covered by the insulation film IL5a, whereas the control gate electrode CG and the memory gate electrode MG are not exposed being covered by the insulation film IL5a. The steps S25, S26, and S27 can be regarded also as a step of forming the insulation film IL5a of covering the upper surface of the memory gate electrode MG and the upper surface of the control gate electrode CG and exposing the upper surface of the gate electrode DG.

Figure 30:
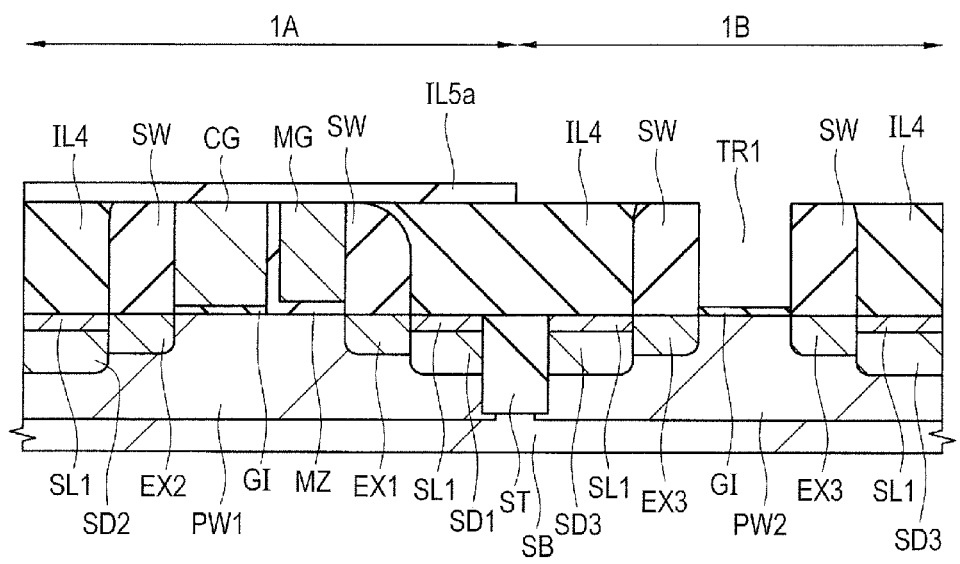
FIG. 30 is a main fragmentary cross sectional view of the semiconductor device during the manufacturing step thereof succeeding to that of FIG. 29.

Then, as illustrated in FIG. 30, the gate electrode DG is removed by etching (step S28 in FIG. 3). For the etching at the step S28, dry etching, wet etching, or combination of them can be used.

Since the gate electrode DG has been removed at the step S28, a trench (cavity or indent) TR1 is formed. The trench TR1 is a region formed by removing the gate electrode DG which corresponds to a region where the gate electrode DG was present till the removal of the gate electrode DG. The bottom (bottom surface) of the trench TR1 is defined by the upper surface of the insulation film GI and the side wall (side surface) of the trench TR1 is defined by the side surface of the side wall spacer SW (side surface that was in contact with the gate electrode DG till removal of the gate electrode DG).

In the etching step of the gate electrode DG at the step S28, etching is performed preferably under a condition that the insulation film IL5a, the insulation film IL4, the insulation film GI, and the side wall spacer SW are less etched compared with the gate electrode DG. That is, etching is performed preferably under a condition that the etching rate of the insulation film IL5a, the insulation film IL4, the insulation film GI, and the side wall spacer SW is lower than the etching rate of the gate electrode DG. Thus, the gate electrode DG can be etched selectively. Since the insulation film IL5a covers the entire memory cell region 1A and, accordingly, covers the memory gate electrode MG and the control gate electrode CG, the memory gate electrode MG and the control gate electrode CG are not etched at the step S28.

In this embodiment, after etching the insulation film IL5 at the step S27, the photoresist pattern PR2 is removed and then the gate electrode DG is removed by etching at the step S28. In other configuration, after etching the insulation film IL5 at the step S27, the gate electrode DG can also be removed by etching at the step S28 without removing the photoresist pattern PR2 and then the photoresist pattern PR2 can be removed. In a further configuration, it is also possible to save the steps S25 and S27, remove the gate electrode DG by etching at the step S28 using the photoresist pattern PR2 as an etching mask and then remove the photoresist pattern PR2. In this case, since the gate electrode DG is exposed not being covered by the photoresist pattern PR2, it is removed by etching. However, since the memory gate MG and the control gate CG are covered by the photoresist pattern PR2 and not exposed, they are not etched.

Figure 31:
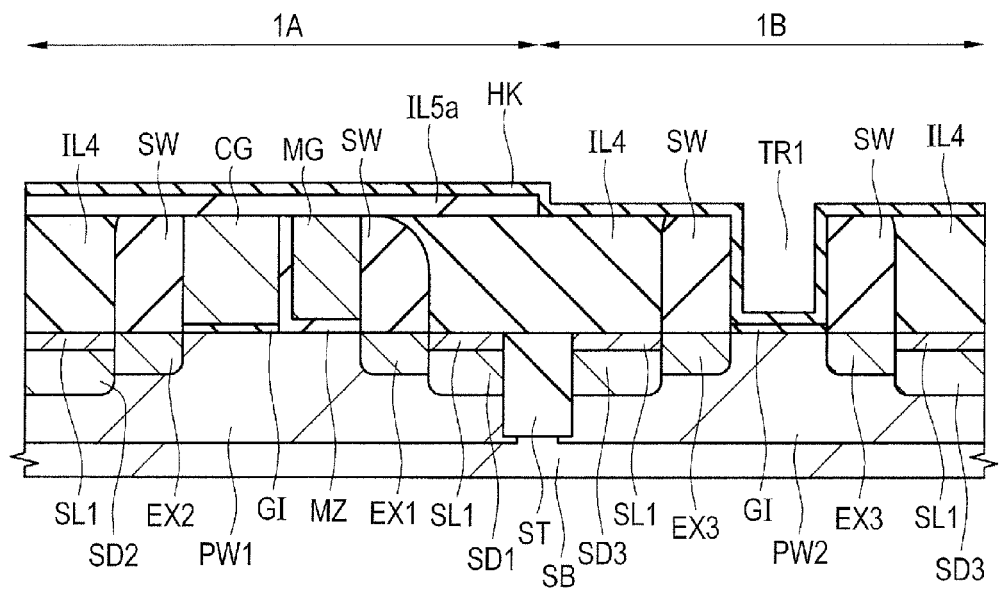
FIG. 31 is a main fragmentary cross sectional view of the semiconductor device during the manufacturing step thereof succeeding to that of FIG. 30.
Figure 32:
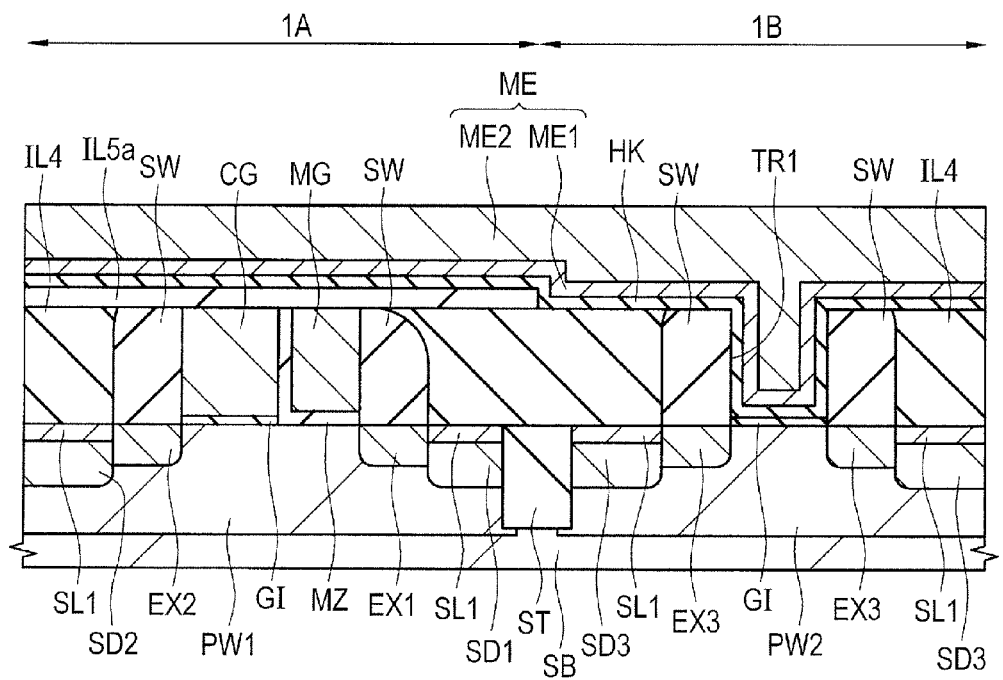
FIG. 32 is a main fragmentary cross sectional view of the semiconductor device during the manufacturing step thereof succeeding to that of FIG. 31.

Then, as illustrated FIG. 31, an insulation film HK is formed over the semiconductor substrate SB, that is, over the insulation film IL4 including the inside of the trench TR1 (bottom and side wall) (step S29 in FIG. 3). Then, as illustrated in FIG. 32, a metal film ME is formed as a conductive film over the semiconductor substrate SB, that is, over the insulation film HK so as to fill the inside of the trench TR1 (step S30 in FIG. 3).

In the trench TR1, while the insulation film HK is formed over the bottom portion (bottom) and side wall (side surface) of the trench TR1 at the step S29, the inside of the trench TR1 is not filled completely by the insulation film HK but the trench TR1 is completely filled by the insulation film HK and the metal film ME by forming the metal film ME at the step S30.

The insulation film HK is an insulation film used as a gate insulation film and the metal film ME is a conductive film used as a gate electrode. Specifically, the insulation film HK is an insulation film used as a gate insulation film of MISFET formed in the peripheral circuit region 1B and the metal film ME is a conductive film used for the gate electrode of MISFET to be formed in the peripheral circuit region 1B.

The insulation film HK is a film comprising an insulation material having a higher dielectric constant (specific dielectric constant) than that of silicon nitride, which is a so-called High-k film (high dielectric film). In this specification, when a High-k film, a high dielectric film, and a high dielectric gate insulation film are referred to, they mean a film having a higher dielectric constant (specific dielectric constant) than that of silicon nitride.

As the insulation film HK, a metal oxide film such as a hafnium oxide film, a zirconium oxide film, an aluminum oxide film, a tantalum oxide film, or a lanthanum oxide film can be used. Further, the metal oxide film may further contain one or both of nitrogen (N) and silicon (Si). The insulation film HK can be formed, for example, by an ALD (Atomic Layer Deposition) method or a CVD method. When a high dielectric film (insulation film HK in this embodiment) is used for the gate insulation film, since the physical thickness of the gate insulation film can be increased more compared with a case of using a silicon oxide film, an advantage capable of decreasing leak current can be obtained.

As the metal film ME, a material film such as a titanium nitride (TiN) film, a tantalum nitride (TaN) film, a tungsten nitride (WN) film, a titanium carbide (TiC) film, a tantalum carbide (TaC) film, a tungsten carbide (WC) film, a tantalum nitride carbide (TaCN) film, a titanium (Ti) film, a tantalum (Ta) film, a titanium aluminum (TiAl) film, or an aluminum (Al) film can be used. The metal film referred to herein means a conductive film exhibiting metal conductivity and includes not only elemental metal films (pure metal films) or alloy films but also metal compound films (metal nitride film, metal carbide film, etc.) that exhibit metal conductivity. Accordingly, the metal film ME is a conductive film exhibiting metal conductivity, which is not restricted only to elemental metal films (pure metal films) or alloy films but also may be metal compound films (metal nitride film, metal carbide film, etc.) that exhibit metal conductivity. Further, the metal film ME may also be a lamination film (lamination film comprising a plurality of laminated films) in which the lowermost layer of the lamination film is a metal film (conductive films exhibiting metal conductivity). Further, the lamination film may also be a lamination film comprising a plurality of metal films (conductive film exhibiting metal conductivity). The metal film ME can be formed, for example, by using sputtering.

FIG. 32 illustrates a case in which the metal film ME is a lamination film comprising a titanium aluminum (TiAl) film MEI and an aluminum (Al) film ME2 over the titanium aluminum film ME1 as a preferred example of the metal film ME. At a step S30, after forming at first a titanium aluminum film ME1 over the insulation film HK, an aluminum film ME2 is formed over the titanium aluminum film ME1 so as to fill the inside of the trench TR1. In this case, the thickness of the aluminum film ME2 is preferably larger than that of the titanium aluminum film ME1. Since the aluminum film ME2 has low resistance, the resistance of a gate electrode GE to be formed subsequently can be lowered. A threshold voltage of a MISFET having a gate electrode GE to be formed subsequently can be controlled by a work function of a material at a portion in contact with the gate insulation film in the gate electrode GE (titanium aluminum film ME1 in this case). Further, with a view point of improving adhesion, a titanium (Ti) film, a titanium nitride (TiN) film, or a lamination film of them may also be interposed between the titanium aluminum film ME1 and the aluminum film ME2. In this case, after forming the titanium aluminum film ME1, a titanium film, a titanium nitride film, or a lamination film of them is formed on the titanium aluminum film ME1, and then the aluminum film ME2 is formed thereon.

Figure 33:
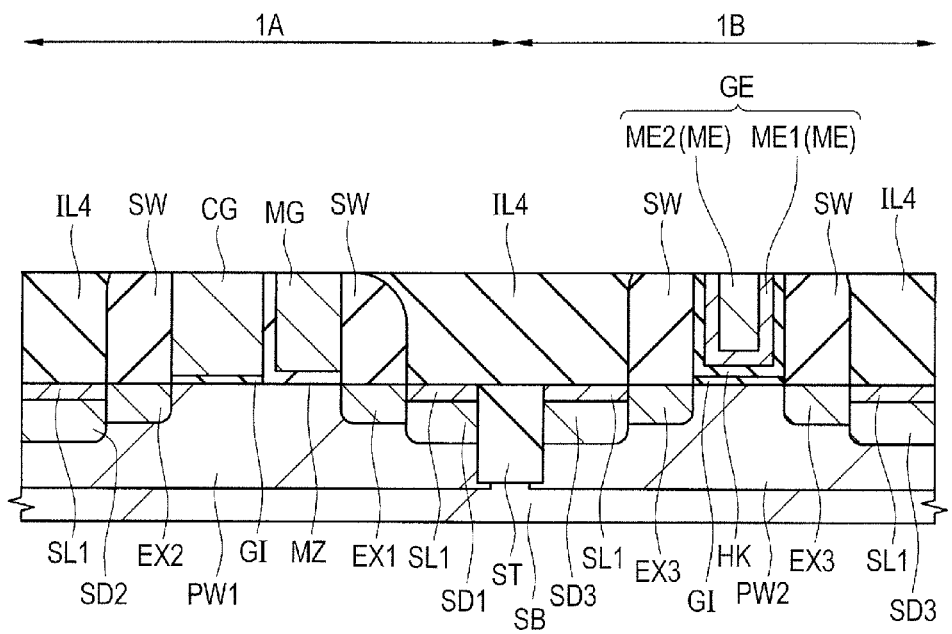
FIG. 33 is a main fragmentary cross sectional view of the semiconductor device during the manufacturing step thereof succeeding to that of FIG. 32.

Then, as illustrated in FIG. 33, the insulation film HK and the metal film ME are filled in the trench TR1 while removing unnecessary metal film ME and insulation film HK at the outside of the trench TR1 by CMP, etc. (step S31 in FIG. 4).

That is, at the step S31, the metal film ME and the insulation film HK at the outside of the trench TR1 are removed while leaving the insulation film HK and the metal film ME in the trench TR1. Thus, the insulation film HK and the metal film ME are left and filled in the trench TR1. Further, at the step S31, the metal film ME and the insulation film HK at the outside of the trench TR1 are preferably removed by polishing the metal film ME and the insulation film HK by a polishing treatment such as CMP.

The metal film ME filled in the trench TR1 forms a gate electrode GE of the MISFET and the insulation film HK filled in the trench TR1 functions as a gate insulation film of the MISFET.

In this embodiment, the gate electrode DG is removed and replaced with the gate electrode GE and the gate electrode GE is used as the gate electrode of the MISFET in the peripheral circuit region 1B. Accordingly, the gate electrode DG is a dummy gate electrode (pseudo gate electrode) and can be regarded as a replacement gate electrode or a substitution gate electrode, and the gate electrode GE can be regarded as a gate electrode constituting the MISFET.

Further, since the gate electrode GE is formed by using the metal film ME, the gate electrode GE can be formed as a metal gate electrode. Since the gate electrode GE is formed as the metal gate electrode, an advantage capable of suppressing the depletion phenomenon in the gate electrode GE and eliminating parasitic capacitance can be obtained. Further, this also provides an advantage capable of reducing the size of the MISFET device (reduction in the thickness of gate insulation film).

The insulation film HK is formed over the bottom (bottom face) and on the side wall of the trench TR1, and the gate electrode GE is in adjacent at the bottom (bottom face) and the side wall (side surface) with the insulation film HK. The insulation film GI and the insulation film HK are interposed between the gate electrode GE and the semiconductor substrate SB (p-type well PW2) and the insulation film HK is interposed between the gate electrode GE and the side wall spacer SW. The insulation films GI and the HK just below the gate electrode GE function as the gate insulation film of the MISFET and, since the insulation film HK is a high dielectric film, the insulation film functions as a high dielectric gate insulation film.

Further, when the insulation film IL5a has been formed, the insulation film IL5a can be also removed by polishing by CMP, etc. at a step S31. Accordingly, when the step S31 is performed, since the metal film ME and the insulation film HK are removed from the portion over the memory gate electrode MG and the control gate electrode CG and, further, the insulation film IL5a is also removed, the upper surface of the memory gate electrode MG and the upper surface of the control gate electrode CG are exposed.

Accordingly, when the step S31 is performed, the gate electrode GE is filled in the trench TR1 and the upper surface of the gate electrode GE is exposed in the peripheral circuit region 1B. The upper surface of the memory gate electrode MG and the upper surface of the control gate electrode CG are exposed in the memory cell region 1A.

Further, in this embodiment, description has been made to a case of etching the gate electrode DG at the step S28 and then forming the insulation film HK at the step S29 without removing the insulation film GI at the bottom of the trench TR1. In this case, the insulation film GI is interposed as an interface layer between the insulation film HK and the semiconductor substrate SB (p-type well PW2) (interface) in the peripheral circuit region 1B. For the insulation film GI as the interface layer, a silicon oxide film or a silicon oxynitride film is preferred.

In other configuration, it is also possible to etch the gate electrode DG at the step S28 and then remove the insulation film GI at the bottom of the trench TR1 before forming the insulation film HK at the step S29. In this case, it is more preferred to remove the insulation film GI at the bottom of the trench TR1, then form an interface layer comprising a silicon oxide film or a silicon oxynitride film at the surface of the semiconductor substrate SB (p-type well PW2) exposed at the bottom of the trench TR1, and then form the insulation film HK at the step S29. Thus, an interface layer comprising the silicon oxide film or the silicon oxynitride film is interposed between the insulation film HK and the semiconductor substrate SB (p-type well PW2) (interface) in the peripheral circuit region 1B.

When the insulation film HK as the high dielectric film is not formed directly on the surface of the semiconductor substrate SB (silicon surface) in the peripheral circuit region 1B but an interface layer comprising a thin silicon oxide or silicon oxynitride film is provided at the interface between the insulation film HK and the semiconductor substrate SB (p-type well PW2) in the peripheral circuit region 1B, the following advantage can be obtained. That is, the driving performance or the reliability of the MISFET formed in the peripheral circuit region 1B can be improved by providing an $SiO_2/Si$ (or SiON/Si) structure at the interface between the gate insulation film thereby the semiconductor substrate (silicon surface thereof) thereby decreasing the number of defects such as trap levels.

Figure 4:
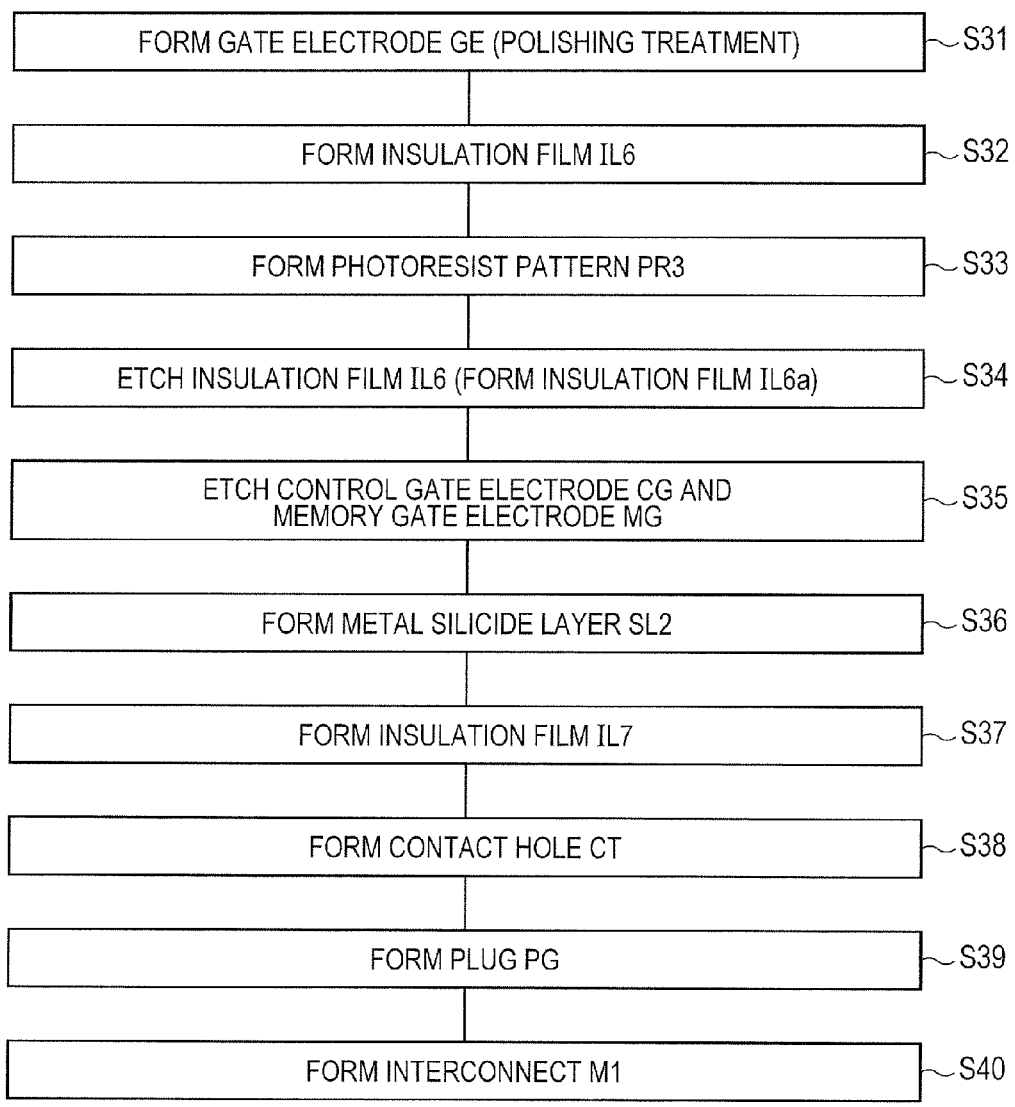
FIG. 4 is a process flow chart illustrating a portion of the manufacturing step of the semiconductor device as the preferred embodiment.
Figure 34:
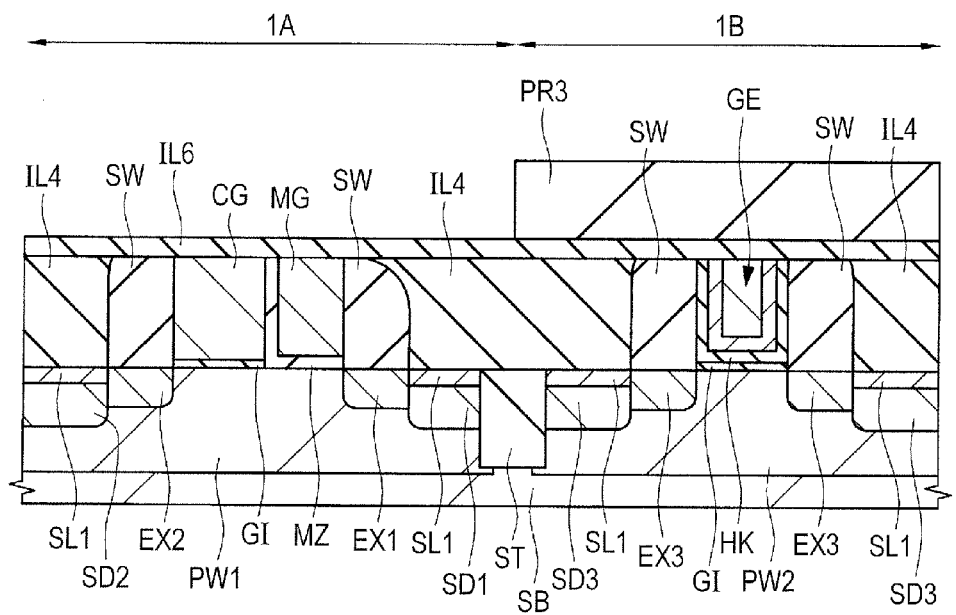
FIG. 34 is a main fragmentary cross sectional view of the semiconductor device during the manufacturing step thereof succeeding to that of FIG. 33.

Then, as illustrated in FIG. 34, an insulation film IL6 is formed over the semiconductor substrate SB (step S32 in FIG. 4).

The insulation film IL6 comprises, for example, a silicon oxide film and can be formed by CVD, etc. Since the insulation film IL6 is formed over the entire main surface of the semiconductor substrate SB, it is formed over the insulation film IL4 so as to cover the control gate electrode CG, the memory gate electrode MG, and the gate electrode GE.

Then, a photoresist pattern PR3 is formed as a resist pattern over the semiconductor substrate SB, that is, over the insulation film IL6 by photolithography (step S33 in FIG. 4).

The photoresist pattern PR3 has such a pattern (planar shape) that covers the entire peripheral circuit region 1B and exposes the memory gate electrode MG and the control gate electrode CG in the memory cell region 1A in a plan view.

Then, the insulation film IL6 is etched by using the photoresist pattern PR3 as an etching mask (step S34 in FIG. 4).

Figure 35:
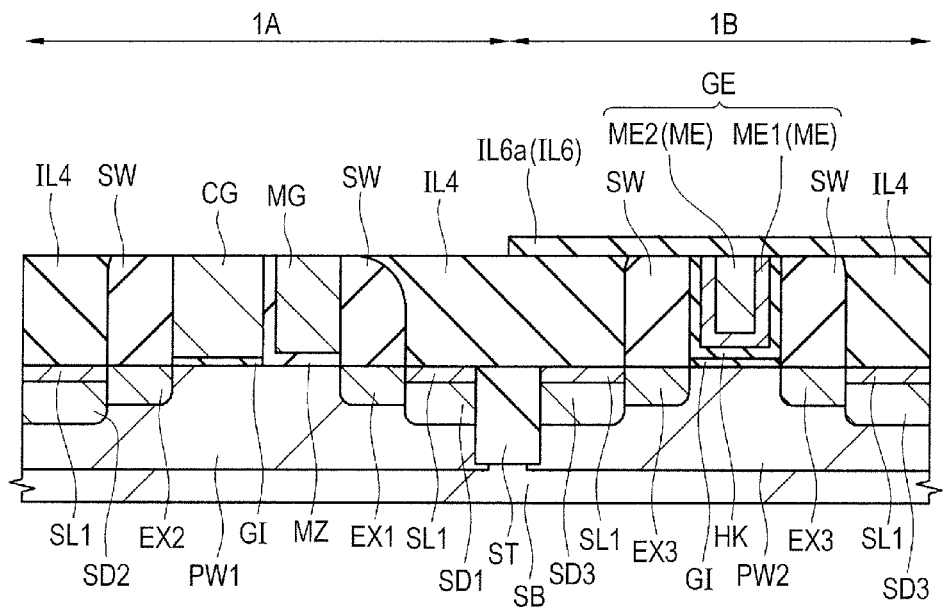
FIG. 35 is a main fragmentary cross sectional view of the semiconductor device during the manufacturing step thereof succeeding to that of FIG. 34.

By the etching step at a step S34, a portion of the insulation film IL6 not covered by the photoresist pattern PR3 is removed by etching, while a portion of the insulation film IL6 covered by the photoresist pattern PR3 remains unetched. Thus, the insulation film IL6 is patterned in the pattern identical with the photoresist pattern PR3. The insulation film IL6 after etching at the step S34 carries a reference sign IL6a and is referred to as an insulation film IL6a. The insulation film IL6a has the pattern identical with the photoresist pattern PR3. That is, the insulation film IL6a has such a pattern (planar shape) that covers the entire peripheral circuit region 1B and exposes the memory gate electrode MG and the control gate electrode CG in the memory cell region 1A. Accordingly, when the etching step is performed at the step S34, the upper surface of the memory gate electrode MG and the upper surface of the control gate electrode CG are exposed without being covered by the insulation film IL6a, and the gate electrode GE is not exposed being covered by the insulation film IL6a. For the etching at the step S34, dry etching or wet etching can be used, with the wet etching being used more preferably. After the etching step at the step S34, the photoresist pattern PR3 is removed. This is illustrated in FIG. 35.

At the stage where the step S31 is completed, the upper surface of the gate electrode GE filled in the trench TR1 is exposed. When the insulation film IL6 is formed at the step S32, since the gate electrode GE is covered by the insulation film IL6, it is no more exposed and the state is maintained also in the stage after completing the etching at the step S34. On the other hand, when step S31 is performed, while the upper surface of the memory gate electrode MG and the upper surface of the control gate electrode CG are exposed. When the insulation film IL6 is formed at the step S32, since the gate electrode GE is covered by the insulation film IL6, it is no more exposed. In the etching step at the step S34, when the insulation film IL6 is patterned, the memory gate electrode MG and the control gate electrode CG are in an exposed state without being covered by the insulation film IL6a. That is, in a state where the etching step is performed at the step S34, the gate electrode GE is not exposed being covered by the insulation film IL6a, while the upper surface of the memory gate electrode MG and the upper surface of the control gate electrode CG are in an exposed state without being covered by the insulation film IL6a.

Figure 36:
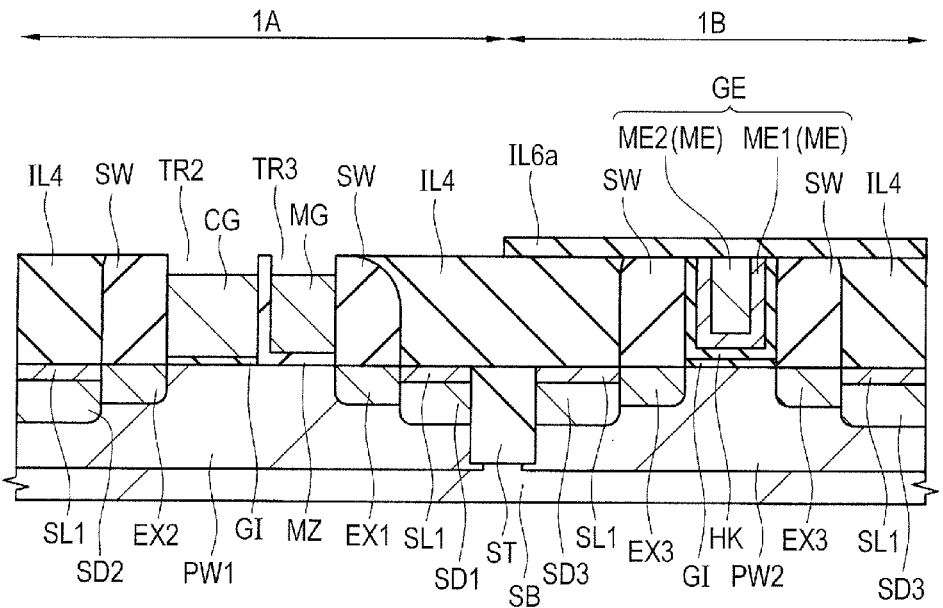
FIG. 36 is a main fragmentary cross sectional view of the semiconductor device during the manufacturing step thereof succeeding to that of FIG. 35.

Then, as illustrated in FIG. 36, each of the upper layer portions of the memory gate electrode MG and the control gate electrode CG is removed by etching (step S35 in FIG. 4).

Since the etching step at the step S35 is performed in a state where the memory gate electrode MG and the control gate electrode CG are exposed without being covered by the insulation film IL6a, the memory gate electrode MG and the control gate electrode CG can be etched.

However, in the etching step at the step S35, the memory gate electrode MG is not removed entirely but an upper portion (upper layer portion) of the memory gate electrode MG is removed partially. Further, in the etching step at the step S35, the control gate electrode CG is not removed entirely but an upper portion (upper layer portion) of the memory gate electrode MG is removed partially. This can be attained by controlling an etching time, etc. so as to adjust an etching amount to such an extent that only a portion of the height for each of the memory gate electrode MG and the control gate electrode CG is etched. By performing the step S35, the height of the control gate electrode CG and the memory gate electrode MG can be lowered.

In the etching step at the step S35, etching is performed preferably under a conditions that the insulation film IL6a, the insulation film IL4, the side wall spacer SW, and the insulation film MZ are less etched compared with the memory gate electrode MG and the control gate electrode CG. That is, etching is performed preferably under a condition that the etching rate of the insulation film IL6a, the insulation film IL4, the side wall spacer SW, and the insulation film MZ is lowered compared with the etching rate of the memory gate electrode MG and the control gate electrode CG. Thus, the memory gate electrode MG and the control gate electrode CG can be etched selectively. For the etching step at the step S35, wet etching is preferred. Since the insulation film IL6a covers the entire peripheral circuit region 1B, the insulation film IL6 covers the gate electrode GE and the gate electrode GE is not etched.

Since the upper portion of the control gate electrode CG is removed in the etching step at the step S35, a trench (recess or indent) TR2 is formed and since the upper portion of the memory gate MG is removed, a trench (recess or indent) TR3 is formed.

The trench TR2 is a region formed by removing a portion (upper portion) of the control gate electrode CG, which corresponds to a region where the control gate electrode CG was present till removal of the upper portion of the control gate electrode CG. The trench TR3 is a region formed by removing a portion (upper portion) of the memory gate electrode MG, which corresponds to a region where the memory gate electrode MG was present till removal of the upper portion of the memory gate electrode MG.

The bottom (bottom face) of the trench TR2 is defined by the upper surface of the control gate electrode CG, and the side wall (side surface) of the trench TR2 is defined by the side surface of the side wall spacer SW (side surface in contact with the control gate electrode CG before removal of the control gate electrode CG) and the insulation film MZ. Further, the bottom (bottom face) of the TR3 is defined by the upper surface of the memory gate electrode MG and the side wall (side surface) of the trench TR3 is defined by the side surface of the side wall spacer SW (side surface in contact with the memory gate electrode MG before removal of the memory gate electrode MG) and the insulation film MZ.

The insulation film MZ extends for both regions, that is, a region between the memory gate electrode MG and the semiconductor substrate (p-type well PW1) and a region between the memory gate electrode MG and the control gate electrode CG. In this state, etching step at the step S35 is performed to remove each of the upper layer portions of the memory gate electrode MG and the control gate electrode CG. Accordingly, when the etching step is performed at the step S35, an upper portion of the insulation film MZ extending between the memory gate electrode MG and the control gate electrode CG protrudes (projects) from the upper surface of the memory gate electrode MG and the upper surface of the control gate electrode CG. That is, the upper portion of the insulation film MZ extending between the memory gate electrode MG and the control gate electrode CG protrudes upward (in the direction away from the main surface of the semiconductor substrate SB) from the upper surface of the memory gate electrode MG and the upper surface of the control gate electrode CG. That is, the position of the height of the top (uppermost portion) of the insulation film MZ extending between the memory gate electrode MG and the control gate electrode CG is higher than the upper surface of the memory gate MG and higher than the upper surface of the control gate electrode CG. The height, when referred to, means a height in the direction substantially perpendicular to the main surface of the semiconductor substrate SB.

In this embodiment, it has been described to a case in which after patterning the insulation film IL6 by etching into an insulation film IL6a by using the photoresist pattern PR3 as an etching mask at the step S34, the photoresist pattern PR3 is removed and then the memory gate electrode MG and the control gate electrode CG are etched to form the trenches TR2 and TR3 at the step S35.

In other configuration, after forming the insulation film IL6a by patterning the insulation film IL6 by etching using the photoresist pattern PR3 as an etching mask at the step S34, the memory gate electrode MG and the control gate electrode CG can be etched to form the trenches TR2 and TR3 at the step S35 without removing the photoresist pattern PR3, and then the photoresist pattern PR3 can be removed. However, it is more preferred to form the trenches TR2 and TR3 by etching the memory gate electrode MG and the control gate CG at the step S35 using the insulation film IL6a as an etching mask after removing the photoresist pattern PR3 as in this embodiment since wet etching can be used easily for the etching at the step S35 and the step S35 can be easily performed effectively.

Further, wet etching is preferred for the etching at the step S35, so that the insulation film MZ between the memory gate electrode MG and the control gate electrode CG suffers from less damage as much as possible by etching at the step S35. If the insulation film MZ between the memory gate electrode MG and the control gate electrode CG is damaged, a leak current may possibly be generated between the memory gate electrode MG and the control gate electrode CG. On the contrary, in this embodiment, damages caused to the insulation film MZ between the memory gate electrode MG and the control gate electrode CG can be suppressed or prevented by using wet etching for the etching at the step S35. Accordingly, reliability of the non-volatile memory can be improved. Further, the performance of the semiconductor device having the non-volatile memory can be improved.

Then, a metal silicide layer SL2 is formed over the memory gate electrode MG and the control gate electrode CG (step S36 in FIG. 4). The metal silicide layer SL2 is formed as described below.

Figure 37:
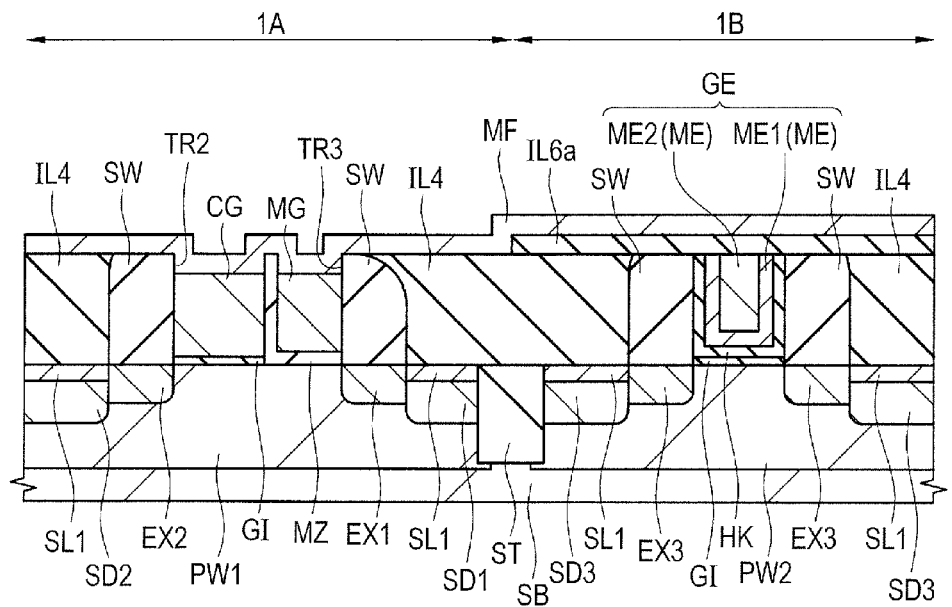
FIG. 37 is a main fragmentary cross sectional view of the semiconductor device during the manufacturing step thereof succeeding to that of FIG. 36.

At first, as illustrated in FIG. 37, a metal film MF is formed (deposited) over the semiconductor substrate SB, that is, over the insulation films IL4 and IL6a including the inside of the trenches TR2 and TR3 (on the bottom and the side wall). The metal film MF can be an elemental metal film (pure metal film) or an alloy film and preferably includes a cobalt (Co) film, a nickel (Ni) film, or a nickel-platinum alloy film (platinum-added nickel film), with the nickel (Ni) film being particularly preferred. The metal film MF can be formed by using sputtering or the like.

Since the metal film MF is formed over the entire main surface of the semiconductor substrate SB, the metal film MF is formed also over the upper surface (surface) of the memory gate electrode MG and the control gate electrode CG. Accordingly, when the metal film MF is formed, the upper surface (surface) of the memory gate electrode MG and the upper surface (surface) of the control gate electrode CG are in contact with the metal film MF. On the other hand, in the peripheral circuit region 1B, since the metal film MF is formed over the insulation film IL6a, when the metal film MF is formed, the gate electrode GE is not in contact with the metal film MF and an insulation film IL6a is interposed between the gate electrode GE and the metal film MF.

Figure 38:
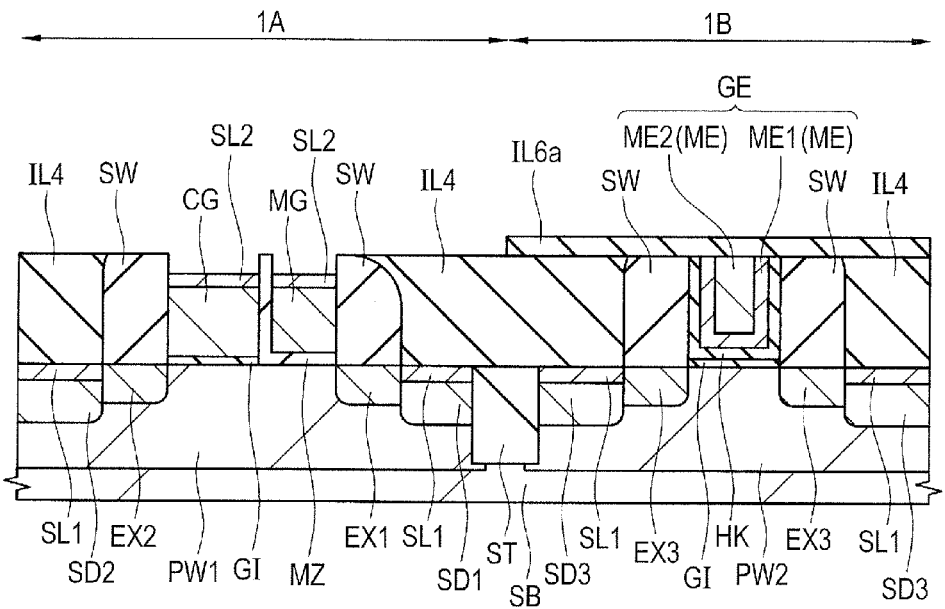
FIG. 38 is a main fragmentary cross sectional view of the semiconductor device during the manufacturing step thereof succeeding to that of FIG. 37.

Then, by applying a heat treatment to the semiconductor substrate SB, each of the upper layer portions (surface layer portion) of the memory gate electrode MG and the control gate electrode CG is reacted with the memory film MF. Thus, as illustrated in FIG. 38, a metal silicide layer SL2 is formed over each of the upper portions (upper surface, surface, upper layer portion) of the memory gate electrode MG and the control gate electrode CG respectively. Preferably, the metal silicide layer SL2 can be a cobalt silicide layer (when the metal film MF is a cobalt film), a nickel silicide layer (when the metal film MF is a nickel film) or a platinum-added nickel silicide layer (when metal film MF is a nickel-platinum alloy film). Then, an unreacted metal film MF is removed by wet etching or the like. FIG. 38 is a cross sectional view in this stage. Further, after removing the unreacted metal film MF, a heat treatment can also be applied further. Further, the metal silicide layer SL2 is not formed over the gate electrode GE.

As described above, the metal silicide layer SL2 is formed over upper portion of the memory gate electrode MG and the control gate electrode CG by a so-called silicide process, by which the resistance of the memory gate electrode MG and the control gate electrode CG can be decreased. By using the salicide process, the metal silicide layer SL2 can be formed in self-alignment over the memory gate electrode MG and the control gate electrode CG respectively. Further, the metal silicide layer SL2 can be formed substantially over the entire upper surface of each of the memory gate electrode MG and the control gate electrode CG.

Since the metal film MF is formed in a state where the upper surface of the memory gate electrode MG and the control gate electrode CG is exposed, the upper surface of the memory gate electrode MG and that of the control gate electrode CG are in contact with the metal film MF and a heat treatment is applied in this state, the upper layer portion (surface layer portion) of each of the memory gate electrode MG and the control gate electrode CG and the metal film MF can be reacted to form the metal silicide layer SL2. Accordingly, the metal silicide layer SL2 is formed over the memory gate electrode MG and over the control gate electrode CG respectively. The metal silicide layer SL2 over the memory gate electrode MG and the metal silicide layer SL2 over the control gate electrode CG are separated and not connected. Since the metal insulation film MZ is interposed between the memory gate electrode MG and the control gate electrode CG and the metal silicide layer SL2 is not formed over the insulation film MZ, the metal silicide layer SL2 over the memory gate electrode MG and the metal silicide layer SL2 over the control gate electrode CG are separated.

Further, since the gate electrode GE is covered by the insulation film IL6a, when the metal film MF is formed, the gate electrode GE is not in contact with the metal film MF and the insulation film IL6a is interposed between the gate electrode GE and the metal film MF. Accordingly, even when a heat treatment is applied after forming the metal film MF, the gate electrode GE and the metal film MF are not reacted, so that denaturation of the gate electrode GE caused by reaction with the metal film MF can be prevented. The metal silicide layer SL2 is not formed over the gate electrode GE. However, since the gate electrode GE is a metal gate electrode, it is not necessary to form the metal silicide layer SL2 over the gate electrode GE for decreasing the resistance.

In this embodiment, after removing the upper layer portion of each of the memory gate electrode MG and the control gate CG in the etching step at the step S35, the metal silicide layer SL2 is formed over the memory gate electrode MG and the control gate electrode CG at the step S36.

In other configuration, it is also possible to save the etching step at the step S35 and form the metal silicide layer SL2 over the memory gate electrode MG and the control gate electrode CG at the step S36. Also in this case, since the metal film MF is formed in a state where the upper surface of the memory gate electrode MG and the upper surface of the control gate electrode CG are exposed, the upper surface of the memory gate electrode MG and the upper surface of the control gate electrode CG are in contact with the metal film MF, and the heat treatment is applied in this state, the upper layer portion (surface layer portion) of each of the memory gate electrode MG and the control gate electrode CG and the metal film MF can be reacted to form the metal silicide layer SL2. Thus, the metal silicide layer SL2 is formed over the memory gate electrode MG and over the control gate electrode CG respectively.

However, with a view point of preventing contact between the metal silicide layer SL2 over the memory gate electrode MG and metal silicide layer SL2 over the control gate electrode CG as much as possible, it is more preferred not to save the step S35 but perform the etching step at the step S35 and then form the metal silicide layer SL2 at the step S36.

Thus, it is possible to obtain a structure in which the upper portion of the insulation film MZ extending between the memory gate electrode MG and the control gate electrode CG protrudes (projects) from the metal silicide layer SL2 over the memory gate electrode MG and the metal silicide layer SL2 over the control gate electrode CG. That is, it is possible to obtain a structure in which the upper portion of the insulation film MZ extending between the memory gate electrode MG and the control gate electrode CG protrudes upward (in the direction away from the main surface of the semiconductor substrate SB) from the upper surface of the metal silicide layer SL2 over the memory gate electrode MG and from the upper surface of the metal silicide layer SL2 over the control gate electrode CG. That is, it is possible to obtain a structure in which the position of the height at the top (uppermost portion) of the insulation film MZ that extends between the memory gate electrode MG and the control gate electrode CG is higher than the upper surface of the metal silicide layer SL2 over the memory gate electrode MG and higher than the upper surface of the metal silicide layer SL2 over the control gate electrode CG. Thus, short circuit caused by contact or connection between the metal silicide layer SL2 over the memory gate electrode MG and the metal silicide layer SL2 over the control gate electrode CG can be prevented more effectively. The height, when referred to, means a height in the direction substantially perpendicular to the main surface of the semiconductor substrate SB.

Figure 39:
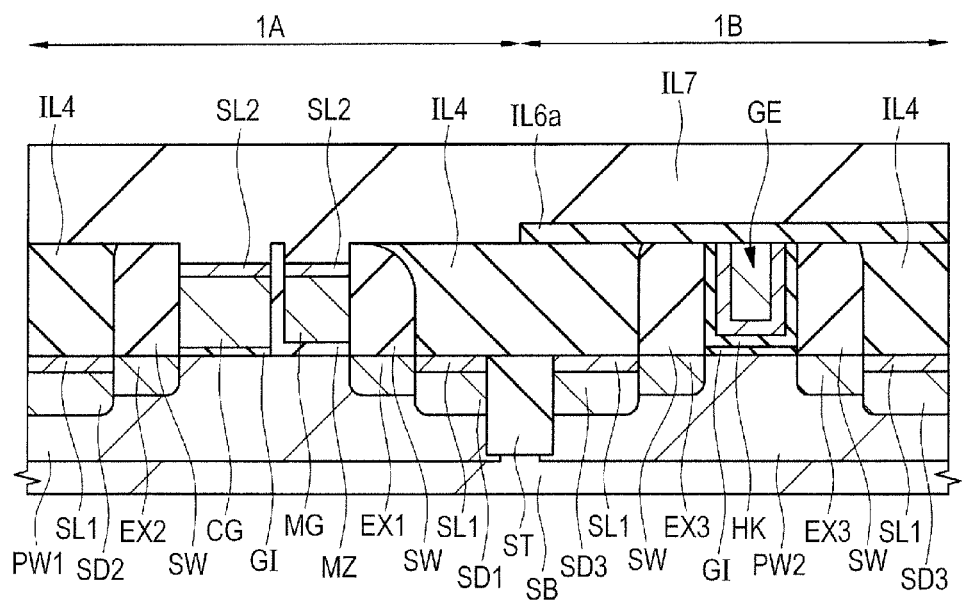
FIG. 39 is a main fragmentary cross sectional view of the semiconductor device during the manufacturing step thereof succeeding to that of FIG. 38.

Then, as illustrated in FIG. 39, an insulation film (interlayer insulation film) IL7 is formed over the entire main surface of the semiconductor substrate SB (step S37 in FIG. 4).

The insulation film IL7 is formed over the insulation film IL6 in a region wherein the insulation film IL6a is formed (for example, in the peripheral circuit region 1B), and is formed mainly over the insulation film IL4 in a region where the insulation film IL6a is not formed. Further, the insulation film IL7 is formed so as to cover the metal silicide layer SL2 over the memory gate electrode MG and the metal silicide layer SL2 over the control gate electrode CG. For the insulation film IL7, a silicon oxide type insulation film, for example, mainly comprising silicon oxide can be used.

After forming the insulation film IL7, the upper surface of the insulation film IL7 can be planarized further, for example, by polishing the upper surface of the insulation film IL7 by CMP.

Further, in this embodiment, the insulation film IL7 is formed without removing the insulation film IL6a. Thus, the number of manufacturing steps of the semiconductor device can be decreased. In other configuration, after forming the metal silicide layer SL2 at the step S36, the insulation film IL7 can also be formed at the step S37 after removing the insulation film IL6a.

Figure 40:
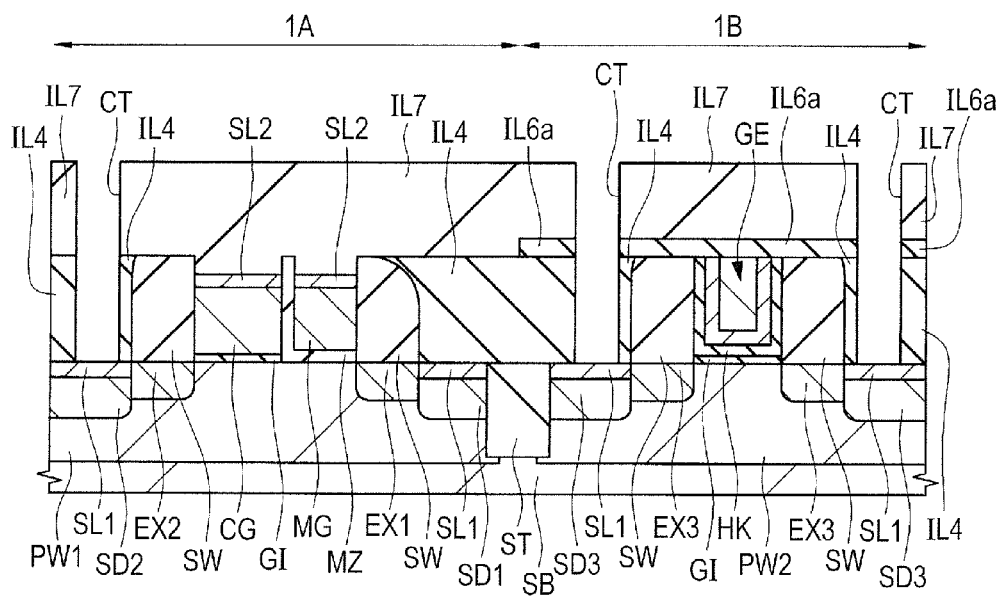
FIG. 40 is a main fragmentary cross sectional view of the semiconductor device during the manufacturing step thereof succeeding to that of FIG. 39.

Then, the insulation films IL7, Il6a, and IL4 are dry etched by photolithography using a photoresist pattern (not illustrated) formed over the insulation film IL7 as an etching mask thereby forming contact holes CT (apertures or through holes) in the insulation films IL7, IL6a, and IL4 as illustrated in FIG. 40 (step S38 in FIG. 4).

In the region where the insulation film IL6a is formed (for example, in the peripheral circuit region 1B), contact holes CT are formed so as to penetrate a lamination film of the insulation film IL7, the insulation film IL6a, and the insulation film IL4. In the region where the insulation film IL6a is not formed, contact holes CT are formed so as to penetrate a lamination film of the insulation film IL7 and the insulation film IL4. Further, for the contact hole CT formed over the memory gate electrode MG or over the control gate electrode CG, the contact hole CT is formed so as to penetrate the insulation film IL7. Further, for the contact hole CT formed over the gate electrode GE, a contact hole CT is formed so as to penetrate the lamination film of the insulation film IL7 and the insulation film IL6a.

Figure 41:
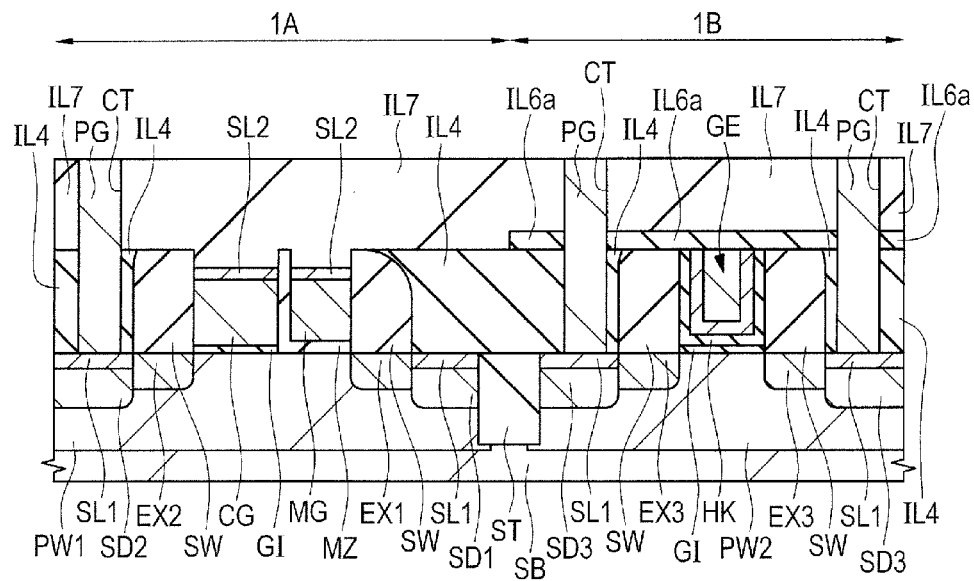
FIG. 41 is a main fragmentary cross sectional view of the semiconductor device during the manufacturing step thereof succeeding to that of FIG. 40.

Then, as illustrated in FIG. 41, a conductive plug PG comprising tungsten (W), etc. is formed in the contact hole CT as a conductor portion for connection (step S39 in FIG. 4).

For forming the plug PG, a barrier conductor film (for example, a titanium film, titanium nitride film, or a lamination film thereof) is formed over the insulation film IL7 including the inside (the bottom and the side wall) of the contact hole CT. Then, after forming a main conductor film comprising a tungsten film, etc. over the barrier conductor film so as to fill the contact hole CT, a plug PG can be fanned by removing unnecessary main conductor film and barrier conductor film at the outside of the contact hole CT are removed by CMP, etching back, or the like. For the sake of simplification of the drawing, the barrier conductor film and the main conductor film (tungsten film) constituting the plug PG are shown integrally.

Contact holes CT and plugs PG filled therein are formed, for example, over the $n^+$-type semiconductor regions SD1, SD2, and SD3, the control gate electrode CG, the memory gate electrode MG, the gate electrode GE, etc. At the bottom of the contact hole CT, a portion of the main surface of the semiconductor substrate SB, for example, the $n^+$-type semiconductor regions SD1, SD2, and SD3 (metal silicide layer SL1 on the surface thereof), a portion of the control gate electrode CG (metal silicide layer SL2 on the surface thereof), a portion of the memory gate electrode MG (metal silicide layer SL2 on the surface thereof), or a portion of the gate electrode GE, etc. is exposed. The cross sectional view of FIG. 41 illustrates a cross section in which a portion of the $n^+$-type semiconductor regions SD2 and SD3 (metal silicide layer SL1 over the surface thereof) is exposed at the bottom of the contact hole CT and electrically connected with the plug PG that fills the contact hole CT.

Then, an interconnect (interconnect layer) M1 as an interconnect at the first layer is formed over the insulation film IL7 in which the plug PG is filled (step S40 in FIG. 4). Description is to be made to a case of forming the interconnect M1 by using a damascene technique (single damascene technique in this embodiment).

Figure 42:
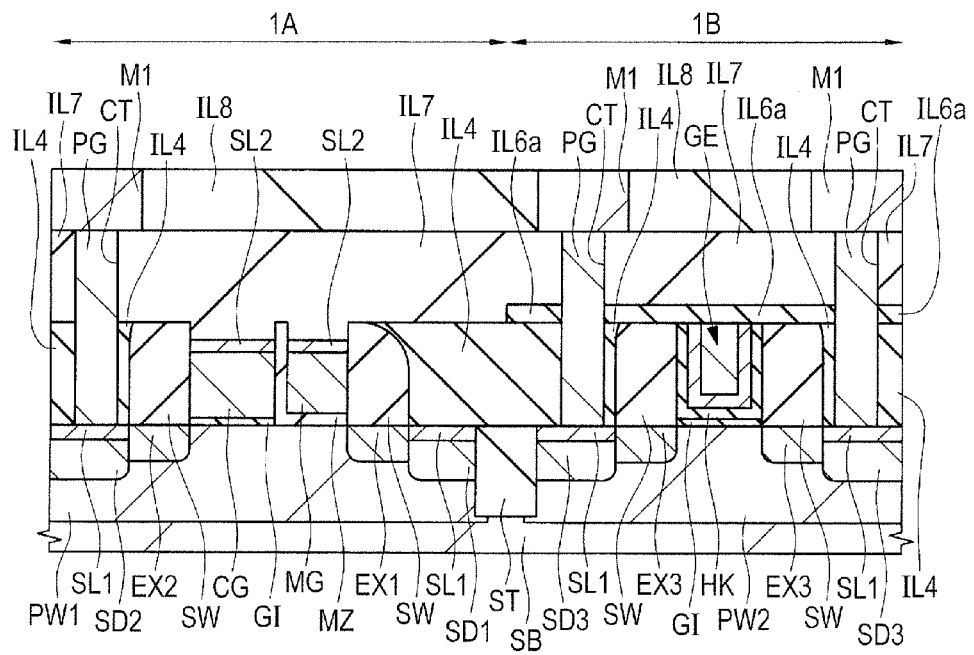
FIG. 42 is a main fragmentary cross sectional view of the semiconductor device during the manufacturing step thereof succeeding to that of FIG. 41.

At first, as illustrated in FIG. 42, an insulation film IL8 is formed over the insulation film IL7 in which the plug PG is buried. The insulation film IL8 can be formed of a lamination film comprising a plurality of insulation films. Then, after forming an interconnect trench (trench used for interconnect) in a predetermined region of the insulation film IL8 by using a photoresist pattern as an etching mask (not illustrated), a barrier conductor film (for example, a titanium nitride film, a tantalum film, a tantalum nitride film, etc.) is formed over the insulation film IL8 including the portion over the bottom and the side wall of the interconnect trench. Then, a copper seed layer is formed over the barrier conductor film by CVD or sputtering, and a copper plating film is formed on the seed layer by using electroplating to fill the inside of the interconnect trench with the copper plating film. Then, the main conductor film (copper plating film and the seed layer) and the barrier conductor film in the regions other than the interconnect trench are removed by CMP to form the interconnect M1 at the first layer comprising copper filled in the trench groove as a main conductor material. For the sake of simplifying the drawing, the interconnect M is illustrated as an integrated lamination layer of the barrier conductor film, the seed layer, and the copper plating film in FIG. 42.

The interconnect M1 is electrically connected by way of the plug PG to the source region ($n^+$-type semiconductor region SD1) of the memory transistor, the drain region ($n^+$-type semiconductor region SD2) of the control transistor, the source-drain region ($n^+$-type semiconductor region SD3) of the MISFET in the peripheral circuit region 1B, the control gate electrode CG, the memory gate electrode MG, the gate electrode GE, etc. Then, interconnects at and after the second layer are formed by a dual damascene method, etc., but they are not illustrated and described herein. Further, the interconnect M1 and interconnects in upper layers can be formed not only by the damascene interconnect but also by patterning a conductor film used for the interconnect, for example, as a tungsten interconnect or an aluminum interconnect.

The semiconductor device of this embodiment is manufactured as described above.

<Structure of Semiconductor Device>

Then, the structure of the memory cell of the non-volatile memory in the semiconductor device of this embodiment is to be described with reference to FIG. 43 and FIG. 44.

Figure 43:
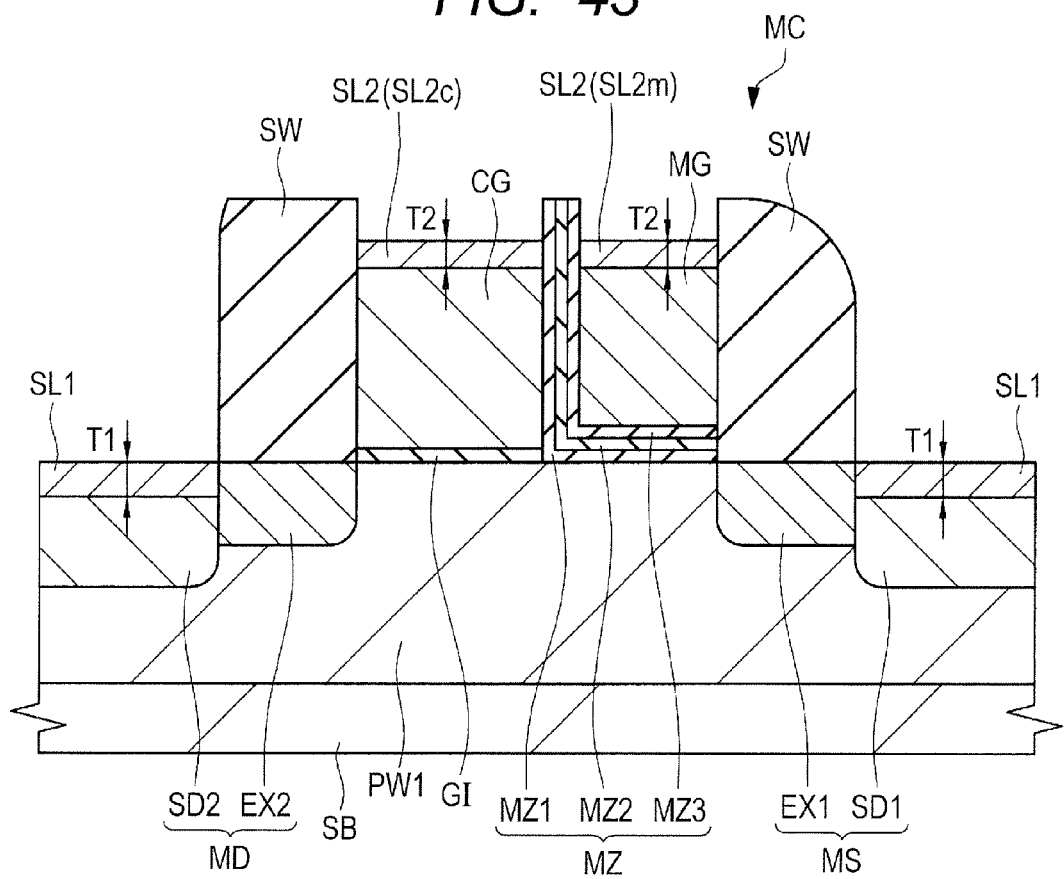
FIG. 43 is a main fragmentary cross sectional view of the semiconductor device as the preferred embodiment.

FIG. 43 is a fragmentary cross sectional view for a main portion of the semiconductor device of this embodiment, which illustrates a fragmentary cross sectional view for a main portion of a memory cell region of a non-volatile memory. FIG. 44 is an equivalent circuit diagram of the memory cell. In FIG. 43, for simplifying the drawing, the insulation film IL4, the insulation film IL6a, the insulation film IL7, the contact hole CT, the plug PG, and the interconnect M1 in the structure shown in FIG. 42 are not illustrated in the drawing.

As illustrated in FIG. 43, a memory cell MC of a non-volatile memory comprising a memory transistor and a control transistor is formed over a semiconductor substrate SB. In an actual semiconductor substrate SB, a plurality of memory cells MC are formed in an array and each of the memory cell regions is electrically isolated from other regions by a device isolation region (corresponding to the device isolation region ST, but not illustrated in FIG. 43).

Figure 44:
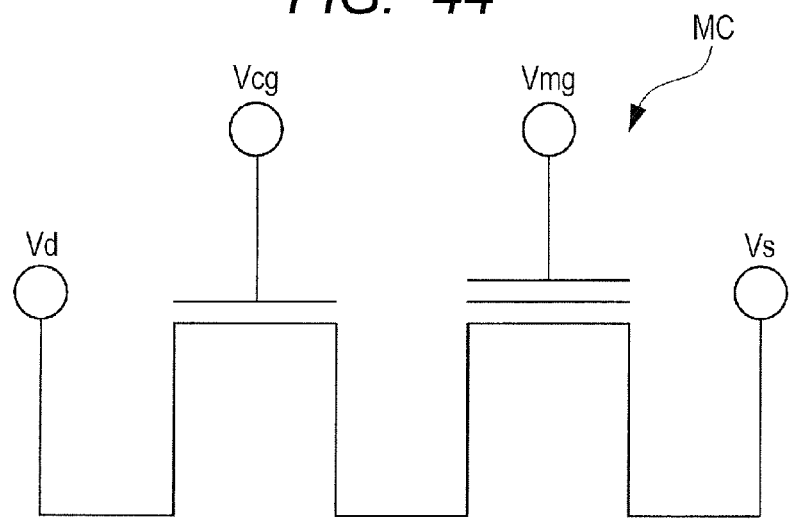
FIG. 44 is an equivalent circuit diagram of a memory cell.

As illustrated in FIG. 43 and FIG. 44, the memory cell MC of the non-volatile memory in the semiconductor device of this embodiment is a split gate type memory cell in which two MISFETs, that is, a control transistor having a control gate electrode CG and a memory transistor having a memory gate electrode MG are connected.

MISFET having a gate insulation film including a charge accumulation portion (charge accumulation layer) and the memory gate electrode MG is referred to as a memory transistor, and MISFET having a gate insulation film and the control gate electrode CG is referred to as a control transistor.

Accordingly, the memory gate electrode MG is a gate electrode of the memory transistor and the control gate electrode CG is a gate electrode of the control transistor, and the control gate electrode CG and the memory gate electrode MG are gate electrodes forming the memory cell of the non-volatile memory.

Since the control transistor is a transistor for selecting memory cells, it can be regarded as a selection transistor. Accordingly, the control gate electrode CG can also be regarded as a selection gate electrode. The memory cell transistor is a transistor for storage.

The configuration of the memory cell MC is to be described specifically.

As illustrated in FIG. 43, the memory cell MC of the non-volatile memory has n-type semiconductor regions MS and MD for source and drain formed in a p-type well PW1 of the semiconductor substrate SB, the control gate electrode CG formed over the semiconductor substrate SB (p-type well PW1) and the memory gate electrode MG formed over the semiconductor substrate SB (p-type well PW1) and adjacent to the control gate electrode CG. Then, the memory cell MC of the non-volatile memory further has an insulation film (gate insulation film) GI formed between the control gate electrode CG and the semiconductor substrate SB (p-type well PW1), and an insulation film MZ formed between the memory gate electrode MG and the semiconductor substrate SB (p-type well PW1).

The control gate electrode CG and the memory gate electrode MG extend along the main surface of the semiconductor substrate SB and arranged side by side in a state where the insulation film MZ is interposed between the opposing side surfaces of them. The extending direction of the control gate electrode CG and the memory gate electrode MG is in perpendicular to the surface of a drawing sheet of FIG. 43. The control gate electrode CG and the memory gate electrode MG are formed over the semiconductor substrate SB (p-type well PW1) between the semiconductor region MD and the semiconductor region MS by way of the insulation film GI or the insulation film MZ, in which the memory gate electrode MG is situated on the side of the semiconductor region MS and the control gate electrode CG is situated on the side of the semiconductor region MD. The control gate electrode CG is formed by way of the insulation film GI and the memory gate electrode MG is formed by way of the insulation film MZ over the semiconductor substrate SB.

The control gate electrode CG and the memory gate electrode MG are adjacent to each other with the insulation film MZ being interposed therebetween. The insulation film MZ extends for both regions, that is, a region between the memory gate electrode MG and the semiconductor substrate SB (p-type well PW1) and a region between the memory gate electrode MG and the control gate electrode CG.

The insulation film GI formed between the control gate electrode CG and the semiconductor substrate SB (p-type well PW1), that is, the insulation film GI below the control gate electrode CG functions as a gate insulation film of the control transistor. Further, the insulation film MZ between the memory gate electrode MG and the semiconductor substrate SB (p-type well PW1), that is, the insulation film MZ below the memory gate electrode MG functions as a gate insulation film (gate insulation film having a charge accumulation portion in the inside) of the memory transistor. The insulation film MZ between the memory gate electrode MG and the semiconductor substrate SB (p-type well PW1) functions as the gate insulation film of the memory transistor. The insulation film MZ between the memory gate electrode MG and the control gate electrode CG functions as an insulation film for insulating (electrically separating) the memory gate electrode MG and the control gate electrode CG from each other.

In the insulation film MZ, a silicon nitride film MZ2 is an insulation film that accumulates charges and functions as a charge accumulation layer (charge accumulation portion). That is, the silicon nitride film MZ2 is a trapping insulation film formed in the insulation film MZ. Therefore, the insulation film MZ can be regarded as an insulation film having a charge accumulation portion in the inside (silicon nitride film MZ2 in this embodiment).

A silicon oxide film MZ3 and a silicon oxide film MZ1 situated above and below the silicon nitride film MZ2 can function as a charge blocking layer or charge confining layer. In the insulation, film MZ between the memory gate electrode MG and the semiconductor substrate SB, charges can be accumulated in the silicon nitride film MZ2 by providing a structure of sandwiching the silicon nitride film MZ2 between the silicon oxide film MZ3 and the silicon oxide film MZ1.

The semiconductor region MS and the semiconductor region MD are semiconductor regions for source and drain. That is, the semiconductor region MS is a semiconductor region that functions as one of the source region or the drain region and the semiconductor region MD is a semiconductor region that functions as the other of the source region or the drain region. In this embodiment, the semiconductor region MS is a semiconductor region that functions as the source region, and the semiconductor region MD is a semiconductor region that functions as the drain region. The semiconductor regions MS and MD each comprise a semiconductor region in which n-type impurities are introduced and have a LDD structure respectively. That is, the semiconductor region MS as the source has a n⁻-type semiconductor region EX1 (extension region) and a n⁺-type semiconductor region SD1 (source region) having an impurity concentration higher than the n⁻-type semiconductor region EX1. Further, the semiconductor region MD for the drain has a n-type semiconductor region EX2 (extension region) and a n⁺-type semiconductor region SD2 (drain region) having an impurity concentration higher than the n⁻-type semiconductor region EX2.

The semiconductor region MS is a semiconductor region used for source or drain and formed in the semiconductor substrate SB at a position adjacent to the memory gate electrode MG in the longitudinal direction of the gate (longitudinal direction of the memory gate electrode MG). Further, the semiconductor region MD is a semiconductor region for source or drain and formed in the semiconductor substrate SB at a position adjacent to the control gate electrode CG in the longitudinal direction of the gate (longitudinal direction of the gate of the control gate electrode CG).

A side wall spacer SW comprising an insulator (insulation film) is formed to the side walls on the side of the memory gate electrode MG and the control gate electrode CG not adjacent to each other.

The n⁻-type semiconductor region EX1 of the source portion is formed in self-alignment to the memory gate electrode MG, and the n⁺-type semiconductor region SD1 is formed in self-alignment to the side wall spacer SW on the side wall of the memory gate electrode MG. Therefore, in the manufactured semiconductor device, the n⁻-type semiconductor region EX1 at a low concentration is formed below the side wall spacer SW on the side wall of the memory gate electrode MG, and the n⁺-type semiconductor region SD1 at a high concentration is formed to the outside of the n⁻-type semiconductor region EX1 at the low concentration. Accordingly, the n⁻-type semiconductor region EX1 at the low concentration is formed so as to be adjacent to the channel region of the memory transistor and the n⁺-type semiconductor region SD1 at the high concentration is formed so as to be adjacent to the n⁻-type semiconductor region EX1 at the low concentration and is spaced from the channel region of the memory transistor by so much as the n⁻-type semiconductor region EX1.

The n⁻-type semiconductor region EX2 for the drain portion is formed in self-alignment to the control gate electrode CG, and the n⁺-type semiconductor region SD2 is formed in self-alignment to the side wall spacer SW on the side wall of the control gate electrode CG. Therefore, in the manufactured semiconductor device, the n⁻-type semiconductor region EX2 at the low concentration is formed below the side wall spacer SW on the side wall of the control gate electrode CG, and the n⁺-type semiconductor region SD2 at the high concentration is formed to the outside of the n⁻-type semiconductor region EX2 at the low concentration. Accordingly, the n⁻-type semiconductor region EX2 at the low concentration is formed so as to be adjacent to the channel region of the control transistor, and the n⁺-type semiconductor region SD2 at the high concentration is formed so as to be adjacent to the n⁻-type semiconductor region EX2 at the low concentration and spaced from the channel region of the control transistor by so much as the n⁻-type semiconductor region EX2.

A channel region of the memory transistor is formed below the insulation film MZ below the memory gate electrode MD, while a channel region of the control transistor is formed below the insulation film GI below the control gate electrode CG.

A metal silicide layer SL1 is formed over the n⁺-type semiconductor regions SD1, SD2, and SD3 over the memory gate electrode MG, and over the control gate electrode CG by a salicide technique, etc.

The metal silicide SL2 over the memory gate electrode MG carries a reference sign SL2m and is referred to as a metal silicide layer SL2m, and the metal silicide layer SL2 over the control gate electrode CG carries a reference sign SL2c and referred to as a metal silicide layer SL2c.

In this embodiment, an upper portion of the insulation film MZ extending between the memory gate electrode MG and the control gate electrode CG protrudes (projects) from the metal silicide layer SL2m over the memory gate electrode MG and the metal silicide layer SL2c over the control gate electrode CG. That is, the upper portion of the insulation film MZ extending between the memory gate electrode MG and the control gate electrode CG protrudes upward (in the direction away from the main surface of the semiconductor substrate SB) from the upper surface of the metal silicide layer SL2 over the memory gate electrode MG and from the upper surface of the metal silicide layer SL2 over the control gate electrode CG.

That is, the insulation film MZ extends for both regions, that is, a region between the memory gate electrode MG and the semiconductor substrate SB (p-type well PW1) and a region between the memory gate electrode MG and the control gate electrode CG. Then, the height at the top (uppermost portion) of the insulation film MZ extending between the memory gate electrode MG and the control gate electrode CG is higher than the upper surface of the metal silicide layer SL2m over the memory gate electrode MG and higher than the upper surface of the metal silicide layer SL2c over the control gate electrode CG. The height, when referred to, means a height in the direction substantially perpendicular to the main surface of the semiconductor substrate SB.

The metal silicide layer SL2m over the memory gate electrode MG and the metal silicide layer SL2c over the control gate CG are not connected and not in contact to each other. If the metal silicide layer SL2m over the memory gate electrode MG and the metal silicide layer SL2c over the control gate electrode CG are in contact to each other, the memory gate MG and the control gate electrode CG are short-circuited and appropriate operation as the non-volatile memory is not possible. Accordingly, it is important that the metal silicide layer SL2m over the memory gate electrode MG and the metal silicide layer SL2c over the control gate electrode CG are not in contact to each other.

In this embodiment, the upper portion of the insulation film MZ extending between the memory gate electrode MG and the control gate electrode CG protrudes from the metal silicide layer SL2m over the memory gate electrode MG and the metal silicide layer SL2c over the control gate electrode CG. Thus, the insulation film MZ can effectively prevent the metal silicide layer SL2m over the memory gate electrode MG and the metal silicide layer SL2c over the control gate electrode CG from being contact to each other.

If the height of the top (uppermost portion) of the insulation film MZ extending between the memory gate electrode MG and the control gate electrode CG is lower than or equal with the upper surface of the metal silicide layer SL2m over the memory gate electrode MG or the upper surface of the metal silicide layer SL2c over the control gate electrode CG, the metal silicide layer SL2m and the metal silicide layer SL2c tend to be in contact to each other. This is because the metal silicide layer SL2m over the memory gate electrode MG or the metal silicide layer SL2c over the control gate electrode CG is formed so as to exceeds the insulation film MZ between the memory gate electrode MG and the control gate CG, tending to cause a phenomenon that the metal silicide layer SL2m and the metal silicide layer SL2c are in contact to each other.

On the contrary, when the upper portion of the insulation film MZ protrudes (projects) from the metal silicide layers SL2m and SL2c as in this embodiment, both of the metal silicide layers SL2m and SL2c less override the insulation film MZ between the memory gate electrode MG and the control gate CG. Accordingly, any of the metal silicide layer SL2m over the memory gate electrode MG and the metal silicide layer SL2c over the control gate electrode MG when formed less likely to override the insulation film MZ between the memory gate electrode MG and the control gate electrode CG, which suppresses the phenomenon that the metal silicide layer SL2m and the metal silicide layer SL2c are in contact to each other. Accordingly, contact between the metal silicide layer SL2m over the memory gate electrode MG and the metal silicide layer SL2c over the control gate electrode CG to each other can be prevented effectively. Thus, the reliability of the semiconductor device having the no-volatile memory can be improved. Further, the production yield of the semiconductor device having the non-volatile memory can be improved.

<Operation of Non-volatile Memory>

An example of operation of the non-volatile memory is to be described with reference to FIG. 45.

FIG. 45 is a table showing one example of conditions for applying voltages to respective portions of a selection memory cell upon "write", "erase" and "read" in this embodiment. The table in FIG. 45 describes a voltage Vmg applied to the memory gate electrode MG, a voltage Vs applied to the source region (semiconductor region MS), a voltage Vcg applied to the control gate electrode CG, a voltage Vd applied to the drain region (semiconductor region MD), and a base voltage Vb applied to the p-type well PW1 of the memory cell as illustrated in FIG. 43 and FIG. 44. Those shown in the table of FIG. 45 are a preferred example of conditions for applying voltages, which are not restrictive but can be optionally changed variously. Further, in this embodiment, injection of electrons into the silicon nitride film MZ2 as the charge accumulation portion in the insulation film MZ of the memory transistor is defined as "write" and injection of holes (positive holes) into the silicon nitride film MZ2 is defined as "erase".

In the table of FIG. 45, column A corresponds to a case where a SSI method is used for writing and a BTBT method is used for erasing, column B corresponds to a case where the SSI method is used for writing and a FN method is used for erasing, column C corresponds to a case where the FN method is used for writing and the BTBT method is used for erasing, and column D corresponds to a case where the FN method is used for writing and the FN method is used for erasing.

The SSI method can be regarded as an operation method of writing to a memory cell by injecting hot electrons into the silicon nitride film MZ2, the BTBT method can be regarded as an operation method of erasing the memory cell by injecting hot holes into the silicon nitride film MZ2, and the FN method can be regarded as an operation method of performing writing or erasing to a memory cell by tunneling electrons or holes. The FN method, in other expression, can be regarded as an operation method of writing to the memory cell by injecting electrons due to a FN tunneling effect into the silicon nitride film MZ2, and the FN erasing method can be regarded as an operation method of erasing the memory cell by injecting holes due to the FN tunneling effect into the silicon nitride film MZ2. They are to be described specifically.

The writing method includes a writing method of writing by injection of hot electrons due to source side injection referred to as a SSI (Source Side Injection) method (hot electron injection method) and a writing method of writing due to FN (Fowler Nordheim) tunneling (tunneling write system).

In the SSI writing, voltages, for example, shown as "write operation voltage" (Vmg=10 V, Vs=5 V, Vcg=1 V, Vd=0.5 V, Vb=0 V) in column A or column B in the table of FIG. 45 are applied to respective portions of the selection memory cell for performing writing operation and writing is performed by injecting electrons into the silicon nitride film MZ2 in the insulation film MZ of the selection memory cell. In this case, the hot electrons are generated in the channel region (between the source and the drain) below the two gate electrodes (memory gate electrode MG and control gate electrode CG), and the hot electrons are injected into the silicon nitride film MZ2 as the charge accumulation portion in the insulation film MZ below the memory gate electrode MG. The injected hot electrons are captured at the trap level of the silicon nitride film MZ2 in the insulation film MZ and, as a result, a threshold voltage of the memory transistor is increased. That is, the memory transistor is put to a writing state.

In the FN writing, voltages as shown, for example, by "write operation voltage" in column C or column D in the table of FIG. 45 (Vmg=−12 V, Vs=0 V, Vcg=0 V. Vd=0 V, Vb=0 V) are applied to the respective portions of the selection memory cell for performing writing, and writing is performed by tunneling electrons from the memory gate electrode MG and injecting them into the silicon nitride film MZ2 in the insulation film MZ in the selection memory cell. In this case, the electrons are injected from the memory gate electrode MG due to FN tunneling (FN tunneling effect) through the silicon oxide film MZ3 into the insulation film MZ, trapped at the trap level of the silicon nitride film MZ2 in the insulation film MZ and, as a result, the threshold voltage of the memory transistor is increased. That is, the memory transistor is put to a writing state.

In the FN writing, writing can also be performed by tunneling electrons from the semiconductor substrate SB and injecting them into the silicon nitride film MZ2 in the insulation film MZ, in which the write operation voltage can be obtained, for example, by reversing the polarity of "write operation voltage" in the column C or column D in the table of FIG. 45.

The erasing method includes an erasing method of erasing by injecting hot holes due to BTBT (Band-To-Band Tunneling: Inter-band tunneling phenomenon) referred to as a BTBT method (hot hole injection erasing method) and an erasing method due to FN (Fowler Nordheim) tunneling referred to as a FN method.

In the BTBT erasing, erasing is performed by injecting holes generated by BTBT into a charge accumulation portion (silicon nitride film MZ2 in insulation film MZ). For example, voltages as shown by "erase operation voltage" in the column A or column C in the table of FIG. 45 (Vmg=−6 V, Vs=6 V, Vcg=0 V, Vd=open, Vb=0 V) are applied to the respective portions of the selection memory cell that performs erasing. Thus, the holes are generated by the BTBT phenomenon, and injected into the silicon nitride film MZ2 in the insulation film MZ of the selection memory cell by acceleration under electric field, thereby lowering the threshold voltage of the memory transistor. That is, the memory transistor is in put to an "erase" state.

In the FN erasing, voltages, for example, as shown by "erase operation voltage" in column B or column D in the table of FIG. 45 (Vmg=12 V, Vs=0 V, Vcg=0 V, Vd=0 V, Vb=0 V) are applied to the respective portions of the selection memory cell, and holes are tunneled from the memory gate electrode MG in the selection memory cell and injected into the silicon nitride film MZ2 in the insulation film MZ to perform memory erasing. In this case, holes are tunneled from the memory gate electrode MG through the silicon oxide film MZ3 in the insulation film MZ due to FN tunneling (FN tunneling effect), captured at the trapping level of the silicon nitride film MZ2 in the insulation film MZ and, as a result, the threshold voltage of the memory transistor is lowered. That is, the memory transistor is put to an erasing state.

In the FN erasing, erasing can be performed also by tunneling the holes from the semiconductor substrate SB and injecting them into the silicon nitride film MZ2 in the insulation film MZ in which the erase operation voltage can be obtained, for example, by reversing the polarity of the "erase operation voltage" in column B or column D in the Table of FIG. 45.

Further, when writing or erasing is performed by the FN method (in the case of the operation method B, C, D) in which charges are tunneled from the memory gate electrode MG into the silicon nitride film MZ2, it is preferred that the thickness of the silicon oxide film MZ3 is less than the thickness of the silicon oxide film MZ1. On the other hand, when writing or erasing is performed by the FN method (in the case of the operation method B, C, D) in which the charges are tunneled from the semiconductor substrate SB and injected into the silicon nitride film MZ2, it is preferred that the thickness of the silicon oxide film MZ1 is less than the thickness of the silicon oxide film MZ3. Further, in the SSI writing and the BTBT erasing (in the case of the operation method A), it is preferred that the thickness of the silicon oxide film MZ3 is equal to or more than the thickness of the silicon oxide film MZ1.

Upon reading, voltages, for example, as shown by "read operation voltage" in the column A, column B, column C, or column D in the table of FIG. 45 are applied to the respective portions of the selection memory cell that performs reading. The writing state and the erasing state can be discriminated by defining the voltage Vmg applied to the memory gate electrode MG upon reading to a value between the threshold voltage of the memory transistor in the writing state and the threshold voltage in the erasing state.

<Modification>

Then, description is to be made to manufacturing steps of a semiconductor device of a modification investigated by the present inventors. FIG. 46 to FIG. 49 are fragmentary cross sectional views for the main portion during the manufacturing step of the semiconductor device as the modification.

Figure 46:
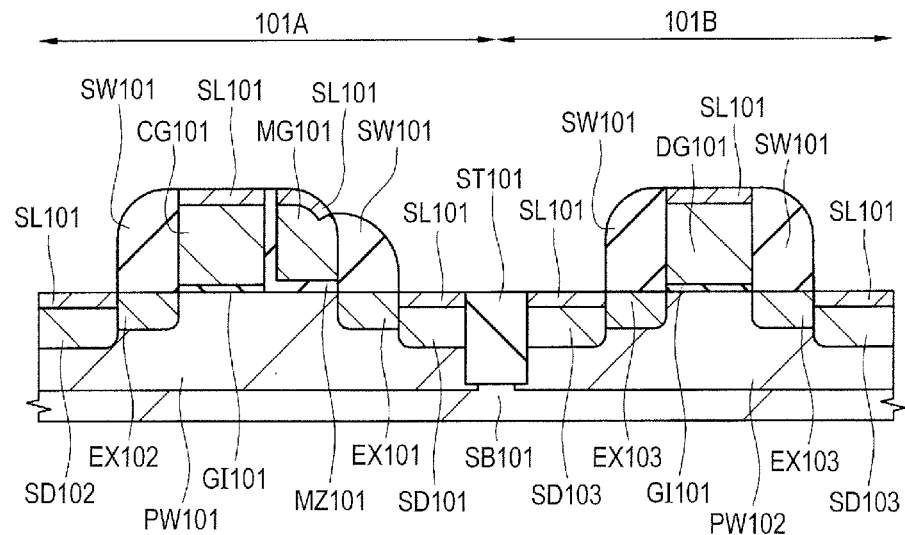
FIG. 46 is a main fragmentary cross sectional view of a semiconductor device as a modification during a manufacturing step.

In the modification, as illustrated in FIG. 46, a control gate electrode CG101 is formed by way of a gate insulation film GI101 over a p-type well PW101 of a semiconductor substrate SB101, and a memory gate electrode MG101 is formed by way of an insulation film MZ101 over a p-type well PW101 of the semiconductor substrate SB101 in the memory cell region 101A. Further, a gate electrode DG101 is formed by way of a gate insulation film GI101 over a p-type well PW102 of the semiconductor substrate SB101 in a peripheral circuit region 101B. Then, after forming n$^-$-type semiconductor regions EX101, EX102, and EX103 corresponding to the n$^-$-type semiconductor regions EX1, EX2, and EX3 by ion implantation, side wall spacer SW101 comprising an insulator is formed on the side walls where the memory gate electrode MG101 and the control gate electrode CG101 are not adjacent to each other and on both side walls of the gate electrode DG101. Then, n$^+$-type semiconductor regions SD101, SD102, and SD103 corresponding to the n$^+$-type semiconductor regions SD1, SD2, and SD3 are formed by ion implantation. Then, a metal silicide layer SL101 corresponding to the metal silicide layer SL1 is formed over each of the n$^+$-type semiconductor region SD101, SD102, and SD103, over the control gate electrode CG101, over the memory gate electrode MG101, and over the gate electrode GG101.

The insulation film MZ101 is an insulation film having a charge accumulation portion and comprises an ONO film, etc. The memory gate electrode MG 101 is adjacent by way of the insulation film MZ101 to the control gate electrode CG101, and the insulation film MZ101 extends for both regions, that is, a region between the memory gate electrode MG101 and the semiconductor substrate SB101 (p-type well PW101) and a region between the memory gate electrode MG101 and the control gate electrode CG101.

In the case of the modification of FIG. 46, different from this embodiment, the metal silicide layer SL101 is formed not only over the n$^+$-type semiconductor regions SD101, SD102, and SD103 but also over each of the control gate electrode CG101, the memory gate electrode MG101, and the gate electrode DG101. This can be attained by modifying the manufacturing step of the modification as described below. That is, the control gate electrode CG101, the memory gate electrode MG101, and the gate electrode DG101 are formed of silicon respectively, and those corresponding to the cap insulation films CP1 and CP2 are not formed over the control gate electrode CG101 and gate electrode DG101, and those corresponding to the side wall spacer SW are not formed over the memory gate electrode MG101. Then, after forming the metal film (corresponding to the metal film MM) for forming the metal silicide layer SL101 in a state where not only the upper surface of the n$^+$-type semiconductor regions SD101, SD102, and SD103 but also each of the upper surfaces of the control gate electrode CG101, the memory gate electrode MG101, and the gate electrode DG101 are exposed, a heat treatment is applied and then unreacted metal film is removed. Thus, the metal silicide SL101 is formed over each of the upper portion of the n$^+$-type semiconductor regions SD101, SD102, and SD103, over the control gate electrode CG101, over the memory gate electrode MG101, and over the gate electrode DG101.

However, after subsequently removing the gate electrode DG101, it is sometimes replaced by other gate electrode. For example, after subsequently removing the gate electrode DG101, this is replaced with the metal gate electrode. In this case, since the metal gate electrode is formed after the activation annealing performed after forming the source-drain region, an application of high temperature load such as by activation annealing to the metal gate electrode can be avoided and the characteristics of the MISFET using the metal gate electrode as a gate electrode can be improved or the scattering of the characteristics can be suppressed.

Figure 47:
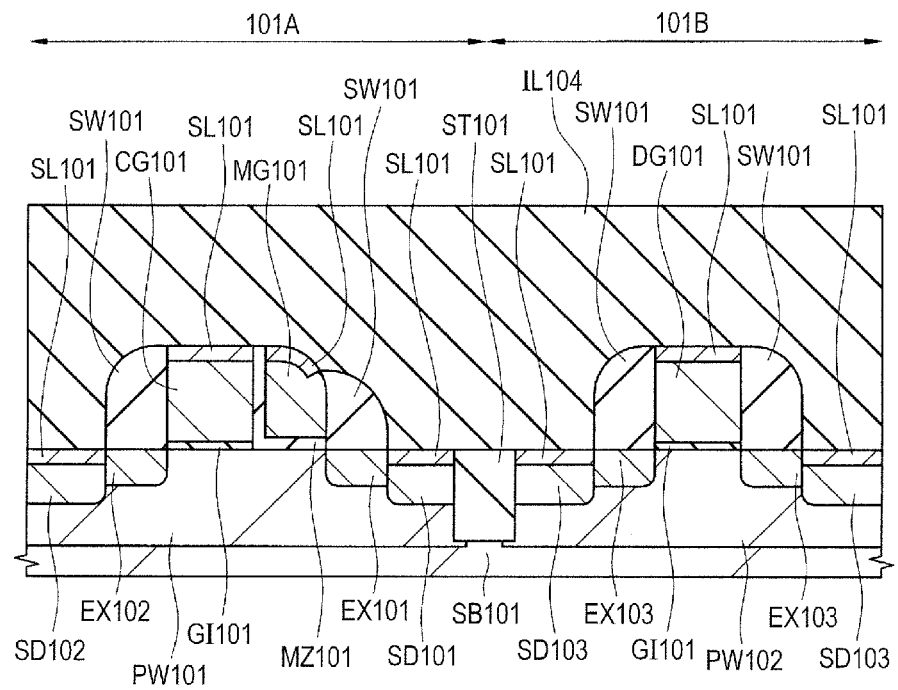
FIG. 47 is a main fragmentary cross sectional view of the semiconductor device during the manufacturing step thereof succeeding to that of FIG. 46.
Figure 48:
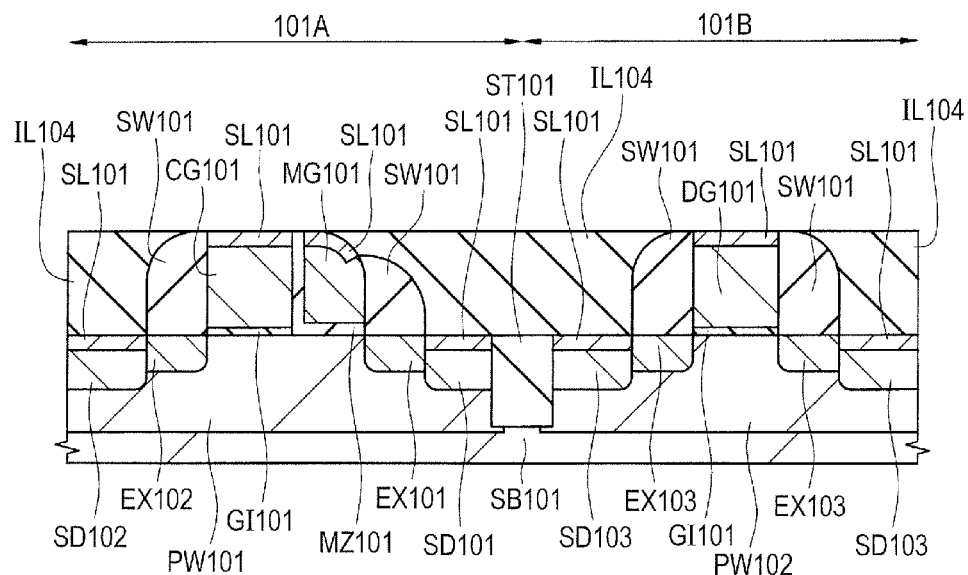
FIG. 48 is a main fragmentary cross sectional view of the semiconductor device during the manufacturing step thereof succeeding to that of FIG. 47.
Figure 49:
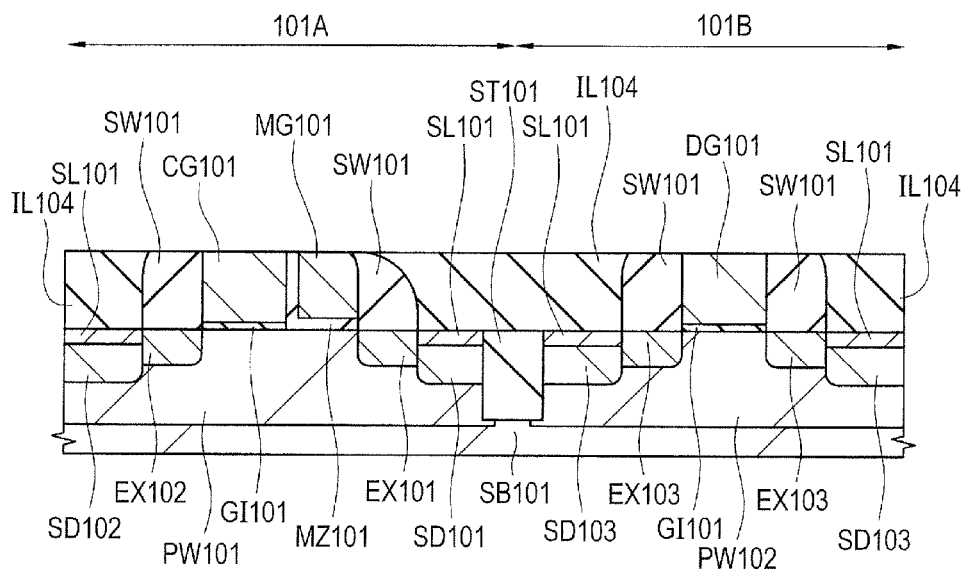
FIG. 49 is a main fragmentary cross sectional view of the semiconductor device during the manufacturing step thereof succeeding to that of FIG. 48.

For removing the gate electrode DG101 and replacing the same with other gate electrode, an insulation film IL104 is at first formed as an interlayer insulation film, over the entire main surface of a semiconductor substrate SB101 so as to cover a control gate CG101, a memory gate electrode MG101, gate electrode DG101, and a side wall spacer SW101 as illustrated in FIG. 47. Then, the insulation film IL104 is polished by CMP, etc. to expose the metal silicide layer SL101 over the gate electrode DG101 as illustrated in FIG. 48. In this case, the metal silicide layer SL101 over the memory gate electrode MG101 and over the control gate CG101 is also exposed. However, the metal silicide layer SL101 is less removed by etching. Accordingly, as illustrated in FIG. 49, the insulation film IL104 is further polished by a CMP method, etc. till the metal silicide layer SL101 over the gate electrode DG101 is removed and the gate electrode DG101 is exposed. In this case, the metal silicide layer SL101 over the memory gate electrode MG101 and the control gate electrode CG101 is also removed by polishing and the upper surface of the memory gate electrode MG101 and that of the control gage electrode CG101 are also exposed then, the gate electrode DG101 is removed by etching and a metal gate electrode is filled in a region from which the gate electrode DG101 was removed, by which the gate electrode DG101 can be replaced with the metal gate electrode to form a MISFET having the metal gate electrode as a gate electrode in the peripheral circuit region 101B.

However, in a case of polishing the insulation film IL104 by CMP, etc., when the metal silicide layer SL101 is polished, a problem of scratch or contamination may possibly be caused due to polishing to the metal silicide layer SL101. The problem of the scratch or contamination may possibly deteriorate the reliability of the semiconductor device. Further, this may possibly lower the production yield of semiconductor devices.

Accordingly, it is desirable to avoid polishing for the metal silicide layer SL101. However, if the metal silicide layer SL101 over the gate electrode DG101 is left without polishing, since the metal silicide layer SL101 is less removed by etching, it is difficult to remove the gate electrode DG101.

On the other hand, for the memory gate electrode MG101 and the control gate electrode CG101, the metal silicide layer SL101 is formed over the memory gate electrode MG101 and the control gate electrode CG101 in order to decrease the resistance. However, formation of the metal silicide layer SL101 over the memory gate electrode MG101 and the control gate electrode CG101 may possibly lead to polishing of the metal silicide layer SL101 over the memory gate electrode MG101 and the control gate electrode CG101, which may possibly cause a problem of scratch or contamination. Further, if the metal silicide layer is not formed over the memory gate electrode MG101 and the control gate electrode CG101, this deteriorates the characteristics of the non-volatile memory comprising the memory gate electrode MG101 and the control gate electrode CG101, etc., and, thus, the performance of the semiconductor devices is deteriorated.

Further, in the manufactured semiconductor device, when the metal silicide layer SL101 is formed over each of the memory gate electrode MG101 and the control gate electrode CG101, the resistance of the memory gate electrode MG101 and the control gate electrode CG101 can be decreased. This can improve the characteristics of the non-volatile memory comprising the memory gate MG101, the control gate electrode CG101, etc. and, thus, the performance of the semiconductor device can be improved. However, the memory gate electrode MG101 and the control gate electrode CG101 are controlled independently. Accordingly, for improving the reliability of the semiconductor device having the non-volatile memory, it is desired to prevent contact between the metal silicide layer SL101 over the gate electrode MG101 and the metal silicide layer SL101 over the control gate electrode CG101 to each other as much as possible.

<Main Feature and Advantageous Effect>

Then, main features and advantageous effects of this embodiment are to be described.

The manufacturing steps of this embodiment are manufacturing steps of a semiconductor device comprising a memory cell of a non-volatile memory formed in a memory cell region 1A (first region) of a semiconductor substrate SB and MISFET formed in a peripheral circuit region 1B (second region) of the semiconductor substrate SB. That is, in the manufacturing steps of this embodiment, the memory cell of the non-volatile memory and the MISFET in the peripheral circuit are formed in one identical semiconductor substrate SB.

In the manufacturing steps of this embodiment, a lamination pattern LM1 (first lamination pattern) is formed by way of an insulation film GI (first gate insulation film) over a semiconductor substrate SB in a memory cell region 1A, a memory gate electrode MG (second gate electrode) is formed by way of an insulation film MZ (second gate insulation film), and a lamination pattern LM2 (second lamination pattern) is formed by way of the insulation film GI (first insulation film) over the semiconductor substrate SB in the peripheral circuit region 1B. The lamination pattern ML1 has a control gate electrode CG (first gate electrode) and a cap insulation film CP1 (first cap insulation film) over the control gate electrode CG and the lamination pattern LM2 has a gate electrode DG (dummy gate electrode) and a cap insulation film CP2 (second cap insulation film) over the gate electrode DG.

Then, in the manufacturing step of this embodiment, a side wall spacer SW as a side wall insulation film is formed on the side wall of the control gate electrode CG, the memory gate electrode MG, and the gate electrode DG (first side wall insulation film) at a step S19. At the step S19, the side wall spacer SW (first side wall insulation film) is formed also over the memory gate electrode MG. Then, at a step S20, $n^+$-type semiconductor regions SD1 and SD2 (first semiconductor region) which are semiconductor regions for source or drain of the memory cell are formed to the semiconductor substrate SB in the memory cell region 1A by an ion implantation method, and $n^+$-type semiconductor regions SD3 (second semiconductor region) as a semiconductor region for source or drain of MISFET are formed to the semiconductor substrate SD in the peripheral circuit region 1B. Then, at a step S22, a metal silicide layer SL1 (first metal silicide layer) is formed over the $n^+$-type semiconductor regions SD1 and SD2 (first semiconductor region) and over the $n^+$-type semiconductor regions SD3 (second semiconductor region). At the step S22, the metal silicide SL1 is not formed over the control gate electrode CG, the memory gate electrode MG, and the gate electrode DG. Then, at a step S23, an insulation film IL4 (second insulation film) is formed over the semiconductor substrate SB so as to cover the lamination pattern LM1, the memory gate electrode MG, the lamination pattern LM2, and the side wall spacer SW. Then at a step S24, the upper surface of the insulation film IL4 is polished to expose the control gate electrode CG, the memory gate electrode MG and the gate electrode DG. Then, after removing the gate electrode DG, a conductive film (metal film ME in this embodiment) is filled in the trench TR2 (first groove) from which the gate electrode DG was removed to form the gate electrode GE (third gate electrode). Then, the metal silicide layer SL2 (second metal silicide layer) is formed over the control gate electrode CG and the memory gate electrode MG.

One of the main features of the manufacturing steps of this embodiment is that the metal silicide layer SL1 is formed over the $n^+$-type semiconductor regions SD1, SD2, and SD3 but the metal silicide layer SL1 is not formed over the control gate electrode CG, the memory gate electrode MG, and the gate electrode DG at the step S22. Therefore, when the upper surface of the insulation film IL4 is polished to expose the control gate electrode CG, the memory gate electrode MG, and the electrode gate DG at the step S24, polishing of the metal silicide layer (SL1) can be saved. Accordingly, the problem of scratch or contamination caused by polishing the metal silicide layer can be prevented. This can improve the reliability of the semiconductor device and, further, improve the production yield of semiconductor devices. Further, the manufacturing steps of the semiconductor device can be administrated easily, so that the semiconductor devices can be manufactured easily.

The other of the main features of the manufacturing step of this embodiment is to polish the upper surface of the insulation film IL4 to expose the control gate electrode CG, the memory gate electrode MG, and the gate electrode DG at the step S24 and, subsequently, form a silicide layer SL2 over the control gate electrode CG and the memory gate electrode MG. Since a structure in which the metal silicide layer SL2 is formed over the memory gate electrode MG and the control gate electrode CG can be obtained in the semiconductor device manufactured by forming the metal silicide layer SL2 over the control gate electrode CG and the memory gate electrode MG, the resistance of the memory gate electrode MG and the control gate electrode CG can be decreased. Accordingly, the characteristics of the non-volatile memory having the memory gate electrode MG and the control gate electrode CG can be improved. Therefore, the performance of the semiconductor device having the non-volatile memory can be improved.

That is, the first feature of the manufacturing steps of this embodiment is that when the metal silicide layer SL1 is formed over the $n^+$-type semiconductor regions SD1, SD2, and SD3, the metal silicide layer SL1 is not formed over the control gate electrode CG, the memory gate electrode MG, and the gate electrode DG. Then, the second feature of the manufacturing steps of this embodiment is to form the metal silicide layer SL2 over the control gate electrode CG and the memory gate electrode MG after polishing the upper surface of the insulation film IL4 at the step S24 to expose the control gate electrode CG, the memory gate electrode MG, and the gate electrode DG at the step S24. By adopting both of the first feature and the second feature, occurrence of scratch or contamination caused by polishing to the metal silicide layer can be prevented and the resistance of the memory gate electrode MG and the control gate electrode CG can be decreased by the metal silicide layer SL2 to improve the characteristics of the non-volatile memory.

Further, formation of the metal silicide layer SL2 over the control gate electrode CG and the memory gate electrode MG as the second feature also leads to size-reduction (reduction of area) of the semiconductor device. That is, if the metal silicide layer is not finally formed over the control gate electrode and the memory gate electrode, since the resistance of the control gate electrode and the memory gate electrode is increased, the number of contact portions for connection to the plug (corresponding to the plug PG described above) in the control gate electrode and the memory gate electrode has to be increased, and this increases the area of the semiconductor device. On the contrary, in the manufacturing steps of this embodiment, since the metal silicide layer SL2 is formed over the control gate electrode CG and the memory gate electrode MG, the resistance of the control gate electrode CG and the memory gate electrode MG can be decreased. Accordingly, the number of contact portions provided for connection to the plug PG can be decreased in the control gate electrode CG and the memory gate electrode MG, and the area of the semiconductor device can be decreased.

Further, for achieving the first feature, the cap insulation film CP1 is formed over the control gate electrode CG and the cap insulation film CP2 is formed over the gate electrode DG in the manufacturing steps of this embodiment. Then, when the side wall spacer SW as the side wall insulation film is formed on the side walls of the control gate electrode CG, the memory gate electrode MG, and the gate electrode DG at the step S19, the side wall spacer SW is formed also over the memory gate electrode MG. Thus, when the metal silicide layer SL1 is formed over the $n^+$-type semiconductor regions SD1, SD2, and SD3 at the step S22, it is possible not to form the metal silicide layer SL1 over the control gate electrode CG, the memory gate electrode MG, and the gate electrode DG. That is, the first feature can be achieved. That is, since the cap insulation film CP1 is formed over the control gate electrode CG, the metal silicide layer SL1 can be prevented from being formed over the control gate electrode CG. Further, since the cap insulation film CP2 is formed over the gate electrode DG, the metal silicide layer SL1 can be prevented from being formed over the gate electrode DG. Further, since the side wall spacer SW is formed over the memory gate electrode MG, the metal silicide layer SL1 can be prevented from being formed over the memory gate electrode MG.

Further, in the manufacturing step of this embodiment, it is preferred that the height of the memory gate electrode MG is lower than the height of the lamination pattern LM1 so that the side wall spacer is formed easily also over the memory gate electrode MG at the step S19. That is, while the memory gate electrode MG is formed by etching back the silicon film PS2 at the steps S12 and S14, it is preferred that the height of the formed memory gate electrode MG is lower than the height of the lamination pattern LM1. That is, the height of the top (uppermost portion) of the memory gate electrode MG is preferably lower than the height at the upper surface of the cap insulation film CP1 for the lamination pattern LM1. It is adapted such that the relation of height is established also just before the formation of the side wall spacer SW at the step S19. Thus, when the side wall spacer SW as the side wall insulation film is formed on the side walls of the control gate electrode CG, the memory gate electrode MG, and the gate electrode DG at the step S19, the side wall spacer SW can be formed easily also over the memory gate electrode MG.

Further, in the manufacturing step of this embodiment, the step of forming the metal silicide layer SL1 at the step S22 specifically includes the following steps. That is, it includes a step of forming a metal film MM (first metal film) over the semiconductor substrate SB so as to be in contact with the $n^+$-type semiconductor regions SD1, SD2, and SD3, a step of reacting the metal film MM with the $n^+$-type semiconductor regions SD1, SD2, and SD3 by a heat treatment to form a metal silicide layer SL1, and a step of subsequently removing the unreacted metal film MM. Thus, the metal silicide layer SL1 can be formed in self-alignment over the $n^+$-type semiconductor regions SD1, SD2, and SD3. Further, when the metal film MM for forming the metal silicide layer SL1 is formed, the metal film MM is not in contact with the control gate electrode CG, the memory gate electrode MG, and the gate electrode DG. Thus, it is possible that the metal silicide layer SL1 is not formed over the control gate electrode CG, the memory gate electrode MG, and the gate electrode DG when the metal silicide layer SL1 is formed over the $n^+$-type semiconductor regions SD1, SD2, and SD3.

Further, each of the control gate electrode CG, the memory gate electrode MG and the gate electrode DG preferably comprises silicon. That is, the control gate electrode CG, the memory gate electrode MG, and the gate electrode DG are preferably silicon gate electrodes comprising silicon, respectively. Since the gate electrode DG is formed of silicon (silicon film), the gate electrode DG can be easily removed subsequently. Further, since each of the control gate electrode CG and the memory gate MG is formed of silicon (silicon film), the reliability of the memory cell of the non-volatile memory can be improved. Accordingly, the performance of the semiconductor device having the non-volatile memory can be improved.

Further, the charge holding characteristics are important for the memory cell. If the control gate electrode CG and the memory gate electrode MG forming the memory cell are formed of the metal gate electrode, there may be a possibility that the metal of the metal gate electrode diffuses into the charge accumulation film (insulation film MZ in this embodiment) to lower the charge holding characteristics. Such possibility is eliminated by forming the control gate electrode CG and the memory gate electrode MG as a silicon gate electrode and the reliability of the memory cell of the non-volatile memory can be improved. Accordingly, even when the metal gate electrode is applied to the MISFET formed in the peripheral circuit region 1B, the silicon gate electrode is applied preferably to the control gate electrode CG and the memory gate electrode MG that form the memory cell of the non-volatile memory.

However, when the control gate electrode and the memory gate electrode comprise the silicon gate electrode, the resistance of the control gate electrode and the memory gate electrode is increased. Particularly, in the memory gate electrode, the concentration of the conduction type impurity (n-type impurity such as phosphorus in this embodiment) of the memory gate electrode tends to be lowered, so that increase in the resistance of the memory gate electrode due to lowering of the impurity concentration of the memory gate electrode may possibly cause a phenomenon that the memory cell cannot respond to application of voltage such as a pulse voltage. The concentration of the impurity in the memory cell gate is lowered in order to improving also the erasing characteristics while improving the charge holding characteristics by controlling the band structure and, when the concentration of the impurity in the memory gate electrode is lowered, holes can be injected easily from the memory gate electrode to the charge accumulation layer due to the FN method upon erasing operation. For example, the control gate electrode can be formed as a doped polysilicon film at a phosphorus (P) concentration of $1\times10^{20}$ atoms/cm$^3$ or more and the memory gate electrode can be formed as a doped polysilicon film at a phosphorus (P) concentration of $1\times10^{20}$ atoms/cm$^3$ or less.

On the contrary, this embodiment has a structure in which the metal silicide layer SL2 is formed over the control gate electrode CG and the memory gate electrode MG at the step S36. The manufactured semiconductor device also has a structure in which the metal silicide layer SL2 is formed over the control gate electrode CG and the memory gate electrode MG. Since the metal silicide layer SL2 is formed over the control gate electrode CG and the memory gate electrode MG, the resistance of the control gate electrode CG and the memory gate electrode MG can be decreased. Further, even when the concentration of the conduction type impurity (n-type impurity such as phosphorus in this embodiment) contained in the memory gate electrode MG is lowered, since the metal silicide layer SL2 is formed over the memory gate electrode MG, the memory cell can effectively respond to the application of voltage such as a pulse voltage. Accordingly, the reliability of the memory cell of the non-volatile memory can be improved. Further, the performance of the semiconductor device having the non-volatile memory can be improved.

Referring to a preferred example, the control gate electrode CG can be a doped polysilicon film at a phosphorus (P) concentration of $1\times10^{20}$ atoms/cm$^3$ or more and the memory gate electrode MG can be a doped polysilicon film at a phosphorus (P) concentration of $1\times10^{20}$ atoms/cm$^3$ or less. Even when such impurity concentration is used, since the metal silicide layer SL2 is formed over the control gate electrode CG and the memory gate electrode MG, the resistance of the control gate electrode CG and the memory gate electrode MG can be lowered thereby improving the reliability of the memory cell of the non-volatile memory. Further, the performance of the semiconductor device having the non-volatile memory can be improved.

The gate electrode GE is preferably a metal gate electrode. Thus, the performance of the MISFET formed in the peripheral circuit region 1B can be improved. Accordingly, the performance of the semiconductor device can be improved.

In the manufacturing step of this embodiment, after removing the gate electrode DG, the gate electrode GE as the metal electrode is formed by filling a conductive film (metal film ME in this embodiment) in the trench TR1 which is a region from which the gate electrode DG was removed. This can prevent the thermal load caused by the heat treatment from exerting on the conductive film used for the gate electrode GE, particularly, on the metal film ME for forming the gate electrode GE as a metal gate electrode till the removal of the gate electrode DG. For example, while the heat treatment as the activation annealing at the step S21 is a heat treatment which is applied particularly at high temperature among the manufacturing steps of the semiconductor device, the heat treatment at the step S21 is not applied to the conductive film used as the gate electrode GE (metal film ME in this embodiment). Therefore, it is possible to suppress or prevent the conductive film used for the gate electrode GE, particularly, the metal film ME used for the gate electrode GE as the metal gate electrode from deterioration by the thermal load. Accordingly, the reliability of the manufactured semiconductor device can be improved. Accordingly, the performance of the semiconductor device can be improved.

Further, in the manufacturing step of this embodiment, the gate electrode GE is preferably formed by filling the conductive film used for the gate electrode GE (metal film ME in this embodiment) by way of a high dielectric insulation film (insulation film HK in this embodiment) into the trench TR1, that is, a region from which the gate electrode DG was removed. Thus, the high dielectric insulation film (insulation film HK in this embodiment) between the gate electrode GE and the semiconductor substrate SB can function as a high dielectric gate insulation film. Therefore, the performance of the MISFET having the gate electrode GE as the gate electrode can be improved further. Accordingly, the performance of the semiconductor device can be improved further.

In the manufacturing step of this embodiment, the step of forming the metal silicide layer SL2 at the step S36 specifically includes the following steps. That is, it includes a step of forming a metal film MF (second metal film) over the semiconductor substrate SB so as to be in contact with the control gate electrode CG and the memory gate electrode MG, a step of reacting the metal film MF with the control gate electrode CG and the memory gate electrode MG by the heat treatment thereby forming the metal silicide layer SL2, and a step of subsequently removing an unreacted metal film MF. Thus, the metal silicide layer SL2 can be formed in self-alignment over the control gate electrode CG and the memory gate electrode MG.

In this embodiment, the metal silicide layer SL1 and the metal silicide layer SL2 are formed by separate steps. Therefore, the metal silicide SL1 can be formed under a condition suitable to be formed to the n$^+$-type semiconductor regions SD1, SD2, and SD3. On the other hand, the metal silicide layer SL2 can be formed under a conditions suitable to be formed to the control gate electrode CG and the memory gate electrode MG. Accordingly, the performance of the semiconductor device can be improved. Further, production margin of the semiconductor device can be improved.

For example, the metal silicide layer SL1 and the metal silicide layer SL2 can be formed by metal silicides which are different in composition or material. That is, the composition of the metal silicide layer SL1 and the composition of the metal silicide layer SL2 can be different, or the material of the metal silicide layer SL1 and the material of the metal silicide layer SL2 can be different. Further, the metal silicide layer SL1 and the metal silicide layer SL2 can be formed to a thickness different from each other. That is, the thickness of the metal silicide layer SL1 and the thickness of the metal silicide layer SL2 can be different.

Since the metal silicide layer SL1 is formed in the semiconductor region (n$^+$-type semiconductor regions SD1, SD2, and SD3) for the source or drain, it can be formed as a metal silicide layer having a composition (or material) and a thickness suitable to the semiconductor region used for the source or drain. On the other hand, since the metal silicide layer SL2 is formed over the control gate electrode CG and the memory gate electrode MG, it can be formed as a metal silicide layer having a composition (or material) and a thickness suitable to the control gate electrode CG and the memory gate electrode MG.

For example, the thickness T2 of the metal silicide layer SL2 can be made to less than (smaller than) the thickness T1 of the metal silicide layer SL1 (that is: T2<T1). The thickness T2 of the metal silicide layer SL2 and the thickness T1 of the metal silicide layer SL1 are shown in FIG. 43. Thus, it is possible to effectively lower the resistance of the semiconductor region (n$^+$-type semiconductor regions SD1, SD2, and SD3) for the source or drain by increasing the thickness of the metal silicide layer SL1, and it is possible to suppress contact between the metal silicide layer SL2 formed over the control gate electrode CG and the metal silicide layer SL2 formed over the memory gate electrode MG by decreasing the thickness of the metal silicide layer SL2.

That is, if the thickness of the metal silicide layer SL2 is excessively large, the metal silicide layer SL2 over the control gate electrode CG and the metal silicide layer SL2 over the memory gate electrode MG may possibly be in contact to each other. However, the metal silicide layer SL1 is free of such possibility. Accordingly, it is possible to obtain a sufficient effect of lowering the resistance by increasing the thickness of the metal film SL1 and, on the other hand, it is possible to prevent short circuit between the control gate electrode CG and the memory gate electrode MG by decreasing the thickness of the metal silicide layer SL2 to less than that of the metal silicide layer SL1. For example, the thickness T1 of the metal silicide layer SL1 can be at about 20 nm and the thickness T2 of the metal silicide layer SL2 can be less than 20 nm.

The thickness T1 of the metal silicide layer SL1 can be controlled, for example, by the thickness of the metal film MM for forming the metal silicide layer SL1 or by the temperature and the time of the heat treatment performed after forming the metal film MM. Further, the thickness T2 of the metal silicide layer SL2 can be controlled, for example, by the thickness of the metal film MF for forming the metal silicide layer SL2, or the temperature and the time of the heat treatment performed after forming the metal film MF.

Further, the metal silicide layer SL1 formed over the semiconductor regions (n$^+$-type semiconductor regions SD1, SD2, and SD3) for the source or drain can be suppressed or prevented from growing abnormally toward the channel region by using a nickel silicide layer containing platinum, that is, a platinum-added nickel silicide layer as the metal silicide layer SL1. Thus, leak current caused by abnormal growing of the metal silicide layer SL1 to the channel region can be suppressed to further improve the performance of the semiconductor device. Further, since the platinum-added nickel silicide layer has high heat resistance, durability to the thermal load in each of high temperature steps after forming the metal silicide layer SL1 can be improved by using the platinum-added nickel silicide layer as the metal silicide layer. Accordingly, while a cobalt silicide layer, a nickel silicide layer, a platinum-added nickel silicide layer, etc. can be used as the metal silicide layer SL1, use of the platinum-added nickel silicide layer is more preferred. The metal silicide layer SL1 can be formed from the platinum-added nickel silicide layer by using a nickel-platinum alloy film as a metal film MM for forming the metal silicide layer SL1.

On the other hand, the metal silicide layer SL2 is not formed over the semiconductor regions (n$^+$-type semiconductor regions SD1, SD2, and SD3) for the source or drain but formed over the control gate electrode CG and the memory gate electrode MG. Accordingly, the metal silicide layer SL2 has no concerns with the channel region and the effect upon abnormal growing is relatively small in the metal silicide layer SL2 compared with the metal silicide layer SL1. Further, since the thermal load caused by various high temperature steps after forming the metal silicide layer SL1 and before forming the metal silicide layer SL2 (for example, a heat treatment for annealing after deposition of the insulation film HK and a heat treatment for reflow after forming the metal film ME2) does not exert on the metal silicide layer SL2, the heat resistance required for the metal silicide SL2 is not so high as that for the metal silicide layer SL1. Accordingly, the metal silicide layer SL2 causes less problem even if it does not contain platinum. While the platinum-added nickel silicide layer can also be used for the metal silicide layer SL2, when a nickel silicide layer not containing platinum is used, the production cost can be lowered by so much as not using expensive platinum. The metal silicide layer SL2 comprising the nickel silicide layer can be obtained by using a nickel film as the metal film MF for forming the metal silicide layer SL2.

When the cobalt film and the silicon region are reacted silicon (Si) is diffusing species, whereas when the nickel film and the silicon region are reacted nickel (Ni) is diffusing species. Therefore, while the cobalt silicide layer can also be used for the metal silicide layer SL2, when the nickel silicide layer or the platinum-added nickel silicide layer is used, contact can be suppressed more between the metal silicide layer SL2 formed over the control gate electrode CG and the metal silicide layer SL2 formed over the memory gate electrode MG.

In the manufacturing step of this embodiment, it is preferred to form the silicon film PS2 at the step S9 and then perform the steps S10 and S11 thereby forming a side wall insulation film SZ. That is, at the step S9, a protrusion that reflects the lamination pattern LM1 is formed at the surface of the silicon film PS2, an insulation film IL2 (sixth insulation film) is formed over the silicon film PS2 at the step S10, and then the insulation film IL2 is etched back at the step S11 thereby forming a side wall insulation film SZ on the side surface (side wall) PS2a of a protrusion that reflects the lamination pattern LM1 at the surface of the silicon film PS2. Then, after etching back the silicon film PS2 at the step S12, and removing the side wall insulation film SZ at the step S13, the memory gate electrode MG is formed by etching back the silicon film PS2 further at the step S14. Thus, the cross sectional shape of the formed memory gate electrode MG (cross sectional shape substantially perpendicular to the extending direction of the memory gate electrode MG, that is, a cross sectional shape illustrated in FIG. 15) can be a substantially rectangular form. Thus, the side wall spacer SW can be formed more effectively over the memory gate electrode MG at the step S19, and the metal silicide layer SL1 can be prevented more effectively from being formed over the memory gate electrode MG at the step S22.

Further, in the manufacturing step of this embodiment, the upper portion of the control gate electrode CG and the upper portion of the memory gate electrode MG are removed preferably at the step S35 before forming the metal silicide layer SL2 at the step S36. By performing the step S35, the height of the control gate electrode CG and that of the memory gate electrode MG can be lowered. Thus, when the metal silicide layer SL2 is formed at the step S36, the metal silicide layer SL2 over the memory gate electrode MG and the metal silicide layer SL2 over the control gate electrode CG can be suppressed or prevented from being situated closer or in contact to each other.

The insulation film MZ extends in a region between the memory gate electrode MG and the semiconductor substrate SB (p-type well PW1) and a region between the memory gate electrode MG and the control gate electrode CG. In the manufacturing step of this embodiment, the upper portion of the insulation film MZ extending between the memory gate electrode MG and the control gate electrode CG preferably protrudes from the upper surface of the memory gate electrode MG and the upper surface of the control gate electrode CG after the step S35. Thus, when the metal silicide layer SL2 is formed at the step S36, the metal silicide SL2 over the memory gate electrode MG and the metal silicide layer SL2 over the control gate electrode CG can be suppressed or prevented from approaching closer or being in contact to each other more effectively. Then, when the metal silicide layer SL2 is formed at the step S36, it is more preferred that the upper portion of the insulation film MZ that extends between the memory gate electrode MG and the control gate CG is in a state protruding from the metal silicide layer SL2 over the memory gate electrode MG and the metal silicide layer SL2 over the control gate electrode CG.

A semiconductor device having a structure in which the upper portion of the insulation film MZ that extends between the memory gate electrode MG and the control gate electrode CG protrudes from the metal silicide layer SL2 (SL2m) over the memory gate electrode MG and the metal silicide layer SL2 (SL2c) over the control gate electrode CG (semiconductor device having the memory cell MC as illustrated in FIG. 43) can provide the following advantageous effects. That is, any of the metal silicide SL2 (SL2m) over the memory gate electrode MG and the metal silicide layer SL2 (SL2c) over the control gate electrode CG, when formed, is less likely to be formed overriding the insulation film MZ between the memory gate electrode MG and the control gate electrode CG, thereby suppressing contact between the metal silicide layer SL2 over the memory gate electrode MG and the metal silicide layer SL2 over the control gate electrode CG. Thus, contact between the metal silicide layer SL2 (SL2m) over the memory gate electrode MG and the metal silicide layer SL2 (SL2c) over the control gate electrode CG can be effectively prevented from being contact to each other. Thus, the reliability of the semiconductor device having the non-volatile memory can be improved. Further, the production yield of the semiconductor device having the non-volatile memory can be improved.

Further, the effect described above can be obtained, irrespective of the manufacturing method, in the manufactured semiconductor device having a structure in which the upper portion of the insulation film MZ extending between the memory gate electrode MG and the control gate electrode CG protrudes from the metal silicide layer SL2 over the memory gate electrode MG and the metal silicide layer SL2 over the control gate electrode CG. The manufacturing method of this embodiment can effectively provide the structure described above by removing the upper portion of the control gate electrode CG and the upper portion of the memory gate electrode MG at the step S35 before forming the metal silicide layer SL2 at the step S36.

Further, the manufactured semiconductor device can provide a structure in which the upper portion of the insulation film MZ that extends between the memory gate electrode MG and the control gate electrode CG protrudes from the metal silicide layer SL2 over the memory gate electrode MG and the metal silicide layer SL2 over the control gate electrode CG and, in addition, the thickness T2 of the metal silicide layer SL2 can be made to less than (smaller than) the thickness T1 of the metal silicide layer SL1. That is, the relation T2<T1 can be attained. This can further effectively prevent the metal silicide layer SL2 (SL2m) over the memory gate electrode MG and the metal silicide layer SL2 (SL2c) over the control gate electrode CG from being contact to each other. Accordingly, the reliability of the semiconductor device having the non-volatile memory can be improved further effectively. Further, the production yield of the semiconductor device having the non-volatile memory can be improved more effectively.

The invention made by the present inventors has been described specifically with reference to preferred embodiments but it will be apparent that the invention is not restrict to such embodiments but can be varied within a range not departing the gist thereof.

What is claimed is:

1. A method of manufacturing a semiconductor device including:
   a memory cell of a non-volatile memory formed in a first region of a semiconductor substrate and a MISFET formed in a second region of the semiconductor substrate, in which
   the memory cell has a first gate electrode and a second gate electrode adjacent to each other formed over the semiconductor substrate, a first gate insulation film formed between the first gate electrode and the semiconductor substrate, and a second gate insulation film formed between the second gate electrode and the semiconductor substrate and having a charge accumulation portion in the inside, and
   the MISFET has a third gate electrode formed over the semiconductor substrate and a third gate insulation film formed between the third gate electrode and the semiconductor substrate, the method comprising:
   (a) providing the semiconductor substrate;
   (b) forming a first lamination pattern having the first gate electrode and a first cap insulation film over the first gate electrode by way of the first gate insulation film over the semiconductor substrate in the first region, forming the second gate electrode by way of the second gate insulation film, and forming a second lamination pattern having a dummy gate electrode for forming the third gate insulation film by way of the first insulation film and a second cap insulation film over the dummy gate electrode;
   (c) forming a first side wall insulation film on the side walls of the first gate electrode, the second gate electrode, and the dummy gate electrode;
   (d) forming, after the step (c), a first semiconductor region used for a source or a drain of the memory cell in the semiconductor substrate at the first region and forming a second semiconductor region for a source or a drain of the MISFET in the second region to the semiconductor substrate by an ion implantation method;

(e) forming, after the step (d), a first metal silicide layer over the first semiconductor region for the source or the drain of the memory cell and over the second semiconductor region for the source or the drain of the MISFET;

(f) forming, after the step (e), a second insulation film over the semiconductor substrate so as to cover the first lamination pattern, the second gate electrode, the second lamination pattern, and the first side wall insulation film;

(g) polishing, after the step (f), the upper surface of the second insulation film to expose the first gate electrode, the second gate electrode, and the dummy gate electrode;

(h) removing, after the step (g), the dummy gate electrode;

(i) forming, the third gate electrode by filling the first conduction film in a first trench which is a region from which the dummy gate electrode has been removed in the step (h); and (j) forming a second metal silicide layer over the first gate electrode and the second gate electrode, wherein the first side wall insulation film is formed also over the second gate electrode at the step (c), and wherein the first metal silicide layer is not formed over the first gate electrode, the second gate electrode, and the dummy gate electrode at the step (e).

2. The method of manufacturing the semiconductor device according to claim 1, wherein,
the height of the second gate electrode formed at the step (b) is lower than the height of the first lamination pattern.

3. The method of manufacturing the semiconductor device according to claim 2, wherein the step (e) further includes:
(e1) forming a first metal film over the semiconductor substrate so as to be in contact with the first semiconductor region and the second semiconductor region;
(e2) reacting the first metal film with the first semiconductor region and the second semiconductor region by a heat treatment, thereby forming the first metal silicide layer; and
(e3) removing an unreacted first metal film after the step (e2).

4. The method of manufacturing the semiconductor device according to claim 3, wherein
the first metal film formed in the step (e1) is not in contact with the first gate electrode, the second gate electrode, and the dummy gate electrode.

5. The method of manufacturing the semiconductor device according to claim 4, wherein
the first gate electrode, the second gate electrode, and the dummy gate electrode comprise silicon, respectively.

6. The method of manufacturing the semiconductor device according to claim 5, wherein
the third gate electrode is a metal gate electrode.

7. The method of manufacturing the semiconductor device according to claim 6, wherein
the third gate electrode is formed by filling the first conductive film by way of a high dielectric insulation film into the first trench at the step (i).

8. The method of manufacturing the semiconductor device according to claim 7, wherein the step (i) further includes:
(i1) forming the high dielectric insulation film over the second insulation film including the bottom and the side wall of the first trench;
(i2) forming, after the step (i1), the first conductive film over the high dielectric insulation film so as to fill the inside of the first trench; and
(i3) removing, after the step (i2), the first conductive film and the high dielectric insulation film at the outside of the first trench while leaving the first conductive film and the high dielectric insulation film in the first trench, thereby forming the third gate electrode.

9. The method of manufacturing the semiconductor device according to claim 8, wherein the step (j) further includes:
(j1) forming a second metal film over the semiconductor substrate so as to be in contact with the first gate electrode and the second gate electrode;
(j2) reacting the second metal film with the first gate electrode and the second gate electrode by a heat treatment thereby forming the second metal inside layer; and
(j3) removing an unreacted second metal film after the step (j2).

10. The method of manufacturing the semiconductor device according to claim 1, wherein
the thickness of the second metal silicide is less than the thickness of the first metal silicide layer.

11. The method of manufacturing the semiconductor device according to claim 1, further including, after the step (i) and before the step (j),
(i4) removing an upper portion of the first gate electrode and an upper portion of the second gate electrode.

12. The method of manufacturing the semiconductor device according to claim 11, wherein the height of the first gate electrode and the second gate electrode is lowered by the step (i4).

13. The method of manufacturing the semiconductor device according to claim 12,
wherein the second gate insulation film extends for a region between the second gate electrode and the semiconductor substrate and a region between the second gate electrode and the first gate electrode,
wherein an upper portion of the second gate insulation film that extends between the second gate electrode and the first gate electrode protrudes from an upper surface of the first gate electrode and an upper surface of the second gate electrode after the step (i4).

14. The method of manufacturing the semiconductor device according to claim 13,
wherein the second gate insulation film extends for a region between the second gate electrode and the semiconductor substrate and a region between the second gate electrode and the first gate electrode, and
wherein an upper portion of the second gate insulation film that extends between the second gate electrode and the first gate electrode protrudes from the second metal silicide layer over the first gate electrode and the second metal silicide layer over the second gate electrode.

15. The method of manufacturing the semiconductor device according to claim 1, wherein the step (b) further includes:
(b1) forming a third insulation film for the first gate insulation film and for the first insulation film over the main surface of the semiconductor substrate;
(b2) forming a second conductive film for the first gate electrode and for the dummy gate electrode over the third insulation film;
(b3) forming a fourth insulation film for the first cap insulation film and for the second cap insulation film over the second conductive film;
(b4) patterning the second conductive film and the fourth insulation film thereby forming the first lamination pattern in the first region and forming a lamination film of the second conductive film and the fourth insulation film in the second region;

(b5) forming a fifth insulation film for the second gate insulation film over the main surface of the semiconductor substrate so as to cover the first lamination pattern and the lamination film;

(b6) forming a third conductive film used for the second gate electrode over the fifth insulation film;

(b7) etching back the third conductive film thereby leaving the third conductive film on the side wall of the first gate electrode by way of the fifth insulation film, and forming the second gate electrode;

(b8) removing a portion of the fifth insulation film not covered by the second gate electrode; and (b9) patterning the lamination film thereby forming a second lamination pattern in the second region.

16. The method of manufacturing the semiconductor device according to claim 15, wherein the step (b6) includes:

forming a protrusion that reflects the first lamination pattern at the surface of the third insulation film; and further includes:

(b10) a step of forming a sixth insulation film over the third insulation film; and (b11) a step of etching back the sixth insulation film thereby forming a second side wall insulation film on the side wall of the protrusion are included after the step (b6) and before the step (b7), and wherein the step (b7) includes:

(b12) etching back the third conductive film;

(b13) removing the second side wall insulation film after the step (b12); and (b14) etching back the third conductive film after the step (b13).

17. The method of manufacturing the semiconductor device according to claim 15, wherein the step (b7) includes:

etching the third conductive film, thereby leaving the third conductive film by way of the fifth insulation film on one of the side walls of the first gate electrode and forming the second gate electrode, and leaving the third insulation film by way of the fifth insulation film over the other of the side walls of the first gate electrode, and wherein the method further comprises:

(b15) removing the third conductive film left on the other of the side walls of the first gate electrode is included after the step (b7) and the before the (b8).

* * * * *